(12) United States Patent
Sasaki

(10) Patent No.: US 7,521,759 B2
(45) Date of Patent: Apr. 21, 2009

(54) SEMICONDUCTOR DEVICE, METHOD FOR MANUFACTURING THE SAME, AND GATE ELECTRODE STRUCTURE

(75) Inventor: Katsuhito Sasaki, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 305 days.

(21) Appl. No.: 11/276,824

(22) Filed: Mar. 15, 2006

(65) Prior Publication Data

US 2006/0214223 A1 Sep. 28, 2006

(30) Foreign Application Priority Data

Mar. 28, 2005 (JP) .............................. 2005-091235

(51) Int. Cl.
*H01L 29/94* (2006.01)
(52) U.S. Cl. .............................. 257/340; 257/E29.006
(58) Field of Classification Search ................. 257/213, 257/288, 327, 335, 340, E29.006
See application file for complete search history.

(56) References Cited

U.S. PATENT DOCUMENTS 4,290,077 A * 9/1981 Ronen ......................... 257/409

2003/0057460 A1 3/2003 Maekawa

FOREIGN PATENT DOCUMENTS

| JP | 9/205205 A | 8/1997 |
| JP | 2002/289845 A | 10/2002 |
| JP | 2003/204062 A | 7/2003 |

\* cited by examiner

*Primary Examiner*—Evan Pert
*Assistant Examiner*—Kevin Quinto
(74) *Attorney, Agent, or Firm*—Rabin & Berdo, P.C.

(57) ABSTRACT

A semiconductor structure includes (a) a semiconductor substrate having a channel region and a first integrated impurity diffusion region including a first electric field reduction region that is formed adjacent to the channel region and which includes a plurality of specific regions separated from each other, (b) a first insulating film formed on the semiconductor substrate, and (c) a first electrode structure having a first region formed above the channel region and a second region that is formed adjacent to the first region and above the first electric field reduction region to be self-aligned with the first electric field reduction region, the semiconductor structure including one or more openings formed above the plurality of specific regions and a first opening surrounding portion surrounding the one or more openings.

2 Claims, 55 Drawing Sheets

$(L1 < L3 < L5)$
$(L2 = L4 = L6)$
$(Lch = L8 - 2 \times L7)$
$(Ld = L1 + L2 + L3 + L4 + L7)$
$(L2/2 \leq L7 \ll L2)$

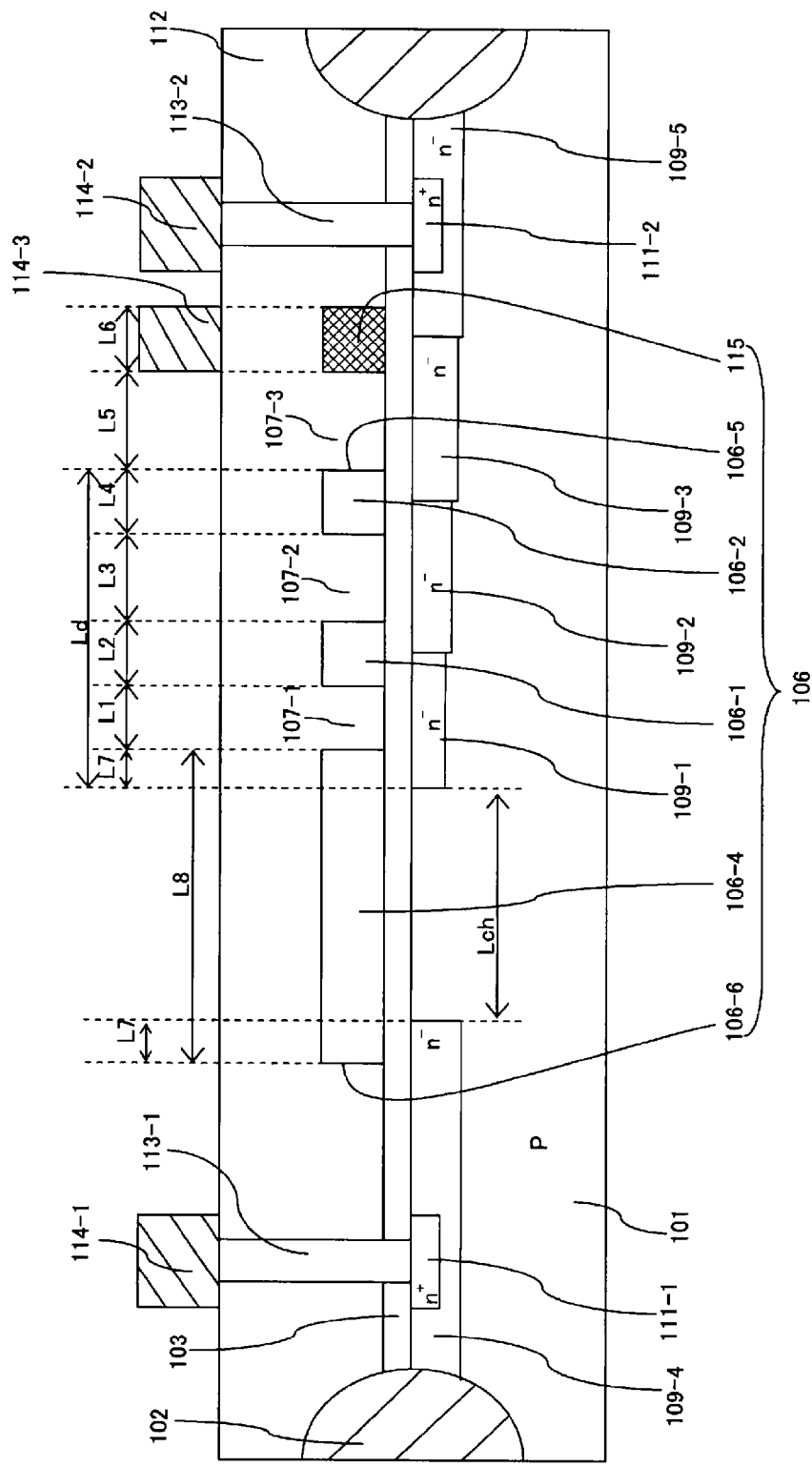

$(L1=L3=L5)=(L2=L4=L6)$ $(Ld=L1+L2+L3+L4+L5+L6+L7)$
$(Lch=L8-2\times L7)$
$(L2/2 \leq L7 \ll L2)$ $(L1=L3=L5)=(L2=L4=L6)$  $(Ld=L1+L2+L3+L4+L5+L6+L7)$
$(Lch=L8-2\times L7)$
$(L2/2 \leq L7 \ll L2)$

SEMICONDUCTOR DEVICE, METHOD FOR MANUFACTURING THE SAME, AND GATE ELECTRODE STRUCTURE

BACKGROUND OF THE INVENTION

Field of the Invention

The present invention relates to a semiconductor device and a method for manufacturing the same, especially a high voltage resistant MOS transistor having an electric field reduction region comprised of a lightly doped diffusion layer that is overlapped with a gate electrode, a method for manufacturing the same, and a gate electrode structure.

High voltage is generally applied to a drain electrode in a high voltage resistant Metal-Oxide-Semiconductor (MOS) transistor. Because of this, electric field concentration is caused in a region of a lightly doped diffusion layer located immediately below a gate electrode on the drain electrode side. This electric field concentration causes impact ionization, and high energy electrons and electron holes are implanted into and trapped in a gate insulating film formed immediately above the lightly doped diffusion layer. Thus, device properties are changed over time.

An offset structure has been known in which a heavily doped diffusion region comprising a source/drain is separated from a gate electrode in order to reduce the electric field in the lower edge portion of the gate electrode. A heretofore known offset structure is disclosed in Japan Patent Publication JP-A-09-205205 (especially paragraphs 0013-0020, and FIGS. 3 and 4). In this offset structure, a spacer is formed adjacent to a sidewall of a gate electrode and a lightly doped diffusion region is formed immediately below this spacer. Also, a heavily doped diffusion region is separated (i.e., offset) from the gate electrode by approximately the distance of the spacer. The electric field reduction effect can be increased by increasing the offset amount in this offset structure.

Another example of the heretofore known high voltage resistant MOS transistor with an offset structure is disclosed in Japan Patent Publication JP-A-2002-289845 (especially paragraphs 0013-0017, and FIG. 3). In this high voltage resistant MOS transistor, a coating insulating film is formed on the outer side of both sidewalls of a gate electrode, and a spacer layer is formed on the outer side of this coating insulating film. Furthermore, a sidewall spacer is formed on the outer side of this spacer layer. Also, an offset layer is formed below the coating insulating film, the spacer layer, and the sidewall spacer. This offset layer is comprised of a lightly doped diffusion layer and self-aligned with the coating insulating film, the spacer layer, and the sidewall spacer. Also, the highly doped diffusion region is offset from the edge of the gate electrode by the sum of the widths of the coating insulating film, the spacer layer, and the sidewall spacer.

A structure in which a lightly doped diffusion layer functioning as an electric field reduction region is overlapped with a gate electrode has been known as an alternative structure to reduce the electric field in the lower edge portion of a gate electrode. A heretofore known gate overlap structure of a high voltage resistant MOS transistor is disclosed in Japan Patent Publication JP-A-2003-100771 (especially paragraph 0025, and FIGS. 2 and 6). In this gate overlap structure, a portion of a lightly doped diffusion layer in a drain region is overlapped with a gate electrode. The lightly doped diffusion layer is selectively formed on a semiconductor substrate by conducting an ion implantation step by using a mask formed on a gate insulating film. Then, a polysilicon layer is formed on the gate insulating film and patterning is conducted with respect to this polysilicon layer. Thus, a gate electrode is formed, which is overlapped with the lightly doped diffusion layer by a predetermined distance. Therefore, the lightly doped diffusion layer can be formed independent of the length of a gate electrode. According to Japan Patent Publication JP-A-2003-100771, increasing the gate overlap amount is effective in order to increase the electric field reduction effect.

Another example of the structure in which a lightly doped diffusion layer functioning as an electric field reduction region is overlapped with a gate electrode is disclosed in Japan Patent Publication JP-A-2003-204062 (especially paragraphs 0015-0016, and FIGS. 1 and 7). In this structure, a portion of a drain region that is overlapped with a gate electrode is formed to have a pectinate plan shape by using a pectinate resist mask. Because of this, the impurity amount per unit area in the portion of the drain region that is overlapped with a gate electrode is smaller than that in a portion formed below a field oxide film. Thus, the concentration of the electric field in the portion protruding to the source side is reduced.

The following problems are actually caused in the above described heretofore known method for forming a gate overlap structure.

First, a gate electrode is required to be formed after a lightly doped diffusion layer is formed. Therefore, the gate overlap amount is varied when misalignment between the patterning to form a lightly doped diffusion layer and the patterning to form a gate electrode is caused with a heretofore known lithography technique. As a result, device properties are varied.

Second, a lightly doped diffusion layer is asymmetrically formed with respect to a gate electrode when misalignment between the patterning to form a lightly doped diffusion layer and the patterning to form a gate electrode is caused with a heretofore known lithography technique. This is because a gate electrode is required to be formed after a lightly doped diffusion layer is formed. As a result, device properties are varied.

Third, a gate overlap dimension between a lightly doped diffusion layer and a gate electrode is required to be defined in consideration of the alignment margin between the patterning to form a lightly doped diffusion layer and the patterning to form a gate electrode with a heretofore known lithography technique. In other words, a design value is required to be defined by adding the alignment margin between those patternings to the originally necessary overlap dimension between a lightly doped diffusion layer and a gate electrode. Because of this, the current drive capability is reduced and device miniaturization is prevented.

In view of the above, it will be apparent to those skilled in the art from this disclosure that there exists a need for an improved high voltage resistant MOS transistor, an improved method for manufacturing the same, and an improved gate electrode structure. This invention addresses these needs in the art as well as other needs, which will become apparent to those skilled in the art from this disclosure.

SUMMARY OF THE INVENTION

It is therefore an objective of the present invention to resolve the above described problems and to provide a high voltage resistant MOS transistor without the above described problems.

In accordance with the present invention, a semiconductor structure is comprised of (a) a semiconductor substrate having a channel region and a first integrated impurity diffusion region including a first electric field reduction region that is formed adjacent to the channel region and includes a plurality of specific regions separated from each other, (b) a first insulating film formed on the semiconductor substrate, and (c) a first electrode structure having a first region formed above the channel region and a second region that is formed adjacent to the first region and above the first electric field reduction region to be self-aligned with the first electric field reduction region and which includes one or more openings formed above the plurality of specific regions and a first opening surrounding portion surrounding the one or more openings.

Also, it is an objective of the present invention to provide a method for manufacturing a high voltage resistant MOS transistor without the above described problems.

In accordance with the present invention, a method for forming a semiconductor device is comprised of the steps of (a) forming a first insulating film above a semiconductor substrate having an active region that includes a plurality of predetermined specific regions separated from each other, (b) forming a first electrode structure on the first insulating film, which has a first region formed above the active region and a second region that is formed above the active region and adjacently to the first region and includes one or more openings formed above the plurality of specific regions and a first opening surrounding portion surrounding the one or more openings, (c) forming a plurality of first impurity implantation regions, which are separated from each other and self-aligned with the first electrode structure, in said plurality of specific regions by conducting ion implantation of impurities into the plurality of specific regions by using the first electrode structure as a mask, and (d) forming a first integrated impurity diffusion region, which is overlapped with at least the second region and self-aligned with the first electrode structure, in the active region by conducting a thermal diffusion treatment with respect to the implanted impurities in the plurality of first impurity implantation regions.

In addition, it is an objective of the present invention to resolve the above described problems and to provide an electrode structure without the above described problems.

In accordance with the present invention, an electrode structure is comprised of (a) a first region, and (b) a second region that is formed adjacent to the first region and includes a first array comprised of a plurality of openings separated from each other and a first opening surrounding portion surrounding each of the plurality of openings.

Also, in accordance with the present invention, an electrode structure is comprised of (a) a first region, and (b) a second region that is formed adjacent to the first region and includes (i) an integrated opening that is comprised of a plurality of first opening regions separated from each other and a second opening region connecting the plurality of first opening regions, and (ii) a first opening surrounding portion surrounding each of the plurality of first opening regions.

In the present application, "a specific region" means a region in an active region of a semiconductor substrate, more specifically, a region in which an impurity implantation region is formed by conducting ion implantation by using a gate electrode as a mask.

According to the present invention, the gate electrode structure includes the first region formed on the channel region and the second region that is formed adjacent to the first region and above the electric field reduction region. Also, at least one opening is formed in the second region located above the plurality of specific regions. Impurities are ion implanted into the semiconductor substrate by using the gate electrode as a mask. As a result, the plurality of impurity implantation regions, which are separated from each other and self-aligned with the gate electrode structure, respectively, are formed in the plurality of specific regions. Then, the integrated impurity diffusion region, which is comprised of a plurality of impurity diffusion regions that are self-aligned with the gate electrode structure and formed adjacent with each other without any space, is formed by conducting the thermal diffusion treatment with respect to the impurities in the plurality of impurity implantation regions. Here, the electric field reduction region is included in the integrated impurity diffusion region and formed below the second region of the gate electrode. Also, this electric field reduction region is self-aligned with and overlapped with the gate electrode. In addition, the overlap dimension between the gate electrode and the electric field reduction region self-aligned with this gate electrode can be regulated by regulating the dimension of the second region in the channel length direction.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 40 is a partial vertical cross-section diagram showing a step of a method for manufacturing a high voltage resistant MOS transistor in accordance with the third embodiment of the present invention.

DETAILED DESCRIPTION OF THE PREFERRED EMBODIMENTS

Figure 1:
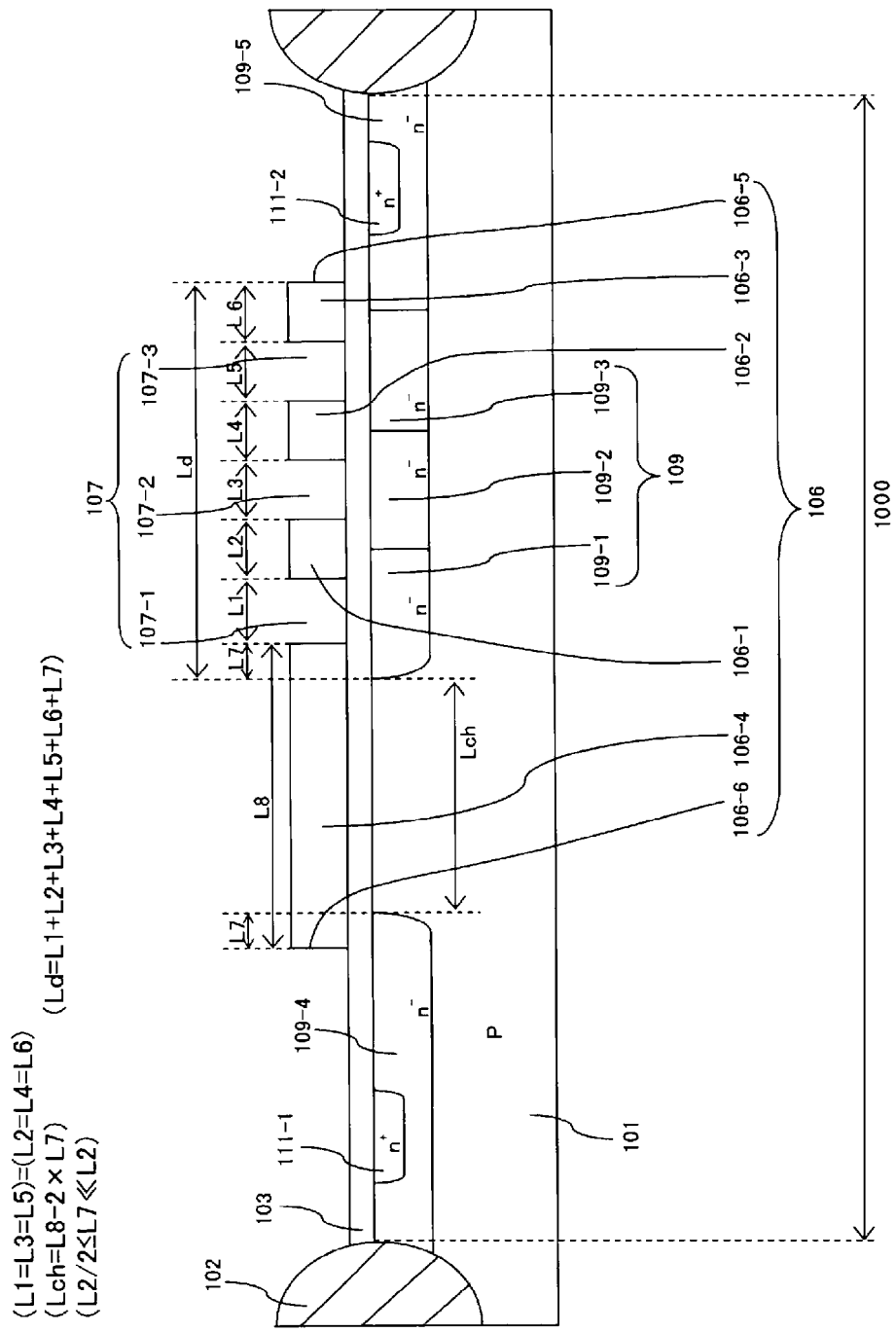
FIG. 1 is a partial vertical cross-section diagram showing the structure of a high voltage resistant MOS transistor in accordance with a first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

High Voltage Resistant MOS Transistor Structure

According to the present invention, a high voltage resistant MOS transistor including a lightly doped diffusion layer that is overlapped with a gate electrode in a self-alignment fashion and functions as an electric field reduction region, and a method for manufacturing thereof are provided.

Figure 2:
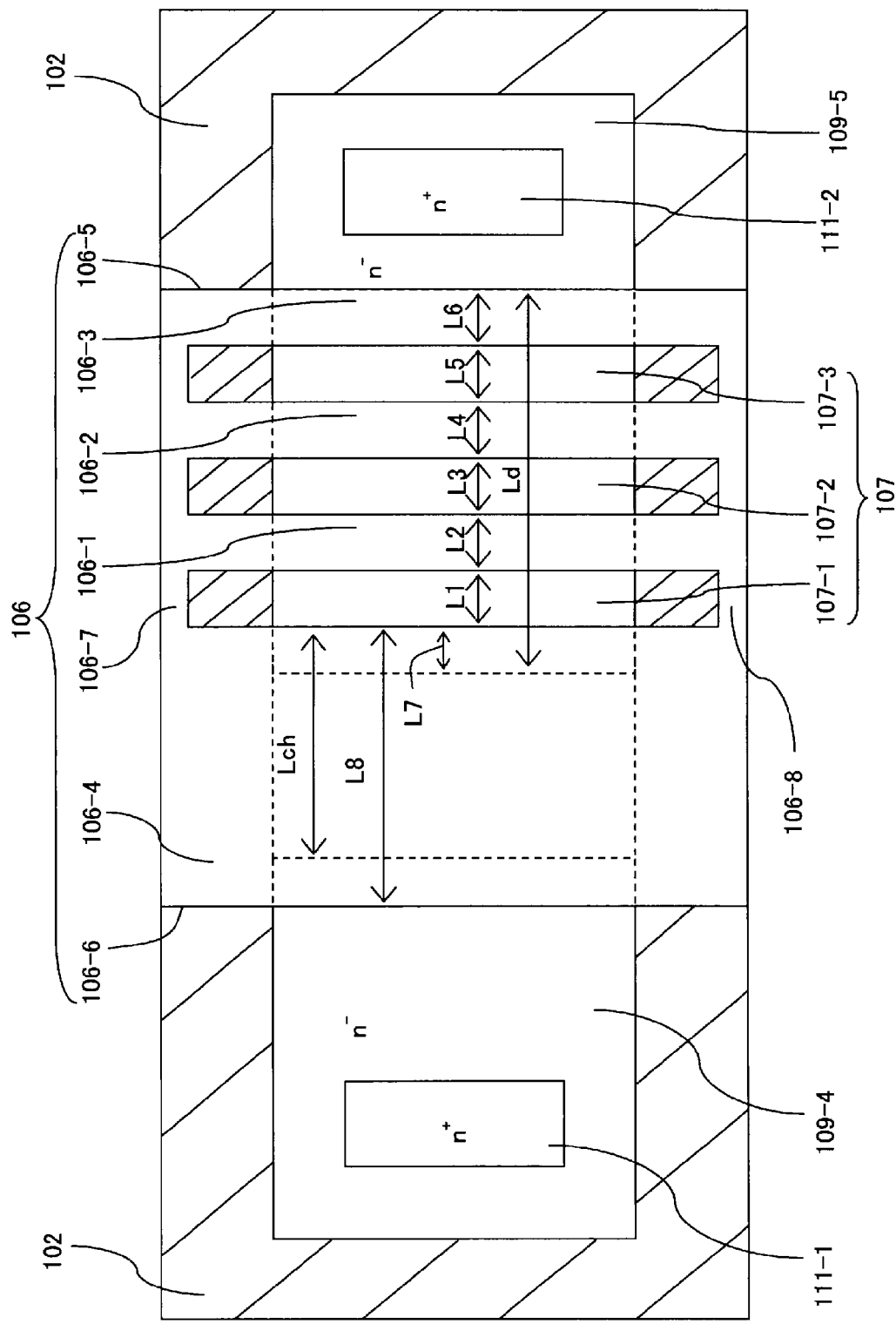
FIG. 2 is a partial plan view showing the structure of a high voltage resistant MOS transistor in accordance with the first embodiment of the present invention.

FIG. 1 is a partial vertical cross-section diagram of a high voltage resistant MOS transistor in accordance with a first embodiment of the present invention. Also, FIG. 2 is a partial plan view of the high voltage resistant MOS transistor shown in FIG. 1 in accordance with the first embodiment of the present invention.

The high voltage resistant MOS transistor in accordance with the first embodiment of the present invention has the following structure. The principal surface of a p-type semiconductor substrate 101 includes an element isolation region comprised of a field oxide film 102 and an active region 1000 defined by the field oxide film 102. A first lightly doped $N^-$ diffusion layer 109-1 and a fourth lightly doped $N^-$ diffusion layer 109-4, which are separated from each other through a channel region having a channel length Lch, are formed in the active region 1000 of the p-type semiconductor substrate 101. In other words, the channel region is defined between the first lightly doped $N^-$ diffusion layer 109-1 and the fourth lightly doped $N^-$ diffusion layer 109-4, and the channel length Lch is defined by the horizontal distance between the first lightly doped $N^-$ diffusion layer 109-1 and the fourth lightly doped $N^-$ diffusion layer 109-4.

The terms "a first horizontal direction" and "a second horizontal direction" are hereinafter used. The first horizontal direction means the direction that is parallel to a plane parallel to the principal surface of the p-type semiconductor substrate 101 and defines a gate length. On the other hand, the second horizontal direction means the direction that is parallel to the surface parallel to the principal surface of the p-type semiconductor substrate 101 and defines a gate width. Also, the first horizontal direction and the second horizontal direction are at right angles to each other. The first lightly doped $N^-$ diffusion layer 109-1 is formed on the drain side of the p-type semiconductor substrate 101, and the fourth lightly doped $N^-$ diffusion layer 109-4 is formed on the source side of the p-type semiconductor substrate 101.

A second lightly doped $N^-$ diffusion layer 109-2 is formed adjacent to the first lightly doped $N^-$ diffusion layer 109-1 and separated from the channel region through this first lightly doped $N^-$ diffusion layer 109-1. A third lightly doped $N^-$ diffusion layer 109-3 is formed adjacent to the second lightly doped $N^-$ diffusion layer 109-2 and separated from the channel region through the first lightly doped $N^-$ diffusion layer 109-1 and the second lightly doped $N^-$ diffusion layer 109-2. A fifth lightly doped $N^-$ diffusion layer 109-5 is formed adjacent to the third lightly doped $N^-$ diffusion layer 109-3 and separated from the channel region through the first lightly doped $N^-$ diffusion layer 109-1, the second lightly doped $N^-$ diffusion layer 109-2, and the third lightly doped $N^-$ diffusion layer 109-3.

The active region 1000 of the p-type semiconductor substrate 101 is defined by the element isolation region comprised of the field oxide film 102. Also, the first lightly doped $N^-$ diffusion layer 109-1, the second lightly doped $N^-$ diffusion layer 109-2, the third lightly doped $N^-$ diffusion layer 109-3, the fourth lightly doped $N^-$ diffusion layer 109-4, and the fifth lightly doped $N^-$ diffusion layer 109-5 are formed in the active region 1000. These lightly doped $N^-$ diffusion layers 109-1, 109-2, 109-3, 109-4, and 109-5 are abutted against the boundary between the active region 1000 and the element isolation region comprised of the field oxide film 102.

A first heavily doped $N^+$ diffusion layer 111-1 is selectively formed in the upper region of the fourth lightly doped $N^-$ diffusion layer 109-4. A second heavily doped $N^+$ diffusion layer 111-2 is selectively formed in the upper region of the fifth lightly doped N⁻ diffusion layer 109-5.

A gate insulating film 103 is formed on the principal surface of the p-type semiconductor substrate 101. More specifically, the gate insulating film 103 is continuously formed on the channel region, the first lightly doped N⁻ diffusion layer 109-1, the second lightly doped N⁻ diffusion layer 109-2, the third lightly doped N⁻ diffusion layer 109-3, the fourth lightly doped N⁻ diffusion layer 109-4, and the fifth lightly doped N⁻ diffusion layer 109-5, the first heavily doped N⁺ diffusion layer 111-1, and the second heavily doped N⁺ diffusion layer 111-2 of the p-type semiconductor substrate 101.

A gate electrode 106 is selectively formed on the gate insulating film 103. The gate electrode 106 is comprised of a polysilicon film and has a slit group 107. The gate electrode 106 is comprised of a first stripe shape portion 106-1, a second stripe shape portion 106-2, a third stripe shape portion 106-3, a sheet portion 106-4, a first edge 106-5, a second edge 106-6, a first side region 106-7, a second side region 106-8, and the slit group 107. The slit group 107 is comprised of a first slit 107-1, a second slit 107-2, and a third slit 107-3. These slits 107-1, 107-2, and 107-3 are separated from each other in the first horizontal direction and longitudinally formed along the second horizontal direction. The sheet portion 106-4 is formed above the channel region, more specifically, on the gate insulating film 103, and has a width L8 corresponding to an eighth dimension L8. The first stripe shape portion 106-1 is formed to be separated from the sheet portion 106-4 through the first slit 107-1 having a width L1 corresponding to a first dimension L1 in the first horizontal direction, and has a width L2 corresponding to a second dimension L2. The second stripe shape portion 106-2 is formed to be separated from the first stripe shape portion 106-1 through the second slit 107-2 having a width L3 corresponding to a third dimension L3 in the first horizontal direction, and has a width L4 corresponding to a fourth dimension L4. The third stripe shape portion 106-3 is formed to be separated from the second stripe shape portion 106-2 through the third slit 107-3 having a width L5 corresponding to a fifth dimension L5 in the first horizontal direction, and has a width L6 corresponding to a sixth dimension L6. The first side region 106-7 and the second side region 106-8 are separated from each other in the second horizontal direction, and longitudinally formed along the first horizontal direction. Each of the first slit 107-1, the second slit 107-2, and the third slit 107-3 is terminated in the first side region 106-7 and the second side region 106-8. In other words, the first stripe shape portion 106-1, the second stripe shape portion 106-2, the third stripe shape portion 106-3, and the sheet portion 106-4 are connected with each other through the first side region 106-7 and the second side region 106-8. That is to say, the gate electrode 106 includes an integrated structure comprised of the first stripe shape portion 106-1, the second stripe shape portion 106-2, the third stripe shape portion 106-3, the sheet portion 106-4, the first side region 106-7, the second side region 106-8, and the slit group 107.

The widths of the first stripe shape portion 106-1, the second stripe shape portion 106-2, the third stripe shape portion 106-3, and the sheet portion 106-4 of the gate electrode 106, and the widths of the first slit 107-1, the second slit 107-2, and the third slit 107-3 of the slit group 107 are defined as their dimensions in the first horizontal direction.

The first slit 107-1, the second slit 107-2, and the third slit 107-3 are continuously formed and reach to the element isolation region across the boundary between the active region 1000 and the element isolation region comprised of the field oxide film 102. Both ends of the first slit 107-1, the second slit 107-2, and the third slit 107-3 are abutted against the first side region 106-7 and the second side region 106-8 of the gate electrode 106. Therefore, the first side region 106-7 and the second side region 106-8 of the gate electrode 106 are located on the element isolation region comprised of the field oxide film 102.

In the first embodiment of the present invention, the widths of the first slit 107-1, the second slit 107-2, and the third slit 107-3 are the same (i.e., L1=L3=L5). Also, the widths of the first stripe shape portion 106-1, the second stripe shape portion 106-2, and the third stripe shape portion 106-3 of the gate electrode 106 are the same (i.e., L2=L4=L6). Furthermore, it is possible to set the widths of the first slit 107-1, the second slit 107-2, and the third slit 107-3 (i.e., L1=L3=L5) and the widths of the first stripe shape portion 106-1, the second stripe shape portion 106-2, and the third stripe shape portion 106-3 of the gate electrode 106 (i.e., L2=L4=L6) to be the same (i.e., L1=L2=L3=L4=L5=L6).

The center location of the first lightly doped N⁻ diffusion layer 109-1 is self-aligned with that of the first slit 107-1 in the first horizontal direction. The center location of the second lightly doped N⁻ diffusion layer 109-2 is self-aligned with that of the second slit 107-2 in the first horizontal direction. The center location of the third lightly doped N⁻ diffusion layer 109-3 is self-aligned with that of the third slit 107-3 in the first horizontal direction.

Impurity ions are implanted into the p-type semiconductor substrate 101 through the slit group 107 of the gate electrode 106 by using the gate electrode 106 as a mask. Then, thermal diffusion is conducted with respect to the implanted impurities. Thus the first lightly doped N⁻ diffusion layer 109-1, the second lightly doped N⁻ diffusion layer 109-2, and the third lightly doped N⁻ diffusion layer 109-3 are formed. Here, the thermal diffusion of impurities includes the thermal diffusion of impurities in the crosswise direction (i.e., the horizontal direction). In the thermal diffusions of impurities in the horizontal direction, the distance of the thermal diffusion in the first horizontal direction is especially important for the present invention. Therefore, the term "the thermal diffusion in the horizontal direction," or the term "the thermal diffusion in the crosswise direction" hereinafter means the thermal diffusion in the first horizontal direction unless otherwise stated.

The first lightly doped N⁻ diffusion layer 109-1 and the second lightly doped N⁻ diffusion layer 109-2 are required to be adjacently formed without any space. The second lightly doped N⁻ diffusion layer 109-2 and the third lightly doped N⁻ diffusion layer 109-3 are required to be adjacently formed without any space. The third lightly doped N⁻ diffusion layer 109-3 and the fifth lightly doped N⁻ diffusion layer 109-5 are required to be adjacently formed without any space. Furthermore, the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 are require to form an integrated lightly doped impurity diffusion region.

In order to form the above described integrated lightly doped impurity diffusion region, an impurity thermal diffusion distance L7 in the crosswise direction is required to be set to at least half of the width of the first stripe shape portion 106-1, the second stripe shape portion 106-2, or the third stripe shape portion 106-3 (i.e., L2/2=L4/2=L6/2). The following is the reason for this.

The lightly doped impurity implantation regions are selectively formed in the regions of the p-type semiconductor substrate 101 located below the first slit 107-1, the second slit 107-2, and the third slit 107-3 by conducting an ion implantation step by using the gate electrode 106 including the slit group 107 as a mask. In this phase, the positions of both edges of the lightly doped impurity implantation regions are self-aligned with the positions of both edge sidewalls of the first slit 107-1, the second slit 107-2, and the third slit 107-3 in the first horizontal direction. The adjacent lightly doped impurity implantation regions are separated from each other through the distances corresponding to the widths of the first stripe shape portion 106-1, the second stripe shape portion 106-2, and the third stripe shape portion 106-3 of the gate electrode 106 (i.e., L2=L4=L6) in the first horizontal direction, respectively. Then, a thermal diffusion step of impurities is conducted and thus those impurity diffusion regions are enlarged. This thermal diffusion step of impurities is continuously conducted at least until the adjacent impurity diffusion regions have contact with each other. As a result, the first lightly doped N⁻ diffusion layer 109-1 and the second lightly doped N⁻ diffusion layer 109-2 are adjacently formed without any space. Also, the second lightly doped N⁻ diffusion layer 109-2 and the third lightly doped N⁻ diffusion layer 109-3 are adjacently formed without any space. In addition, the third lightly doped N⁻ diffusion layer 109-3 and the fifth lightly doped N⁻ diffusion layer 109-5 are adjacently formed without any space. Furthermore, the integrated lightly doped impurity diffusion region is formed, which is formed by the integration of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5.

Also, the positions of both edges of the lightly doped impurity implantation regions are self-aligned with the positions of the edge sidewalls of first slit 107-1, the second slit 107-2, and the third slit 107-3 in the first horizontal direction in the above described phase in which the lightly doped impurity implantation regions are selectively formed in the regions of the p-type semiconductor substrate 101 located below the first slit 107-1, the second slit 107-2, and the third slit 107-3 by conducting an ion implantation step by using the gate electrode 106 including the slit group 107 as a mask. In addition, the above described thermal diffusion in the crosswise direction is symmetrical in the first horizontal direction. Therefore, the center location of the first lightly doped N⁻ diffusion layer 109-1 is self-aligned with the center location of the first slit 107-1. Also, the center location of the second lightly doped N⁻ diffusion layer 109-2 is self-aligned with the center location of the second slit 107-2. In addition, the center location of the third lightly doped N⁻ diffusion layer 109-3 is self-aligned with the center location of the third slit 107-3. Therefore, the above described integrated lightly doped impurity diffusion region is self-aligned with the slit group 107 in the first horizontal direction. That is to say, the above described integrated lightly doped impurity diffusion region is self-aligned with the gate electrode 106 including the slit group 107 in the first horizontal direction.

In the present application, the expression "the impurity diffusion layer or the impurity diffusion region is self-aligned with the slit or the gate electrode" means that the position of the impurity diffusion layer or the impurity diffusion region in the first horizontal direction are defined depending only on the position of the slit or the gate electrode, because the misalignment in a plurality of patterning steps is not caused and the thermal diffusion of impurities is isotropic. Therefore, the expression does not mean that the positions of the edges of the impurity diffusion layer or the impurity diffusion region in the first horizontal direction are aligned with the position of the edges of the slit or that of the gate electrode. The positions of the edges of the impurity diffusion layer or the impurity diffusion region in the first horizontal direction are displaced from the position of the edges of the slit or that of the edges of the gate electrode by the distance L7 of the crosswise diffusion of impurities. Accuracy in the amount of displacement depends only on the controllability of the distance L7 of the crosswise diffusion of impurities. Also, in the present application, the expression "the impurity implantation region is self-aligned with the silt or the gate electrode" means that the position of edges of the impurity implantation region in the first horizontal direction is aligned with the position of the edges of the slit or that of the edges of the gate electrode because the ion implantation region is formed by conducting the ion implantation of impurities by using the gate electrode including the slit as a mask.

As shown in FIG. 1, the inner edge of the first lightly doped N⁻ diffusion layer 109-1 is overlapped with the sheet portion 106-4 of the gate electrode 106 by the distance corresponding to the distance L7 of the thermal diffusion of impurities in the horizontal direction. Also, the inner edge portion of the fourth lightly doped N⁻ diffusion layer 109-4 is overlapped with the sheet portion 106-4 of the gate electrode 106 by the distance corresponding to the distance L7 of the thermal diffusion of impurities in the horizontal direction. The channel length Lch is defined between the inner edge portion of the first lightly doped N⁻ diffusion layer 109-1 and the inner edge portion of the fourth lightly doped N⁻ diffusion layer 109-4. Therefore, the channel length Lch is equal to the value derived by subtracting twice of the distance L7 of the thermal diffusion of impurities in the horizontal direction from the width L8 of the sheet portion 106-4 (i.e., Lch=L8-2×L7).

The electric field produced by the gate potential is applied to the channel region, the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 by the sheet portion 106-4, the first stripe shape portion 106-1, the second stripe shape portion 106-2, and the third stripe shape portion 106-3 of the gate electrode 106. Because of this, the width of the gate electrode 106 (i.e., the dimension of the gate electrode 106 in the first horizontal direction) is defined by the distance between the first edge 106-5 (i.e., the drain side edge) of the third stripe shape portion 106-3 and the second edge 106-6 (i.e., the source side edge) of the sheet portion 106-4. In other words, the width of the gate electrode 106 corresponds to the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the width L8 of the sheet portion 106-4.

Portions of the above described integrated lightly doped impurity diffusion region are overlapped with the gate electrode 106, and these overlapped regions function as the electric field reduction regions. In the present invention, a region of the lightly doped impurity diffusion region that is overlapped with the gate electrode 106 is defined as the electric field reduction region. Because of this, the dimension of the electric field reduction region in the first horizontal direction corresponds to the gate overlap dimension. As described above, the integrated lightly doped impurity diffusion region is comprised of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5. Also, the gate electrode 106 includes the sheet portion 106-4, the first stripe shape portion 106-1, the second stripe shape portion 106-2, and the third stripe shape portion 106-3. Therefore, the overlap dimension Ld is defined by the distance between the inner side edge (i.e., the source side edge) of the first lightly doped N⁻ diffusion layer 109-1 and the first edge 106-5 of the gate electrode 106 in the first horizontal direction. Therefore, the overlap dimension Ld between the electric field reduction region and the gate electrode 106 is defined by the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the distance L7 of the thermal diffusion of impurities in the horizontal direction (i.e., Ld=L1+L2+L3+L4+L5+L6+L7).

The following is a further explanation of the width L1 of the first slit 107-1, the width L3 of the second slit 107-2, the width L5 of the third slit 107-3, the width L2 of the first stripe shape portion 106-1, the width L4 of the second stripe shape portion 106-2, and the width L6 of the third stripe shape portion 106-3.

If the width of the slit is increased, the electric field applied to the above described electric field reduction region based on the gate potential and the electric field reduction effect are reduced. In addition, if the width of the slit is increased, the number of the slits and the number of the stripe shape portions that are needed to keep the necessary gate overlap amount are decreased, and impurities are easily implanted in a step of ion implantation of impurities by using the gate electrode as a mask. The maximum width of the slit is defined by the necessary minimum electric field that is applied to the above described electric field reduction region based on the gate potential and by the maximum width necessary for obtaining the minimum required electric field reduction effect.

If the width of the slit is decreased, the number of the slits and the number of the stripe shape portions of the gate electrode that are needed to keep the necessary gate overlap amount are increased, and impurities are prevented from being implanted in a step of ion implantation of impurities by using the gate electrode as a mask. This causes the concentration of the finished impurity diffusion layer to be decreased. In addition, if the width of the slit is decreased, the electric field that is applied to the above described electric field reduction region based on the gate potential and the electric field reduction effect are increased. Also, the minimum width of the slit is defined by the limit width for which patterning can be conducted.

If the width of the stripe shape portion of the gate electrode is increased, the necessary minimum distance of the diffusion of impurities in the crosswise direction is increased. In addition, if the width of the stripe shape portion of the gate electrode is increased, the number of the slits and the number of the stripe shape portions that are needed for obtaining the necessary overlap amount are decreased.

If the width of the stripe shape portion of the gate electrode is decreased, the number of the slits and the number of the stripe shape portions that are needed for obtaining the necessary overlap amount are increased. In addition, if the width of the stripe shape portion of the gate electrode is decreased, the necessary minimum diffusion distance of impurities in the crosswise direction is decreased.

Half of the width of the stripe shape portions of the gate electrode corresponds to the necessary minimum diffusion distance of impurities in the crosswise direction. Therefore, it is desirable to form the stripe shape portions of the gate electrode to have the same width with each other. If the widths of the stripe shape portions of the gate electrode are different from each other, the necessary minimum diffusion distance of impurities in the crosswise direction is half of the width of the widest stripe shape portion.

Therefore, it is desirable to define the widths of the slit and the stripe shape portions of the gate electrode in consideration of the above described relationships. In the first embodiment of the present invention, as a typical example, it is possible to set all the following dimensions to be the same value, for example, 0.3 μm: the width L1 of the first slit 107-1, the width L2 of the first stripe shape portion 106-1, the width L3 of the second slit 107-2, the width L4 of the second stripe shape portion 106-2, the width L5 of the third slit 107-3, and the width L6 of the third stripe shape portion 106-3. In this case, the overlap dimension Ld is derived by the sum of "0.3 μm times 6" and the distance L7 of the thermal diffusion of impurities in the horizontal direction. Also, the necessary minimum distance of the thermal diffusion of impurities in the horizontal direction is 0.15 (i.e., 0.3/2=0.15 m). If a step of the necessary minimum thermal diffusion of impurities is conducted, the finished overlap dimension Ld is 1.95 (i.e., 0.3 μm×6+0.3 μm/2=1.95 μm). In this case, the integrated lightly doped impurity diffusion region has a heterogeneous impurity concentration profile in the first horizontal direction. Also, the finished gate overlap dimension Ld is more than 1.95 μm (i.e., Ld>0.3 μm×6+0.3 μm/2=1.95 μm) if a step of the thermal diffusion of impurities is conducted until the thermal diffusions in the crosswise direction are overlapped with each other so that the integrated lightly doped impurity diffusion region has the homogeneous impurity concentration profile in the first horizontal direction.

For example, the gate overlap amount 2 μm may be needed in a 40 V voltage resistant MOS transistor. According to the gate overlap structure in accordance with the present invention, the gate overlap dimension Ld of more than 1.95 μm can be obtained by setting the above described widths of the three slits, the above described three stripe shape portions, and the distance L7 of the thermal diffusion in the horizontal direction to be 0.3 μm, 0.3 μm, and half of the width of the above described three stripe shape portions or more, respectively. Therefore, the large gate overlap amount that is needed for a 40 V voltage resistant MOS transistor can be obtained. In the first embodiment of the present invention, three slits are formed, however, it is possible to arbitrarily change the number of the slits according to the demanded gate overlap dimension Ld. For example, it is possible to obtain a further large gate overlap dimension Ld of more than 2.55 μm by forming 4 slits (i.e., Ld>0.3 μm×8+0.3 μm/2=2.55 μm). Also, it is possible to obtain a further large gate overlap dimension Ld of more than 3.15 μm by forming 5 slits (i.e., Ld>0.3 μm×10+0.3 μm/2=3.15 μm). As described above, the maximum width of the slit is defined by the necessary minimum electric field applied to the above described electric field reduction region based on the gate potential and the maximum width that is needed for obtaining the necessary minimum electric field reduction effect. As an example, the maximum width of the slit can be set to 1.0 μm. The minimum width of the slit is defined by the limit width for which patterning can be conducted. Also, as an example, the minimum width of the slit can be set to 0.1 μm. If the gate overlap amount of approximately 2.0 μm, which is needed for a 40 V voltage resistant MOS transistor, is required to be obtained in forming a single slit, the width of this single slit needs to be set to more than 1.55 μm. However, if the extremely wide single slit as just stated is formed, it is impossible to obtain the necessary minimum electric field applied to the above described electric field reduction region and the necessary minimum electric field reduction effect. Therefore, at least a plurality of slits need to be formed in order to obtain the large gate overlap amount that is required for a high voltage resistant MOS transistor.

The above described gate electrode structure is only one of the typical examples of the gate electrode structure and the overlap structure in accordance with the present invention. In other words, the gate electrode in accordance with the present invention includes at least the first region, which is continuously formed above and overlapped with the channel region and applies the electric field produced by the gate potential to the channel region, and the second region, which is continuously formed above and overlapped with the above described electric field reduction region and applies the electric field produced by the gate potential to the electric field reduction region. Also, the second region includes an opening assembly comprised of a plurality of openings, which are formed to be separated from each other, and a surrounding portion surrounding each of those openings.

The surrounding portion has the maximum width in the horizontal direction, which corresponds to twice or less of the diffusion distance of impurities in the crosswise direction in the step of the diffusion of impurities. The width of the surrounding portion can be changed according to positions as long as the above described conditions with respect to the maximum width in the horizontal direction are met. Also, the width of the surrounding portion can be set to the homogeneous value regardless of the position. On the other hand, each of the above described plurality of openings has the minimum dimension in the horizontal direction, which does not exceed the upper limits required for obtaining the necessary minimum electric field applied to the above described electric field reduction region based on the gate potential and the necessary minimum electric field reduction effect. The planar shape and the dimension in the horizontal direction of each of the plurality of openings is not necessarily limited as long as the above described conditions with respect to the minimum dimension in the horizontal direction are met. The above described opening assembly can be comprised of a plurality of openings among which at least either of the planar shape and the dimension in the horizontal direction is different. Also, the above described opening assembly can be comprised of a plurality of openings among which both of the planar shape and the dimension in the horizontal direction are the same. The planar shape and the dimension in the horizontal direction of a plurality of the openings are defined by the above described surrounding portion.

As a typical example, the above described opening assembly can be comprised of a slit group comprised of a plurality of slits. The slit group can be comprised of the regular array of a plurality of slits with the same shape and the same dimension. The regular array of a plurality of slits may be a one-dimensional array or two-dimensional array. As described in the present embodiment, the one-dimensional array can be longitudinally formed in the direction of the channel width, and can be comprised of a plurality of slits arrayed in a line in the direction of the channel length. In this case, the surrounding portion includes at least one stripe shape portion that is longitudinally formed in the direction of the channel width. Also, as an alternative embodiment, the one-dimensional array can be comprised of a plurality of slits that are longitudinally formed in the direction of the channel length and arrayed in a line in the direction of the channel width.

For example, the above described two-dimensional array may be the matrix array comprised of a plurality of slits. The above described opening assembly can be comprised of a regular two-dimensional array comprised of a plurality of openings instead of the above described plurality of slits. The shape of a plurality of openings may be rectangular or square.

Increase of the dimension of the above described plurality of openings in the horizontal direction causes a decrease in the electric field applied to the above described electric field reduction region based on the gate potential and reduction of the electric field reduction effect. In addition, an increase of the dimension of the above described plurality of openings in the horizontal direction causes impurities to be easily implanted in the step of ion implantation of impurities by using the gate electrode as a mask. The maximum dimension of the above described plurality of openings in the horizontal direction is defined by the upper limits required for obtaining the necessary minimum electric field applied to the above described electric field reduction region based on the gate potential and the necessary minimum electric field reduction effect.

Decrease of the dimension of the above described plurality of openings in the horizontal direction prevents impurities from being implanted in the step of ion implantation of impurities by using the gate electrode as a mask. This causes the concentration of the finished impurity diffusion layer to be decreased. In addition, decrease of the dimension of the above described plurality of openings in the horizontal direction causes the electric field applied to the above described electric field reduction region based on the gate potential and the electric field reduction effect to be increased. The minimum dimension of the above described plurality of openings in the horizontal direction is defined by the limit dimension for which patterning can be conducted.

Also, increase of the width of the above described surrounding portion of the openings of the gate electrode causes the necessary minimum diffusion distance of impurities in the crosswise direction to be increased. Decrease of the width of the above described surrounding portion causes the necessary minimum diffusion distance of impurities in the crosswise direction to be decreased. Half of the width of the above described surrounding portion corresponds to the necessary minimum distance of the diffusion of impurities in the crosswise direction. Therefore, it is desirable for the width of the above described surrounding portion to be homogeneously formed. If the width of the above described surrounding portion is not formed homogeneously, the necessary minimum distance of the diffusion of impurities is half of the maximum width of the above described surrounding portion.

Therefore, it is desirable for the dimension of the above described plural openings of the gate electrode in the horizontal direction and the width of the surrounding portion to be defined in consideration of the above described relations.

Method for manufacturing the high voltage resistant MOS transistor With reference to the accompanying drawings, a method for manufacturing the high voltage resistant MOS transistor in accordance with the first embodiment of the present invention is hereinafter explained.

FIGS. 3 to 14 are partial vertical cross-section diagrams showing a manufacturing process of the high voltage resistant MOS transistor in accordance with the first embodiment of the present invention.

Figure 3:
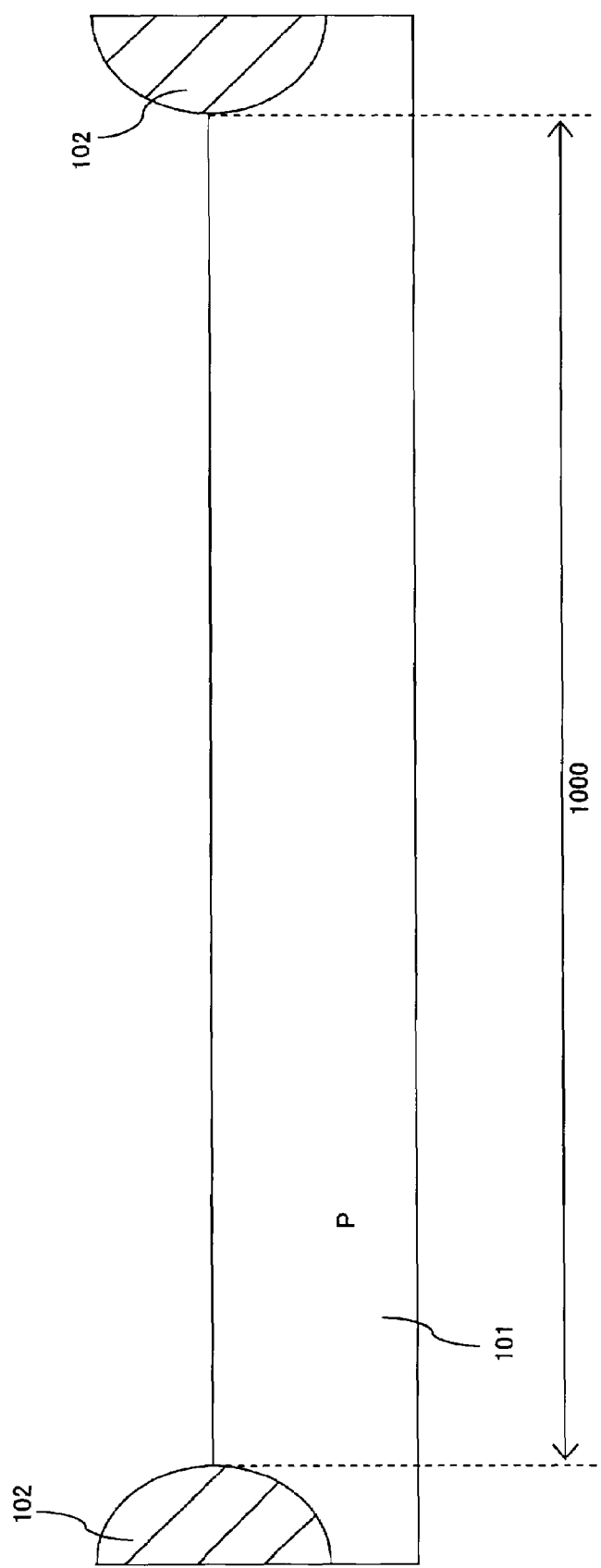
FIG. 3 is a partial vertical cross-section diagram showing a step of a method for manufacturing a high voltage resistant MOS transistor in accordance with the first embodiment of the present invention.

As shown in FIG. 3, a field oxide film 102 is formed in an element isolation region of a p-type semiconductor substrate 101 with a local oxidation of silicon (LOCOS) method. Thus an active region 1000 is defined by the field oxide film 102. The active region 1000 is a region in which a high voltage resistant MOS transistor is formed.

Figure 4:
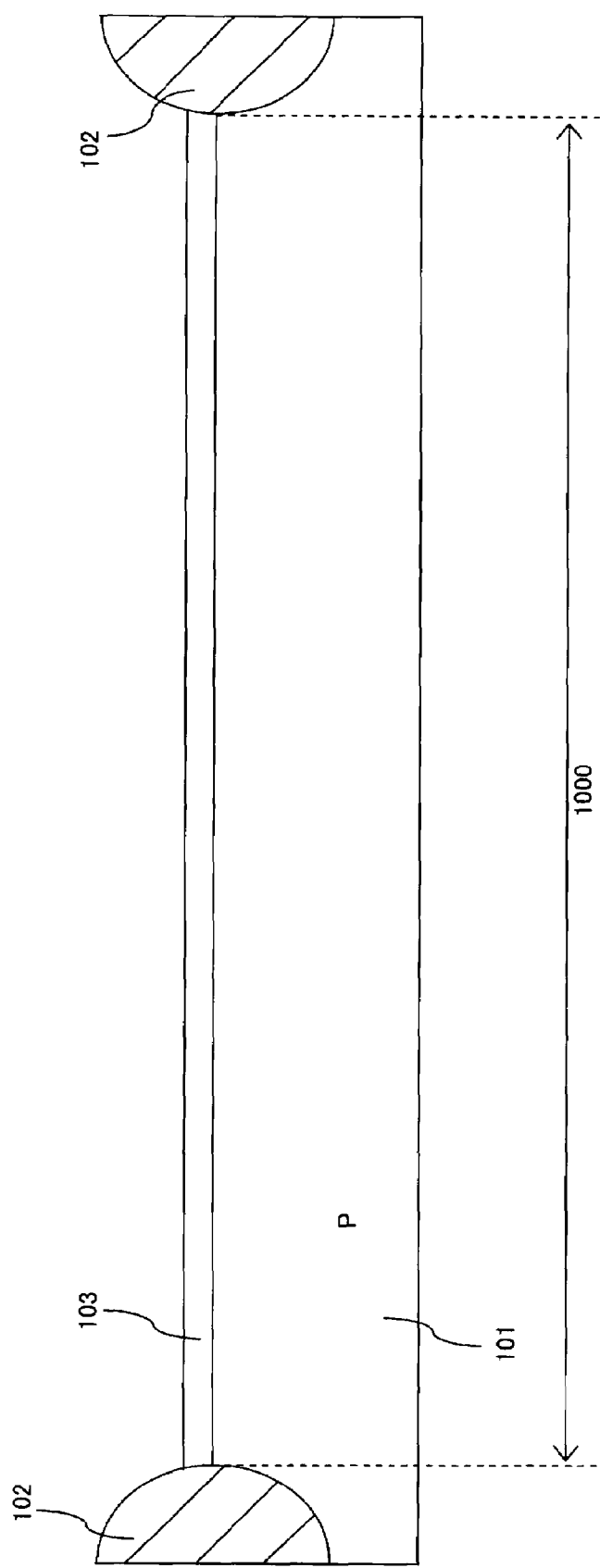
FIG. 4 is a partial vertical cross-section diagram showing a step of a method for manufacturing a high voltage resistant MOS transistor in accordance with the first embodiment of the present invention.

As shown in FIG. 4, a silicon dioxide film 103 of 100 Å in thickness is formed on the p-type semiconductor substrate 101 and the field oxide film 102 with a heretofore known method. Thermal oxidation methods and various types of chemical vapor deposition (CVD) methods can be used as a typical example of the heretofore known methods.

Figure 5:
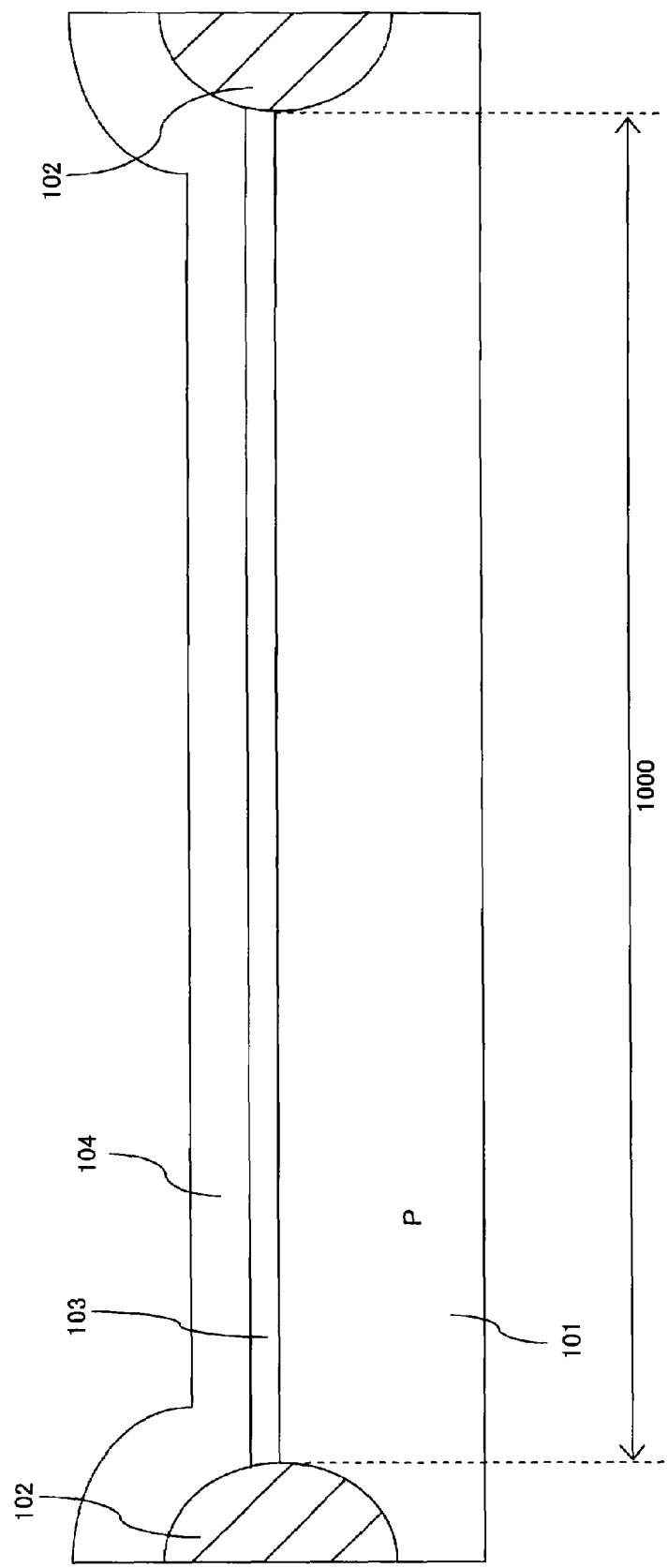
FIG. 5 is a partial vertical cross-section diagram showing a step of a method for manufacturing a high voltage resistant MOS transistor in accordance with the first embodiment of the present invention.
Figure 6:
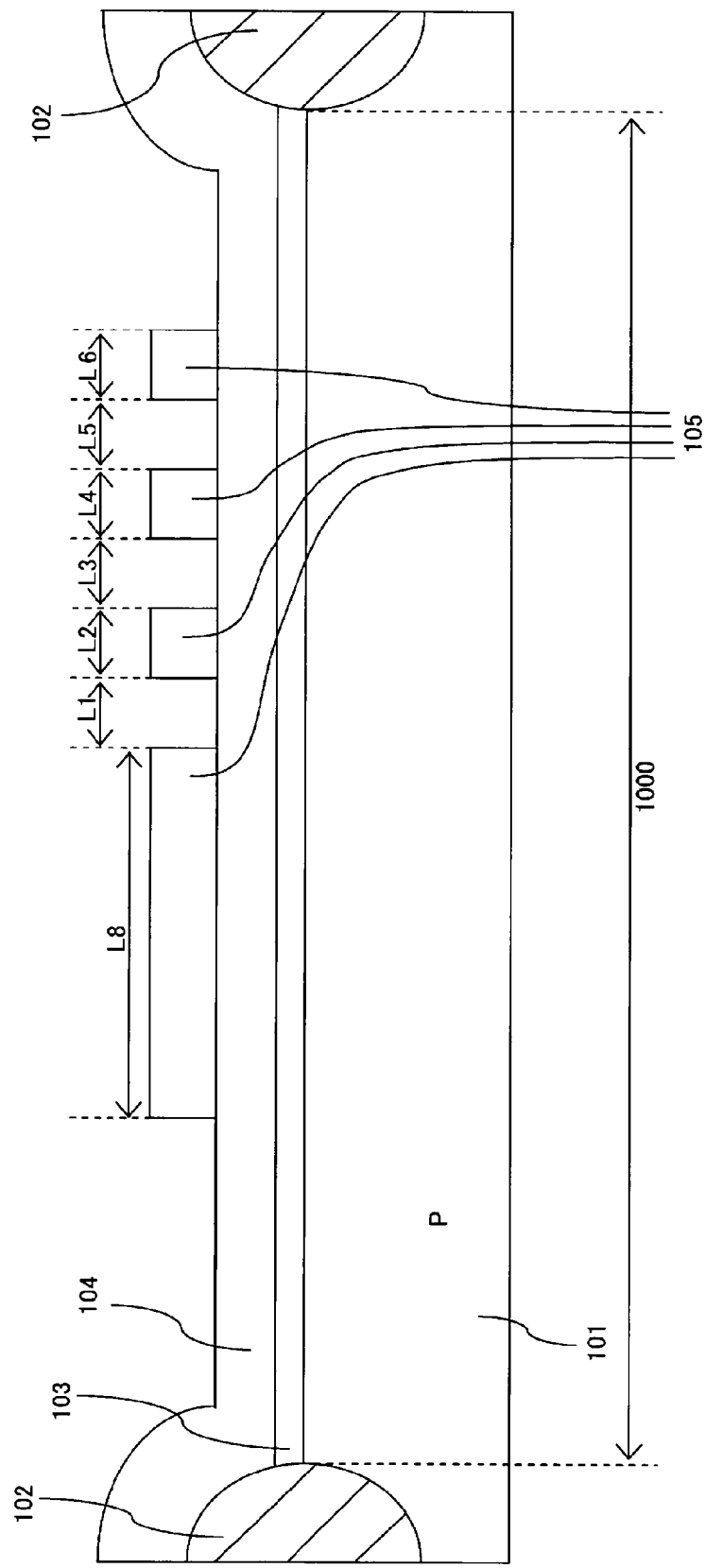
FIG. 6 is a partial vertical cross-section diagram showing a step of a method for manufacturing a high voltage resistant MOS transistor in accordance with the first embodiment of the present invention.

As shown in FIG. 5, a polysilicon film 104 is formed on the silicon dioxide film 103 with a heretofore known CVD method. As shown in FIG. 6, a resist pattern 105 is formed on the polysilicon film 104 with a heretofore known lithography technique. The resist pattern 105 includes three slit shape openings. More specifically, the resist pattern 105 is comprised of a sheet portion, three stripe shape portions, and three slits. Widths of the three slits are L1, L3, and L5, respectively, and widths of the three stripe shape portions are L2, L4, and L6, respectively. Here, all of the widths of the three slits and the three stripe shape portions are the same (i.e., L1=L2=L3=L4=L5=L6). Also, width of the sheet portion is L8.

Figure 7:
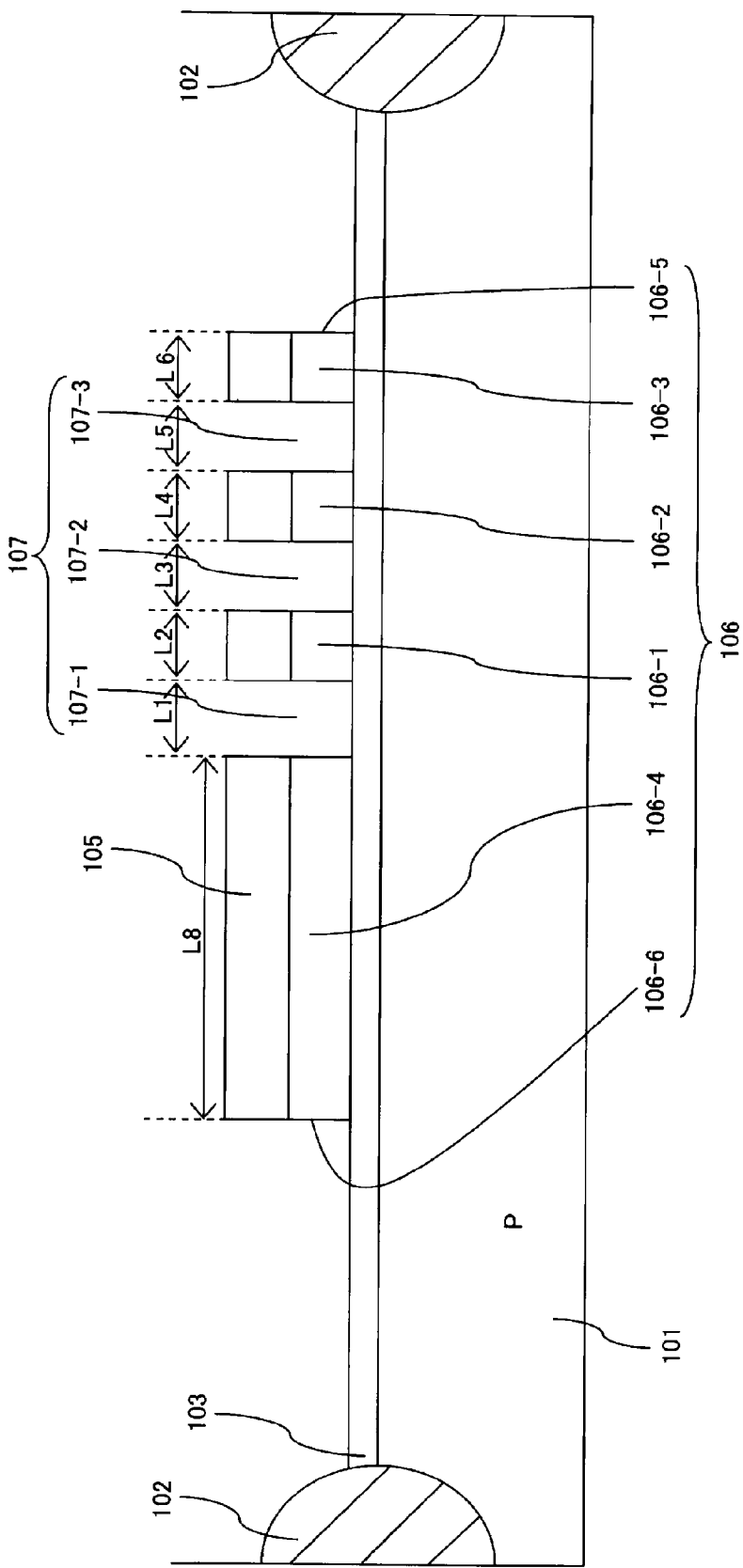
FIG. 7 is a partial vertical cross-section diagram showing a step of a method for manufacturing a high voltage resistant MOS transistor in accordance with the first embodiment of the present invention.

As shown in FIG. 7, the polysilicon film 104 is selectively etched by using the resist pattern 105 as a mask, and thus a gate electrode 106 is formed. As shown in FIG. 2, the gate electrode 106 includes a first stripe shape portion 106-1, a second stripe shape portion 106-2, a third stripe shape portion 106-3, a sheet portion 106-4, a first edge 106-5, a second edge 106-6, a first side region 106-7, a second side region 106-8, and a slit group 107. The slit group 107 is comprised of a first slit 107-1, a second slit 107-2, and a third slit 107-3. Also, these slits 107-1, 107-2, and 107-3 are separated from each other in the first horizontal direction, and longitudinally formed in the second horizontal direction. The sheet portion 106-4 is two-dimensionally formed on the gate insulating film 103 above a channel region and has the width L8 corresponding to the eighth dimension L8.

The first stripe shape portion 106-1 has the width L2 corresponding to the second dimension L2 and separated from the sheet portion 106-4 through the first slit 107-1 with the width L1 corresponding to the first dimension L1 in the first horizontal direction. The second stripe shape portion 106-2 has the width L4 corresponding to the fourth dimension L4 and separated from the first stripe shape portion 106-1 through the second slit 107-2 with the width L3 corresponding to the third dimension L3 in the first horizontal direction. The third stripe shape portion 106-3 has the width L6 corresponding to the sixth dimension L6 and separated from the second stripe shape portion 106-2 through the third slit 107-3 with the width L5 corresponding to the fifth dimension L5 in the first horizontal direction. The first side region 106-7 and the second side region 106-8 are separated from each other in the second horizontal direction and longitudinally formed along the first horizontal direction. Both ends of the first slit 107-1, the second slit 107-2, and the third slit 107-3 are abutted against the first side region 106-7 and the second side region 106-8, respectively. In other words, the first stripe shape portion 106-1, the second stripe shape portion 106-2, the third stripe shape portion 106-3, and the sheet portion 106-4 are connected with each other through the first side region 106-7 and the second side region 106-8. That is to say, the gate electrode 106 includes the slit group 107 and an integrated structure comprised of the first stripe shape portion 106-1, the second stripe shape portion 106-2, the third stripe shape portion 106-3, the sheet portion 106-4, the first side region 106-7, and the second side region 106-8.

The first slit 107-1, the second slit 107-2, and the third slit 107-3 are formed to reach to the element isolation region across the boundary between the active region 1000 and the element isolation region comprised of the fixed oxide film 102. Each of the first slit 107-1, the second slit 107-2, and the third slit 107-3 are terminated on both sides of the first side region 106-7 and the second side region 106-8 of the gate electrode 106. Therefore, the first side region 106-7 and the second side region 106-8 of the gate electrode 106 are formed on the element isolation region comprised of the field oxide film 102.

Widths of the first slit 107-1, the second slit 107-2, and the third slit 107-3 are the same (i.e., L1=L13=L5). Also, widths of the first stripe shape portion 106-1, the second stripe shape portion 106-2, and the third stripe shape portion 106-3 of the gate electrode 106 are the same (i.e., L2=L4=L6). In addition, widths of the first slit 107-1, the second slit 107-2, and the third slit 107-3 (i.e., L1=L3=L5) and widths of the first stripe shape portion 106-1, the second stripe shape portion 106-2, and the third stripe shape portion 106-3 of the gate electrode 106 (i.e., L2=L4=L6) are the same (i.e., L1=L2=L3=L4=L5=L6). Furthermore, the distance between the first edge 106-5 and the second edge 106-6 of the gate electrode 106, that is, the dimension of the gate electrode 106 in the first horizontal direction, is derived by the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the width L8 of the sheet portion 106-4 (i.e., L1+L2+L3+L4+L5+L6+L8). In the first embodiment of the present invention, widths of the first slit 107-1, the second slit 107-2, and the third slit 107-3 are all set to the identical value 0.3 μm (i.e., L1=L3=L5=0.3 μm) and widths of the first stripe shape portion 106-1, the second stripe shape portion 106-2, and the third stripe shape portion 106-3 of the gate electrode 106 are all set to the identical value 0.3 μm (i.e., L2=L4=L6=0.3 μm).

Figure 8:
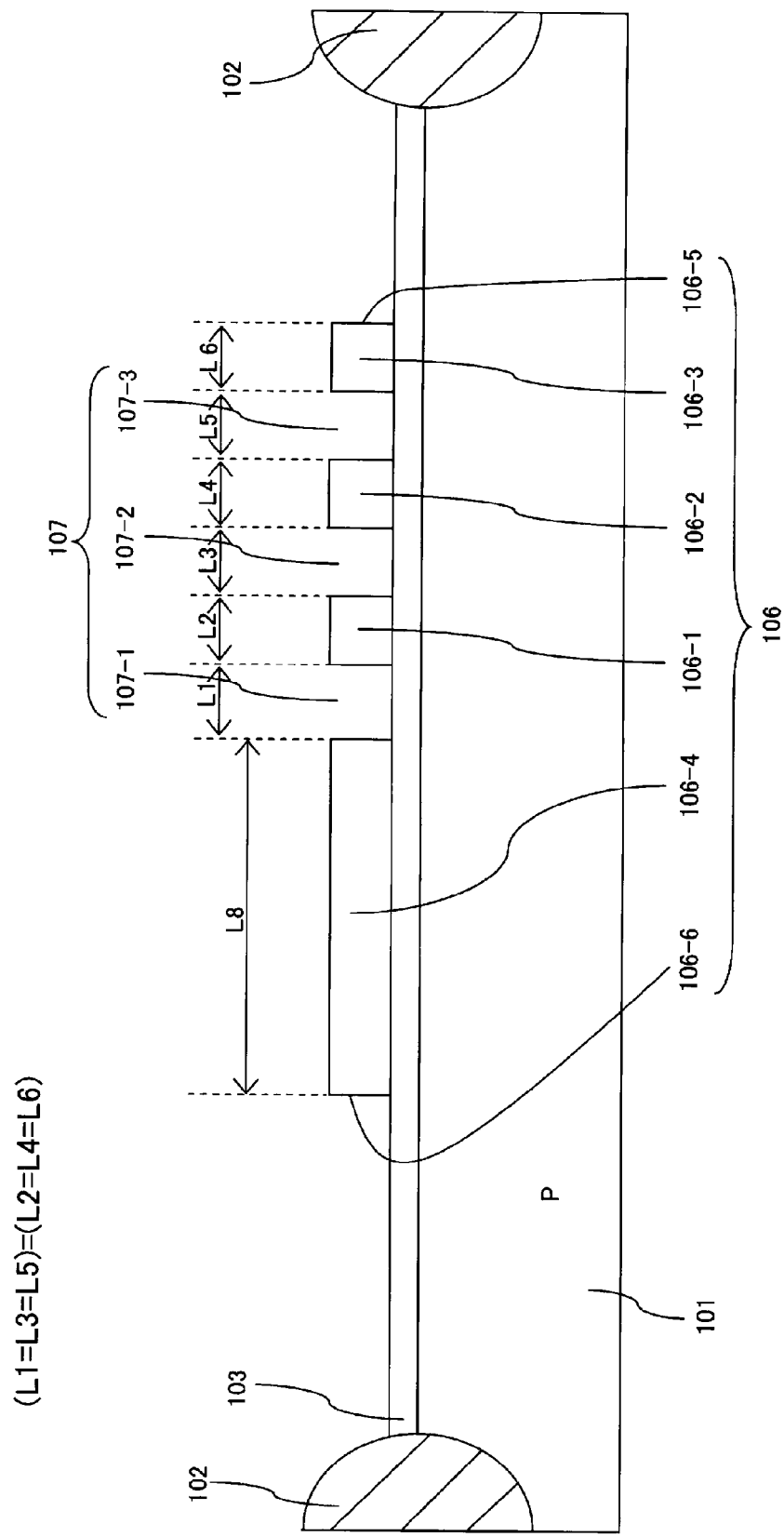
FIG. 8 is a partial vertical cross-section diagram showing a step of a method for manufacturing a high voltage resistant MOS transistor in accordance with the first embodiment of the present invention.

As shown in FIG. 8, the resist pattern 105 is eliminated with a heretofore known method.

Figure 9:
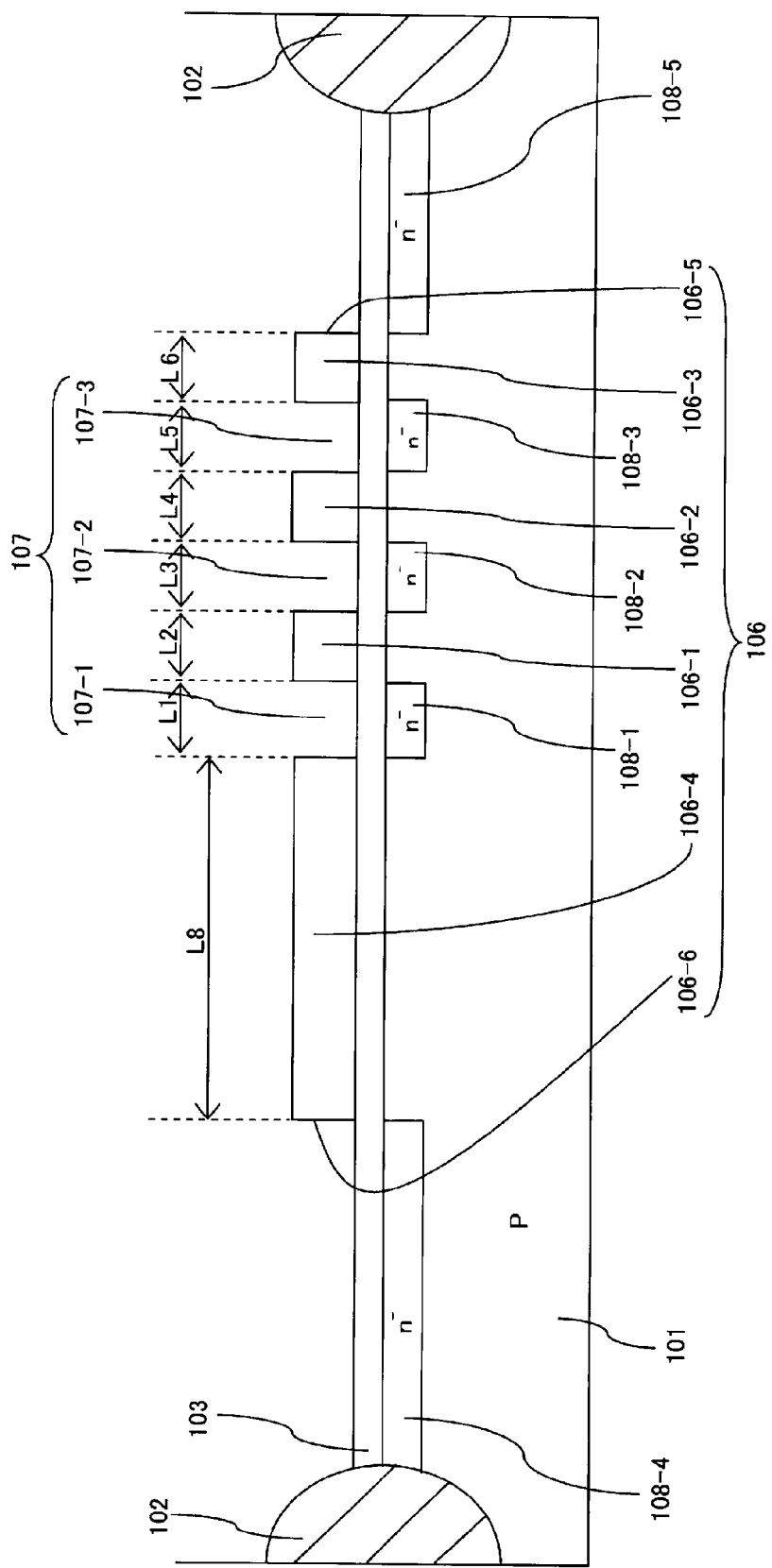
FIG. 9 is a partial vertical cross-section diagram showing a step of a method for manufacturing a high voltage resistant MOS transistor in accordance with the first embodiment of the present invention.

As shown in FIG. 9, with a heretofore known ion implantation technique, the n-type impurity phosphorus (P) is selectively implanted into the principal surface of the p-type semiconductor substrate 101 through the gate insulating film 103 in the vertical direction by using the gate electrode 106 as a mask with an acceleration energy of 150 keV and the dose amount of $6.0 \times 10^{12}$ cm$^{-2}$. Here, the term "the vertical direction" means the direction vertical to the substrate surface, that is, the direction vertical to the plane including the direction defining the channel length of the transistor and the direction defining the channel width. As a result, a first lightly doped N$^-$ implantation region 108-1 is selectively formed in the upper region of the p-type semiconductor substrate 101 located below the first slit 107-1 of the gate electrode 106. A second lightly doped N$^-$ implantation region 108-2 is selectively formed in the upper region of the p-type semiconductor substrate 101 located below the second slit 107-2 of the gate electrode 106. A third lightly doped N$^-$ implantation region 108-3 is selectively formed in the upper region of the p-type semiconductor substrate 101 located below the third slit 107-3 of the gate electrode 106. A fourth lightly doped N$^-$ implantation region 108-4 is selectively formed in the upper region of the p-type semiconductor substrate 101 located below the outer side of the second edge 106-6 of the gate electrode 106. A fifth lightly doped N$^-$ implantation region 108-5 is selectively formed in the upper region of the p-type semiconductor substrate 101 located below the outer side of the first edge 106-5 of the gate electrode 106.

That is, the first lightly doped N$^-$ implantation region 108-1 is formed to be self-aligned with the first slit 107-1 of the gate electrode 106. Here, the positions of both edges of the first lightly doped N$^-$ implantation region 108-1 correspond to the positions of the both sidewalls of the first slit 107-1 in the first horizontal direction. The second lightly doped N$^-$ implantation region 108-2 is formed to be self-aligned with the second slit 107-2 of the gate electrode 106. Here, the positions of both edges of the second lightly doped N⁻ implantation region 108-2 correspond to the positions of the both sidewalls of the second slit 107-2 in the first horizontal direction. The third lightly doped N⁻ implantation region 108-3 is formed to be self-aligned with the third slit 107-3 of the gate electrode 106. Here, the positions of both edges of the third lightly doped N⁻ implantation region 108-3 correspond to the positions of both sidewalls of the third slit 107-3 in the first horizontal direction. The fourth first lightly doped N⁻ implantation region 108-4 is formed to be self-aligned with the second edge 106-6 of the gate electrode 106. The fifth first lightly doped N⁻ implantation region 108-5 is formed to be self-aligned with the first edge 106-5 of the gate electrode 106.

Figure 10:
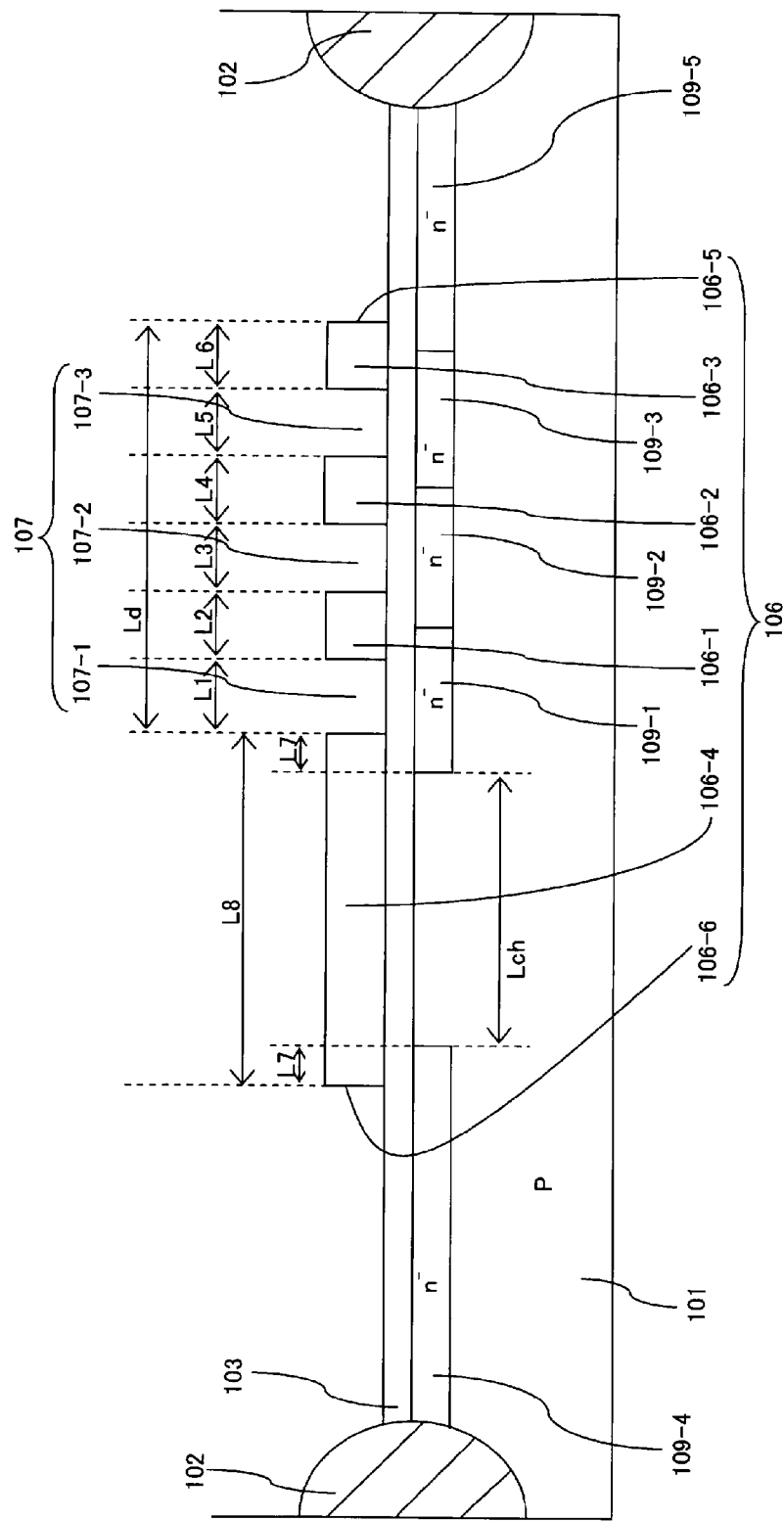
FIG. 10 is a partial vertical cross-section diagram showing a step of a method for manufacturing a high voltage resistant MOS transistor in accordance with the first embodiment of the present invention.
Figure 41A:
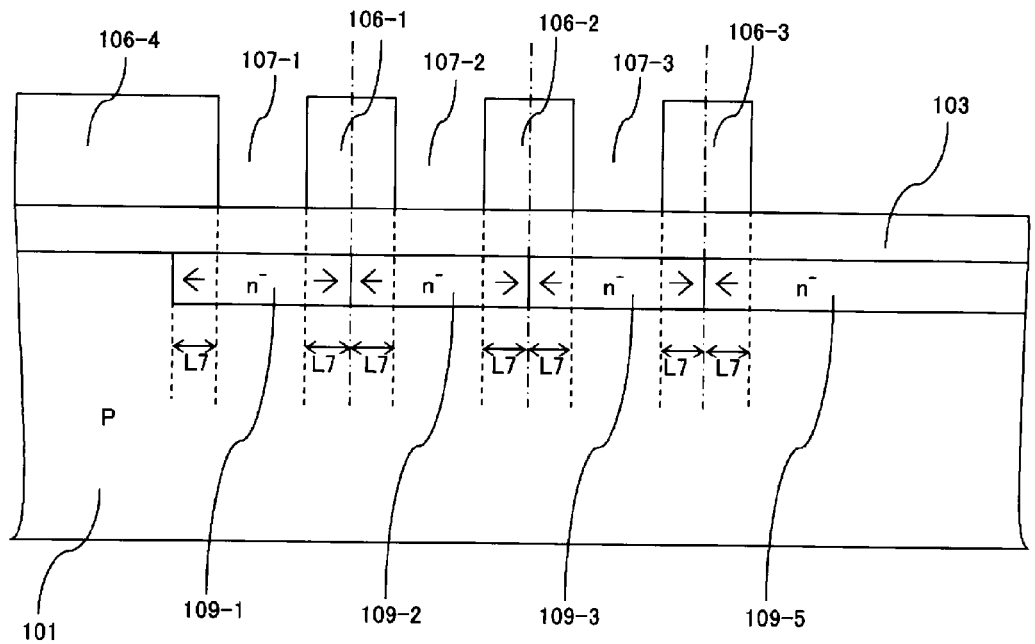
FIGS. 41A and 41B are partial vertical cross-section diagrams showing a relationship between a distance of thermal diffusion of impurities along the first horizontal direction and a width of a stripe shape portion of a gate electrode in a step of a method for manufacturing a high voltage resistant MOS transistor in accordance with the first embodiment of the present invention.
Figure 41B:
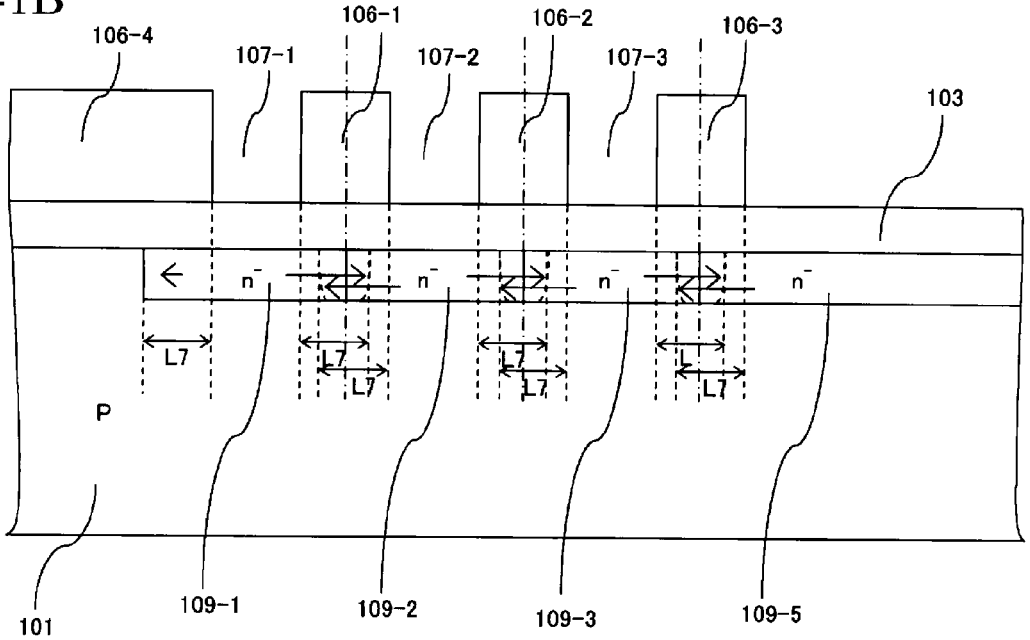

As shown in FIGS. 10, 41A, and 41B, the above described ion implanted impurities are activated and thermally diffused by a thermal treatment in the $N_2$ atmosphere at 1000 degrees Celsius for approximately 100 minutes with a heretofore known thermal diffusion technique. The thermal diffusion of impurities is isotropic. Therefore, impurities are diffused in the depth direction and the horizontal direction (i.e., the crosswise direction). As a result, the first lightly doped N⁻ implantation region 108-1, the second lightly doped N⁻ implantation region 108-2, the third lightly doped N⁻ implantation region 108-3, the fourth lightly doped N⁻ implantation region 108-4, and the fifth lightly doped N⁻ implantation region 108-5 are turned into a first lightly doped N⁻ diffusion layer 109-1, a second lightly doped N⁻ diffusion layer 109-2, a third lightly doped N⁻ diffusion layer 109-3, a fourth lightly doped N⁻ diffusion layer 109-4, and a fifth lightly doped N⁻ diffusion layer 109-5, respectively. As shown in FIG. 9, the first lightly doped N⁻ implantation region 108-1 is self-aligned with the first slit 107-1 of the gate electrode 106, and the thermal diffusion of impurities is isotropic. Therefore, the center location of the first lightly doped N⁻ diffusion layer 109-1 is self-aligned with the center location of the first slit 107-1 in the first horizontal direction. Also, the second lightly doped N⁻ implantation region 108-2 is self-aligned with the second slit 107-2 of the gate electrode 106, and the thermal diffusion of impurities is isotropic. Therefore, the central location of the second lightly doped N⁻ diffusion layer 109-2 is self-aligned with the central location of the second slit 107-2 in the first horizontal direction. In addition, the third lightly doped N⁻ implantation region 108-3 is self-aligned with the third slit 107-3 of the gate electrode 106 and the thermal diffusion of impurities is isotropic. Therefore, the central location of the third lightly doped N⁻ diffusion layer 109-3 is self-aligned with the central location of the third slit 107-3 in the first horizontal direction.

Also, the width L1 of the first slit 107-1, the width L3 of the second slit 107-2, and the width L5 of the third slit 107-3 are the same. Therefore, the impurity concentrations of the first lightly doped N⁻ implantation region 108-1, the second lightly doped N⁻ implantation region 108-2, and the third lightly doped N⁻ implantation region 108-3 are the same. Because of this, the impurity concentrations and depths of the first lightly doped N⁻ diffusion layer 109-1, the second lightly doped N⁻ diffusion layer 109-2, and third lightly doped N⁻ diffusion layer 109-3 are substantially the same.

The first lightly doped N⁻ diffusion layer 109-1 and the second lightly doped N⁻ diffusion layer 109-2 are required to be adjacently formed without any space. The second lightly doped N⁻ diffusion layer 109-2 and the third lightly doped N⁻ diffusion layer 109-3 are required to be adjacently formed without any space. The third lightly doped N⁻ diffusion layer 109-3 and the fifth lightly doped N⁻ diffusion layer 109-5 are adjacently formed without any space. Furthermore, the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 are required to form an integrated lightly doped impurity diffusion region.

In order to form the above described integrated lightly doped impurity diffusion region, the distance L7 of the thermal diffusion of impurities in the crosswise direction needs to be set to at least half of the widths of the first stripe shape portion 106-1, the second stripe shape portion 106-2, and the third stripe shape portion 106-3 of the gate electrode 106 (i.e., L2/2=L4/2=L6/2=0.3 m/2=0.15 m). Also, as described above, the lightly doped impurity implantation regions are selectively formed in the region of the p-type semiconductor substrate 101 located below the first slit 107-1, the second slit 107-2, and the third slit 107-3 by conducting an ion implantation step by using the gate electrode 106 having the slit group 107 as a mask. In this phase, the positions of both edges of the lightly doped impurity implantation regions are self-aligned with the positions of both ends of the first slit 107-1, the second slit 107-2, and the third slit 107-3. Also, the adjacent lightly doped impurity implantation regions are separated from each other by the distance corresponding to the widths of the first stripe shape portion 106-1, the second stripe shape portion 106-2, and the third stripe shape portion 106-3 of the gate electrode 106 (i.e., L2=L4=L6=0.3 μm) in the first horizontal direction. Then, the impurity implantation regions are expanded by conducting a thermal diffusion step of impurities. This thermal diffusion step of impurities is continuously conducted until the adjacent impurity diffusion regions at least have contact with each other. As a result, the first lightly doped N⁻ diffusion layer 109-1 and the second lightly doped N⁻ diffusion layer 109-2 are adjacently formed without any space. Also, the second lightly doped N⁻ diffusion layer 109-2 and the third lightly doped N⁻ diffusion layer 109-3 are adjacently formed without any space. In addition, the third lightly doped N⁻ diffusion layer 109-3 and the fifth lightly doped N⁻ diffusion layer 109-5 are adjacently formed without any space. Furthermore, the integrated lightly doped impurity diffusion region is comprised of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5.

FIGS. 41A and 41B are partial vertical cross-section diagrams showing the relationship between the distance of the thermal diffusion of impurities and the width of the stripe shape portion of the gate electrode in the first horizontal direction. As shown in FIG. 41A, when a thermal diffusion step of impurities is stopped at the time when the distance L7 of the thermal diffusion of impurities in the first horizontal direction reaches half of the widths of the first stripe shape portion 106-1, the second stripe shape portion 106-2, and the third stripe shape portion 106-3 of the gate electrode 106 (i.e., L2/2=L4/2=L6/2=0.30 μm/2=0.15 μm), the diffusion fronts of impurities in the crosswise direction reach the positions corresponding to the central locations of the first stripe shape portion 106-1, the second stripe shape portion 106-2, and the third stripe shape portion 106-3 of the gate electrode 106, respectively, in the first horizontal direction. In other words, the diffusion fronts of impurities from the adjacent lightly doped impurity implantation regions in the crosswise direction have contact with each other. This means that the impurity with the longest distance of the thermal diffusion in the crosswise direction reaches the position corresponding to the central locations of the first stripe shape portion 106-1, the second stripe shape portion 106-2, and the third stripe shape portion 106-3 of the gate electrode 106, respectively, in the first horizontal direction. In this case, the impurity concentrations in the positions corresponding to the central locations of the first stripe shape portion 106-1, the second stripe shape portion 106-2, and the third stripe shape portion 106-3 of the gate electrode 106 are lower than those in the positions corresponding to the central locations of the first slit 107-1, the second slit 107-2, and the third slit 107-3, respectively. In other words, the integrated lightly doped impurity diffusion region, which is comprised of the first lightly doped $N^-$ diffusion layer 109-1, the second lightly doped $N^-$ diffusion layer 109-2, the third lightly doped $N^-$ diffusion layer 109-3, and the fifth lightly doped $N^-$ diffusion layer 109-5, has a heterogeneous impurity concentration profile in the first horizontal direction.

In the present application, the above described term "the diffusion front of impurities in the crosswise direction" means the tip of the diffused impurity region in the crosswise direction. Also, the term "the crosswise direction" means the direction parallel to the surface of the semiconductor substrate and includes the above described first direction and the second direction.

On the other hand, as shown in FIG. 41B, when the distance L7 of the thermal diffusion of impurities are set to larger than half of the widths of the first stripe shape portion 106-1, the second stripe shape portion 106-2, and the third stripe shape portion 106-3 of the gate electrode 106 (L2/2=L4/2=L6/2=0.3 μm/2=0.15 μm), the diffusion fronts of impurities from the adjacent lightly doped impurity implantation regions in the crosswise direction are mutually intersected. In other words, the diffusion fronts of impurities in the crosswise direction cross the positions corresponding to the central locations of the first stripe shape portion 106-1, the second stripe shape portion 106-2, and the third stripe shape portion 106-3 of the gate electrode 106, respectively, in the first horizontal direction, and the mutually overlapped thermal diffused regions in the crosswise direction are formed in the first stripe shape portion 106-1, the second stripe shape portion 106-2, and the third stripe shape portion 106-3 of the gate electrode 106. This means that the impurity with the longest distance of the thermal diffusion in the crosswise direction crosses the position corresponding to the central locations of the first stripe shape portion 106-1, the second stripe shape portion 106-2, and the third stripe shape portion 106-3 of the gate electrode 106, respectively, in the first horizontal direction. The mutually overlapped thermal diffusions in the crosswise direction reduce the difference between the impurity concentrations in the positions corresponding to the central locations of the first stripe shape portion 106-1, the second stripe shape portion 106-2, and the third stripe shape portion 106-3 of the gate electrode 106 and the impurity concentrations in the positions corresponding to the central locations of the first slit 107-1, the second slit 107-2, and the third slit 107-3, respectively. That is to say, the thermal diffusion step is continuously conducted until the thermal diffusions in the crosswise direction are mutually overlapped, and thus the above described integrated lightly doped impurity diffusion region has a more homogeneous impurity concentration profile. Therefore, in order to obtain a more homogeneous impurity concentration profile, it is desirable to continue the thermal diffusion step until the distance L7 of the thermal diffusion of impurities in the horizontal direction exceeds half of the widths of the first stripe shape portion 106-1, the second stripe shape portion 106-2, and the third stripe shape portion 106-3 of the gate electrode 106 (i.e., L2/2=L4/2=L6/2=0.3 μm/2=0.15 μm) and the thermal diffusions in the crosswise direction are mutually overlapped. As a matter of convenience, FIG. 10 shows that the boundaries between adjacent layers of the first lightly doped $N^-$ diffusion layer 109-1, the second lightly doped $N^-$ diffusion layer 109-2, the third lightly doped $N^-$ diffusion layer 109-3, and the fifth lightly doped $N^-$ diffusion layer 109-5 are formed in the central locations of the regions in which the thermal diffusions in the crosswise direction are mutually overlapped.

As shown in FIG. 10, the inner side edge of the first lightly doped $N^-$ diffusion layer 109-1 is overlapped with the sheet portion 106-4 of the gate electrode 106 by the dimension corresponding to the distance L7 of the thermal diffusion of impurities in the horizontal direction. In the same way, the inner side edge of the fourth lightly doped $N^-$ diffusion layer 109-4 is overlapped with the sheet portion 106-4 of the gate electrode 106 by the dimension corresponding to the distance L7 of the thermal diffusion of impurities in the horizontal direction. The channel length Lch is defined between the inner side edge of the first lightly doped $N^-$ diffusion layer 109-1 and the inner side edge of the fourth lightly doped $N^-$ diffusion layer 109-4. Therefore, the channel length Lch is equal to the value derived by subtracting twice of the distance L7 of the thermal diffusion of impurities in the horizontal direction from the width L8 of the sheet portion 106-4 (i.e., Lch=L8−2×L7).

The electric field produced by the gate potential is applied to the channel region, the first lightly doped $N^-$ diffusion layer 109-1, the second lightly doped N-diffusion layer 109-2, the third lightly doped $N^-$ diffusion layer 109-3, and the fifth lightly doped $N^-$ diffusion layer 109-5 by the sheet portion 106-4, the first stripe shape portion 106-1, the second stripe shape portion 106-2, and the third stripe shape portion 106-3 of the gate electrode 106. Therefore, the width of the gate electrode 106 (i.e., the dimension of the gate electrode 106 in the horizontal direction) is defined by the distance between the first edge 106-5 (i.e., the drain side edge of the third stripe shape portion 106-3) and the second edge 106-6 (i.e., the source side edge of the sheet portion 106-4). Therefore, the width of the gate electrode 106 corresponds to the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the width L8 of the sheet portion 106-4.

The above described integrated lightly doped impurity diffusion region has portions overlapped with the gate electrode 106, and these portions function as the electric field reduction regions. The dimension of the electric field reduction region in the first horizontal direction corresponds to the dimension of the gate overlap dimension. As described above, the integrated lightly doped impurity diffusion region is comprised of the first lightly doped $N^-$ diffusion layer 109-1, the second lightly doped $N^-$ diffusion layer 109-2, the third lightly doped $N^-$ diffusion layer 109-3, and the fifth lightly doped $N^-$ diffusion layer 109-5. The gate electrode 106 includes the sheet portion 106-4, the first stripe shape portion 106-1, the second stripe shape portion 106-2, and the third stripe shape portion 106-3. Therefore, the gate overlap dimension Ld is defined by the distance between the inner side edge of the first lightly doped $N^-$ diffusion layer 109-1 and the first edge 106-5 of the gate electrode 106 in the first horizontal direction. Because of this, the gate overlap dimension Ld between the electric field reduction region and the gate electrode 106 is the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the distance L7 of the thermal diffusion of impurities in the horizontal direction (i.e., Ld=L1+L2+L3+L4+L5+L6+L7=0.3×6+L7=1.8 μm+L7). As described above, the distance L7 of the thermal diffusion of impurities in the horizontal direction is required to 0.15 μm or more. Therefore, the gate overlap dimension Ld is set to 1.95 μm or more.

Figure 11:
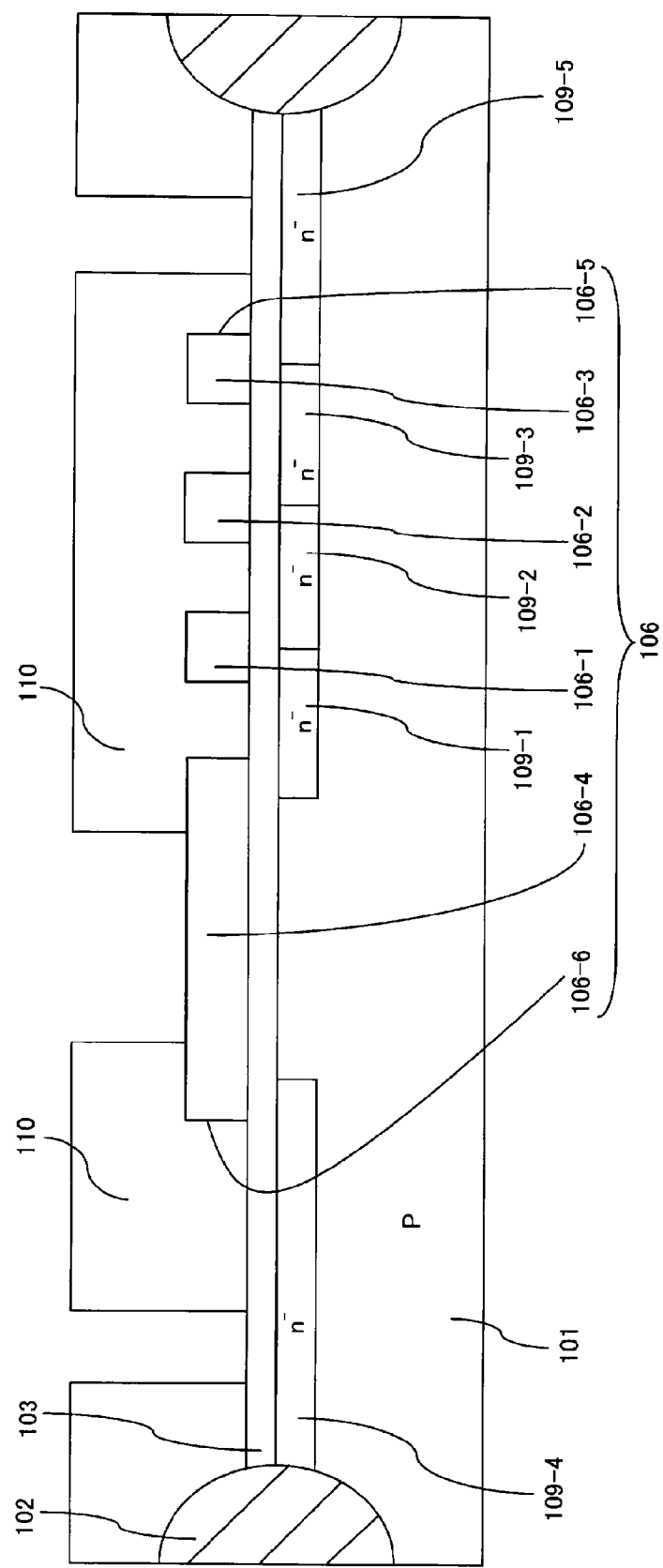
FIG. 11 is a partial vertical cross-section diagram showing a step of a method for manufacturing a high voltage resistant MOS transistor in accordance with the first embodiment of the present invention.

As shown in FIG. 11, a resist pattern 110 is formed on the gate electrode 106, the gate insulating film 103, and the field oxide film 102 with a heretofore known lithography technique.

Figure 12:
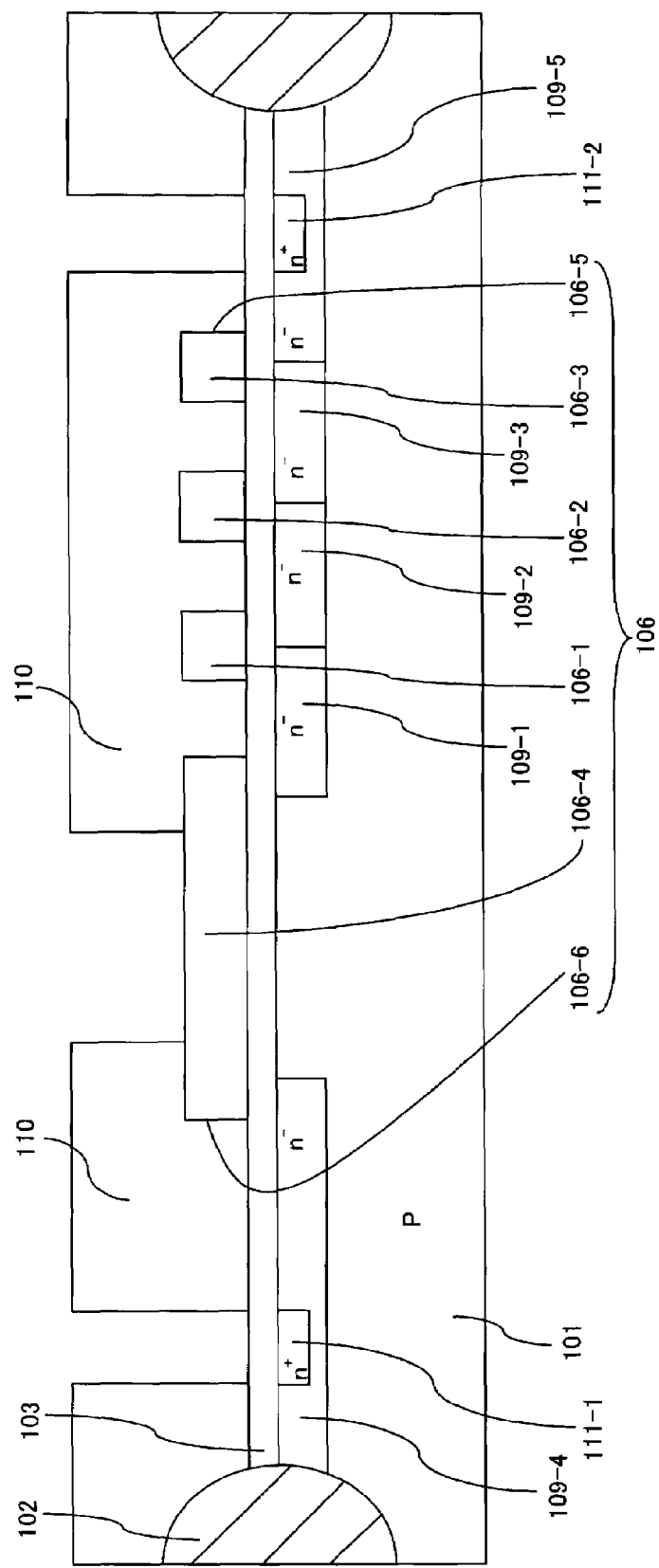
FIG. 12 is a partial vertical cross-section diagram showing a step of a method for manufacturing a high voltage resistant MOS transistor in accordance with the first embodiment of the present invention.

As shown in FIG. 12, the n-type impurity arsenic (As) is selectively implanted into the upper regions of the fourth lightly doped N⁻ diffusion layer 109-4 and the fifth lightly doped N⁻ diffusion layer 109-5 in the vertical direction by using the resist pattern 110 and the sheet portion 106-4 of the gate electrode 106 as a mask with an acceleration energy of 40 keV and the dose amount of $1.0\times10^{15}$ cm$^{-2}$. As a result, a source side first heavily doped N⁺ diffusion layer 111-1 is selectively formed in the upper region of the fourth lightly doped N⁻ diffusion layer 109-4, and a drain side second heavily doped N⁺ diffusion layer 111-2 is selectively formed in the upper region of the fifth lightly doped N⁻ diffusion layer 109-5.

Figure 13:
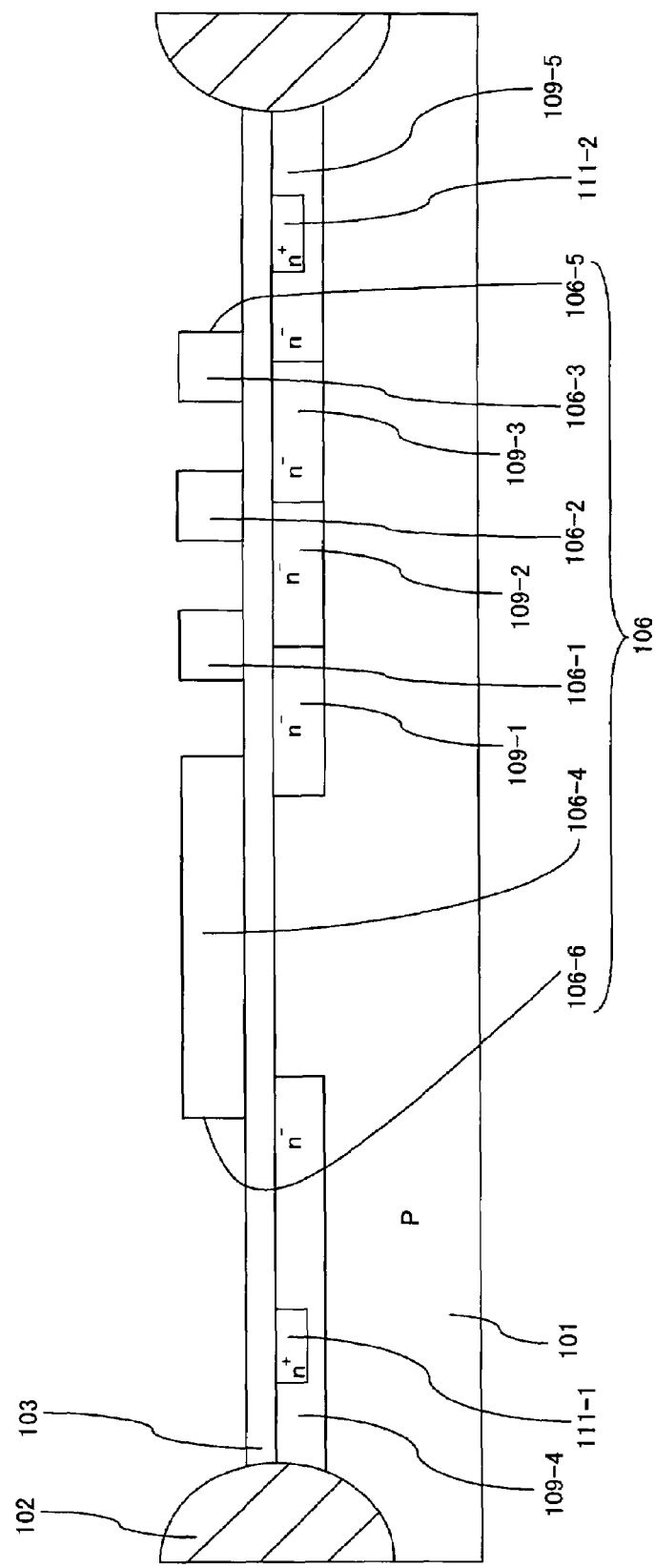
FIG. 13 is a partial vertical cross-section diagram showing a step of a method for manufacturing a high voltage resistant MOS transistor in accordance with the first embodiment of the present invention.

As shown in FIG. 13, the resist pattern 110 is eliminated with a heretofore known method.

Figure 14:
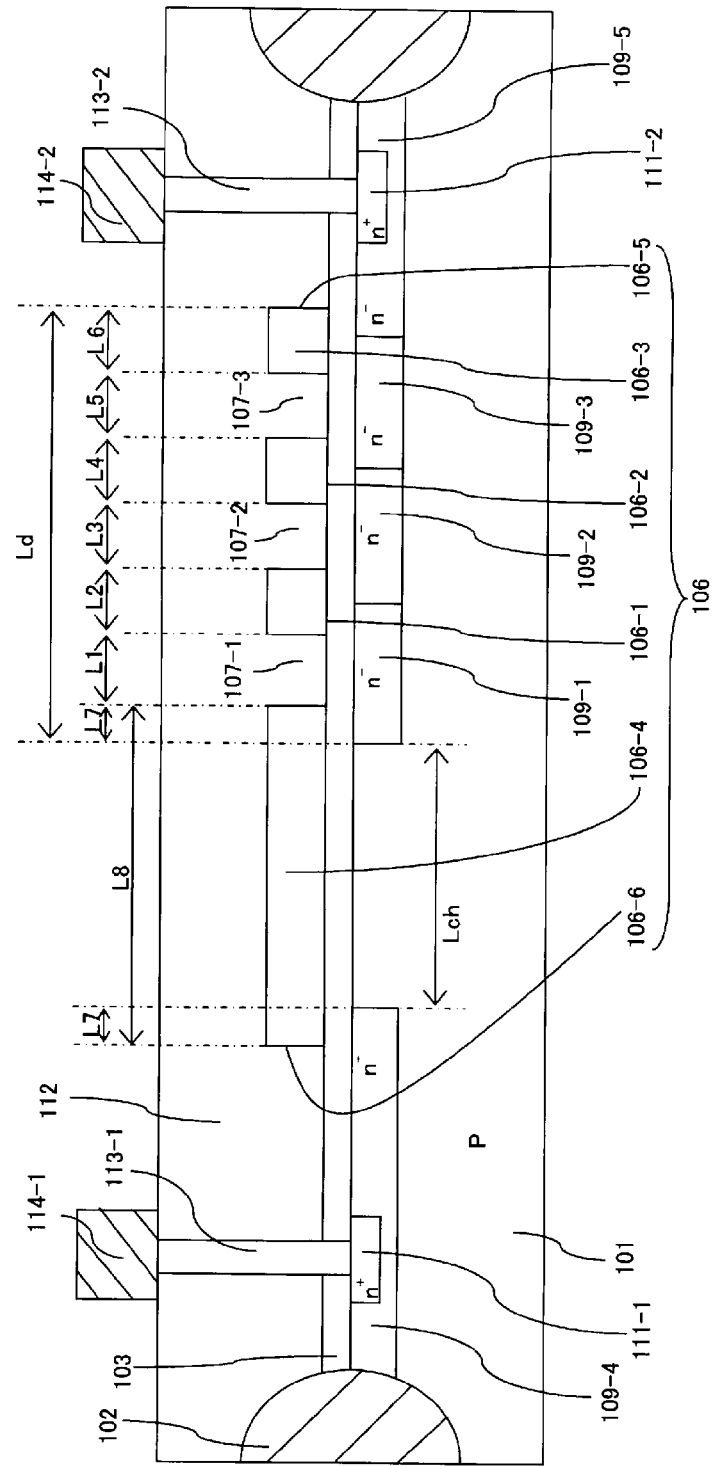
FIG. 14 is a partial vertical cross-section diagram showing a step of a method for manufacturing a high voltage resistant MOS transistor in accordance with the first embodiment of the present invention.

As shown in FIG. 14, an interlayer insulating film 112 is formed on the gate electrode 106, the gate insulating film 103, and the field oxide film 102 with a heretofore known method. Then, contact holes are formed in the interlayer insulating film 112 and the gate insulating film 103. Next, a source contact 113-1 and a drain contact 113-2 are formed in the contact holes. Thus the source contact 113-1 and the drain contact 113-2 have ohmic contacts with the source side first heavily doped N⁺ diffusion layer 111-1 and the drain side first heavily doped N⁺ diffusion layer 111-2, respectively. Next, a source wiring layer 114-1 and a drain wiring layer 114-2 are formed on the interlayer insulating film 112 with a heretofore known method. As a result, the source wiring layer 114-1 and the drain wiring layer 114-2 are electrically connected to the source side first heavily doped N⁺ diffusion layer 111-1 and the drain side heavily doped N⁺ diffusion layer 111-2 through the source contact 113-1 and the drain contact 113-2, respectively.

According to the present invention, as described above, ion implantation of impurities is conducted by using the gate electrode 106 having the slit group 107 as a mask, and the lightly doped impurity implantation regions 108-1 to 108-5 self-aligned with the gate electrode 106 are formed. In this phase, the positions of both edges of the lightly doped impurity implantation regions are self-aligned with the positions of both edge sidewalls of the first slit 107-1, the second slit 107-2, and the third slit 107-3 in the first horizontal direction. In addition, the above described thermal diffusion in the crosswise direction is symmetrical in the first horizontal direction. Therefore, the central location of the first lightly doped N⁻ diffusion layer 109-1 is self-aligned with the central location of the first slit 107-1. The central location of the second lightly doped N⁻ diffusion layer 109-2 is self-aligned with the central location of the second slit 107-2. The central location of the third lightly doped N⁻ diffusion layer 109-3 is self-aligned with the central location of the third slit 107-3. Therefore, the above described integrated lightly doped impurity diffusion region is self-aligned with the slit group 107 in the first horizontal direction. That is to say, the above described integrated lightly doped impurity diffusion region is self-aligned with the gate electrode 106 having the slit group 107 in the position of the first horizontal direction.

The regions of the above described integrated lightly doped impurity diffusion region overlapped with the gate electrode 106 function as the electric field reduction region. Therefore, the overlap dimension Ld between the electric field reduction region and the gate electrode 106 is the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the distance L7 of the thermal diffusion of impurities in the horizontal direction (i.e., Ld=L1+L2+L3+L4+L5+L6+L7).

Therefore, the first embodiment of the present invention has the following effects.

First, misalignment between the patterning to form the electric field reduction region and the patterning to form the gate electrode 106 is not caused. Because of this, a variation from a design value of the overlap dimension Ld based on the misalignment between those patternings is not caused. Therefore, the gate overlap dimension Ld can be defined without any regard for the alignment margin between the patterning to form the electric field reduction region and the patterning to form the gate electrode 106. When a gate overlap structure is formed in a non-self-alignment fashion, a design value needs to be set to the dimension derived by adding the above described alignment margin between those patternings to the originally necessary gate overlap dimension. On the other hand, when a gate overlap structure is formed in a self-alignment fashion, the above described alignment margin between those patternings is not needed and a design value may be set to the originally necessary gate overlap dimension as it is. Because of this, the current drive capability of the high voltage resistant MOS transistor can be improved. As a result, the device size can be reduced.

Second, the gate overlap dimension Ld can be regulated by regulating the number of slits. In general, a high voltage resistant MOS transistor needs the large gate overlap amount. However, a desired large gate overlap amount can be obtained by increasing the number of slits without any regard for the alignment margin between the patterning to form the electric field reduction region and the patterning to form the gate electrode 106. For example, a 40 V voltage resistant MOS transistor may need the gate overlap amount of 2 μm. According to the gate overlap structure in accordance with the first embodiment of the present invention, the gate overlap dimension Ld of 1.95 μm or more can be obtained by setting the widths of the above described three slits, the widths of the above described three stripe shape portions, and the distance L7 of the thermal diffusion in the horizontal direction to 0.3 μm, 0.3 μm, and half of the width of the above described three stripe shape portions or more, respectively. Therefore, the large gate overlap amount required for the 40 V voltage resistant MOS transistor can be obtained. Also, three slits are formed in the first embodiment of the present invention. However, the number of the slits can be arbitrarily changed according to the demanded gate overlap dimension Ld.

Third, the integrated lightly doped impurity diffusion region including the electric field reduction region is formed by conducting ion implantation by using the gate electrode as a mask. In other words, formation of a mask comprised of a resist pattern is not needed for the ion implantation step to form the integrated impurity diffusion region including the electric field reduction region. Therefore, a MOS transistor can be manufactured in less manufacturing steps.

Second Embodiment

High Voltage Resistant MOS Transistor Structure

According to the present invention, a high voltage resistant MOS transistor including a lightly doped diffusion layer that is overlapped with a gate electrode in a self-alignment fashion and functions as an electric field reduction region, and a method for manufacturing thereof are provided.

Figure 15:
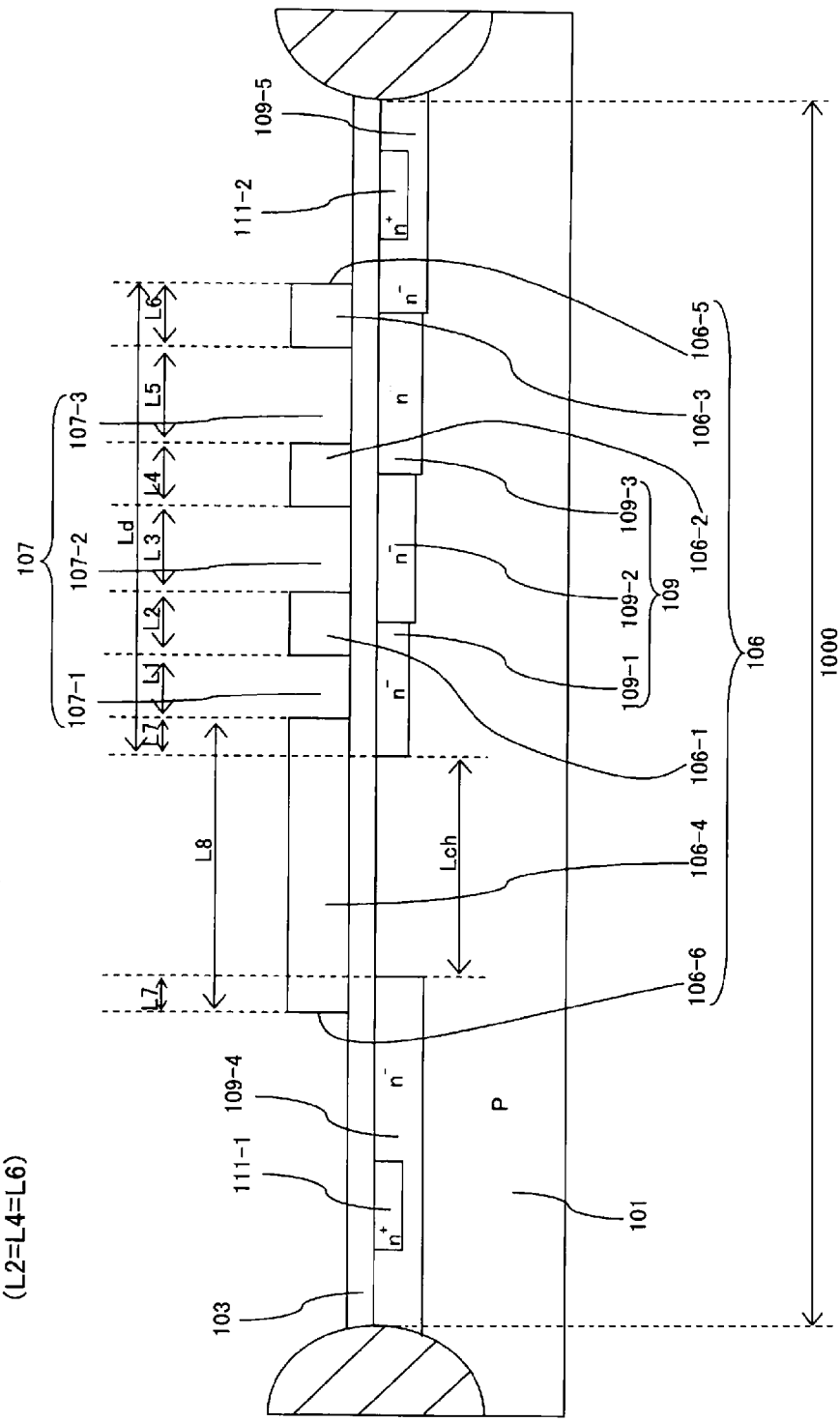
FIG. 15 is a partial vertical cross-section diagram showing the structure of a high voltage resistant MOS transistor in accordance with a second embodiment of the present invention.
Figure 16:
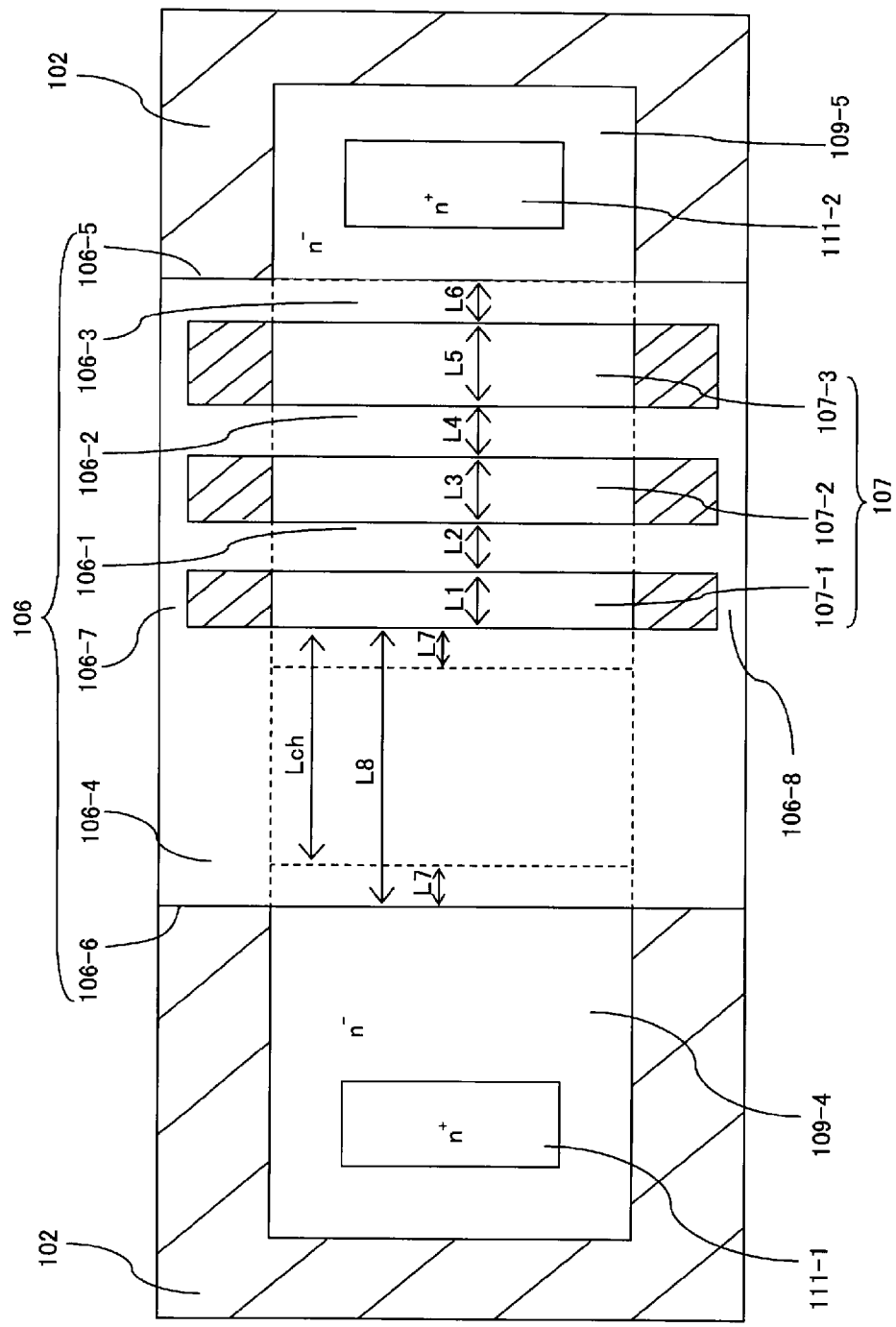
FIG. 16 is a partial plan view showing the structure of a high voltage resistant MOS transistor in accordance with the second embodiment of the present invention.

FIG. 15 is a partial vertical cross-section diagram of a high voltage resistant MOS transistor in accordance with a second embodiment of the present invention. Also, FIG. 16 is a partial plan view of the high voltage resistant MOS transistor shown in FIG. 15 in accordance with the second embodiment of the present invention.

The high voltage resistant MOS transistor in accordance with the second embodiment of the present invention has the following structure. The principal surface of a p-type semiconductor substrate 101 includes an element isolation region comprised of a field oxide film 102 and an active region 1000 defined by the field oxide film 102. A first lightly doped $N^-$ diffusion layer 109-1 and a fourth lightly doped $N^-$ diffusion layer 109-4, which are separated from each other through a channel region having a channel length Lch, are formed in the active region 1000 of the p-type semiconductor substrate 101. In other words, the channel region is defined between the first lightly doped $N^-$ diffusion layer 109-1 and the fourth lightly doped $N^-$ diffusion layer 109-4, and the channel length Lch is defined by the horizontal distance between the first lightly doped $N^-$ diffusion layer 109-1 and the fourth lightly doped $N^-$ diffusion layer 109-4.

The terms "a first horizontal direction" and "a second horizontal direction" are hereinafter used. The first horizontal direction means the direction that is parallel to a plane parallel to the principal surface of the p-type semiconductor substrate 101 and defines a gate length. On the other hand, the second horizontal direction means the direction that is parallel to the surface parallel to the principal surface of the p-type semiconductor substrate 101 and defines a gate width. Also, the first horizontal direction and the second horizontal direction are at right angles to each other. The first lightly doped $N^-$ diffusion layer 109-1 is formed on the drain side of the p-type semiconductor substrate 101, and the fourth lightly doped $N^-$ diffusion layer 109-4 is formed on the source side of the p-type semiconductor substrate 101.

A second lightly doped $N^-$ diffusion layer 109-2 is formed adjacent to the first lightly doped $N^-$ diffusion layer 109-1 and separated from the channel region through this first lightly doped $N^-$ diffusion layer 109-1. A third lightly doped $N^-$ diffusion layer 109-3 is formed adjacent to the second lightly doped $N^-$ diffusion layer 109-2 and separated from the channel region through the first lightly doped $N^-$ diffusion layer 109-1 and the second lightly doped $N^-$ diffusion layer 109-2. A fifth lightly doped $N^-$ diffusion layer 109-5 is formed adjacent to the third lightly doped $N^-$ diffusion layer 109-3 and separated from the channel region through the first lightly doped $N^-$ diffusion layer 109-1, the second lightly doped $N^-$ diffusion layer 109-2, and the third lightly doped $N^-$ diffusion layer 109-3.

The active region 1000 of the p-type semiconductor substrate 101 is defined by the element isolation region comprised of the field oxide film 102. Also, the first lightly doped $N^-$ diffusion layer 109-1, the second lightly doped $N^-$ diffusion layer 109-2, the third lightly doped $N^-$ diffusion layer 109-3, the fourth lightly doped $N^-$ diffusion layer 109-4, and the fifth lightly doped $N^-$ diffusion layer 109-5 are formed in the active region 1000. These lightly doped $N^-$ diffusion layers 109-1, 109-2, 109-3, 109-4, and 109-5 are abutted against the boundary between the active region 1000 and the element isolation region comprised of the field oxide film 102.

A first heavily doped $N^+$ diffusion layer 111-1 is selectively formed in the upper region of the fourth lightly doped $N^-$ diffusion layer 109-4. A second heavily doped $N^+$ diffusion layer 111-2 is selectively formed in the upper region of the fifth lightly doped $N^-$ diffusion layer 109-5.

A gate insulating film 103 is formed on the principal surface of the p-type semiconductor substrate 101. More specifically, the gate insulating film 103 is continuously formed on the channel region, the first lightly doped $N^-$ diffusion layer 109-1, the second lightly doped $N^-$ diffusion layer 109-2, the third lightly doped $N^-$ diffusion layer 109-3, the fourth lightly doped $N^-$ diffusion layer 109-4, and the fifth lightly doped $N^-$ diffusion layer 109-5, the first heavily doped $N^+$ diffusion layer 111-1, and the second heavily doped $N^+$ diffusion layer 111-2 of the p-type semiconductor substrate 101.

A gate electrode 106 is selectively formed on the gate insulating film 103. The gate electrode 106 is comprised of a polysilicon film and has a slit group 107. The gate electrode 106 is comprised of a first stripe shape portion 106-1, a second stripe shape portion 106-2, a third stripe shape portion 106-3, a sheet portion 106-4, a first edge 106-5, a second edge 106-6, a first side region 106-7, a second side region 106-8, and the slit group 107. The slit group 107 is comprised of a first slit 107-1, a second slit 107-2, and a third slit 107-3. These slits 107-1, 107-2, and 107-3 are separated from each other in the first horizontal direction and longitudinally formed along the second horizontal direction. The sheet portion 106-4 is formed above the channel region, more specifically, on the gate insulating film 103, and has a width L8 corresponding to an eighth dimension L8. The first stripe shape portion 106-1 is formed to be separated from the sheet portion 106-4 through the first slit 107-1 having a width L1 corresponding to a first dimension L1 in the first horizontal direction, and has a width L2 corresponding to a second dimension L2. The second stripe shape portion 106-2 is formed to be separated from the first stripe shape portion 106-1 through the second slit 107-2 having a width L3 corresponding to a third dimension L3 in the first horizontal direction, and has a width L4 corresponding to a fourth dimension L4. The third stripe shape portion 106-3 is formed to be separated from the second stripe shape portion 106-2 through the third slit 107-3 having a width L5 corresponding to a fifth dimension L5 in the first horizontal direction, and has a width L6 corresponding to a sixth dimension L6. The first side region 106-7 and the second side region 106-8 are separated from each other in the second horizontal direction, and longitudinally formed along the first horizontal direction. Each of the first slit 107-1, the second slit 107-2, and the third slit 107-3 is terminated in the first side region 106-7 and the second side region 106-8. In other words, the first stripe shape portion 106-1, the second stripe shape portion 106-2, the third stripe shape portion 106-3, and the sheet portion 106-4 are connected with each other through the first side region 106-7 and the second side region 106-8. That is to say, the gate electrode 106 includes an integrated structure comprised of the first stripe shape portion 106-1, the second stripe shape portion 106-2, the third stripe shape portion 106-3, the sheet portion 106-4, the first side region 106-7, the second side region 106-8, and the slit group 107.

The widths of the first stripe shape portion 106-1, the second stripe shape portion 106-2, the third stripe shape portion 106-3, and the sheet portion 106-4 of the gate electrode 106, and the widths of the first slit 107-1, the second slit 107-2, and the third slit 107-3 of the slit group 107 are defined as their dimensions in the first horizontal direction.

The first slit 107-1, the second slit 107-2, and the third slit 107-3 are continuously formed and reaches to the element isolation region across the boundary between the active region 1000 and the element isolation region comprised of the field oxide film 102. Both ends of the first slit 107-1, the second slit 107-2, and the third slit 107-3 are abutted against the first side region 106-7 and the second side region 106-8 of the gate electrode 106. Therefore, the first side region 106-7 and the second side region 106-8 of the gate electrode 106 are located on the element isolation region comprised of field oxide film 102.

In the first embodiment of the present invention, the widths of the first slit 107-1, the second slit 107-2, and the third slit 107-3 are different from each other. More specifically, the width L3 of the second slit 107-2 is larger than the width L1 of the first slit 107-1, and the width L5 is larger than the width L3 of the second slit 107-2 (i.e., L1<L3<L5). Also, the widths of the first stripe shape portion 106-1, the second stripe shape portion 106-2, and the third stripe shape portion 106-3 of the gate electrode 106 are the same (i.e., L2=L4=L6). Furthermore, it is possible to set the widths of the first stripe shape portion 106-1, the second stripe shape portion 106-2, and the third stripe shape portion 106-3 of the gate electrode 106 to be the same with the width L3 of the second slit 107-2 (i.e., L1<L2=L4=L6=L3<L5).

The center location of the first lightly doped $N^-$ diffusion layer 109-1 is self-aligned with that of the first slit 107-1 in the first horizontal direction. The center location of the second lightly doped $N^-$ diffusion layer 109-2 is self-aligned with that of the second slit 107-2 in the first horizontal direction. The center location of the third lightly doped $N^-$ diffusion layer 109-3 is self-aligned with that of the third slit 107-3 in the first horizontal direction.

Impurity ions are implanted into the p-type semiconductor substrate 101 through the slit group 107 of the gate electrode 106 by using the gate electrode 106 as a mask. Then, thermal diffusion is conducted with respect to the implanted impurities. Thus the first lightly doped $N^-$ diffusion layer 109-1, the second lightly doped $N^-$ diffusion layer 109-2, and the third lightly doped $N^-$ diffusion layer 109-3 are formed. The depth of the second lightly doped $N^-$ diffusion layer 109-2 is deeper than that of the first lightly doped $N^-$ diffusion layer 109-1. Also, the depth of the third lightly doped $N^-$ diffusion layer 109-3 is deeper than that of the second lightly doped $N^-$ diffusion layer 109-2. The width of the second lightly doped $N^-$ diffusion layer 109-2 is larger than that of the first lightly doped $N^-$ diffusion layer 109-1. Also, the width of the third lightly doped $N^-$ diffusion layer 109-3 is larger than that of the second lightly doped $N^-$ diffusion layer 109-2. Furthermore, the impurity concentration of the second lightly doped $N^-$ diffusion layer 109-2 is higher than that of the first lightly doped $N^-$ diffusion layer 109-1. Also, the impurity concentration of the third lightly doped $N^-$ diffusion layer 109-3 is higher than that of the second lightly doped $N^-$ diffusion layer 109-2.

The first lightly doped $N^-$ diffusion layer 109-1 and the second lightly doped $N^-$ diffusion layer 109-2 are required to be adjacently formed without any space. The second lightly doped $N^-$ diffusion layer 109-2 and the third lightly doped $N^-$ diffusion layer 109-3 are required to be adjacently formed without any space. The third lightly doped $N^-$ diffusion layer 109-3 and the fifth lightly doped $N^-$ diffusion layer 109-5 are required to be adjacently formed without any space. Furthermore, the first lightly doped $N^-$ diffusion layer 109-1, the second lightly doped $N^-$ diffusion layer 109-2, the third lightly doped $N^-$ diffusion layer 109-3, and the fifth lightly doped $N^-$ diffusion layer 109-5 are require to form an integrated lightly doped impurity diffusion region.

The depth of this integrated lightly doped impurity diffusion region gradually becomes shallower and the impurity concentration of it gradually becomes lower towards the channel region. If the impurity concentration of an electric field reduction region is decreased, it makes it easy to improve the high voltage resistant property of a MOS transistor. However, it also makes it difficult to improve the drive capability of a MOS transistor. On the other hand, when the impurity concentration of an electric field reduction region is increased, it makes it easy to improve the drive capability of a MOS transistor. However, it also makes it difficult to improve the high voltage resistant property of a MOS transistor. Especially, when the impurity concentration of a closer portion of an electric field reduction region from a channel region is decreased, it effectively works for improvement of the high voltage resistant property of a MOS transistor. On the other hand, when the impurity concentration of a more distant portion of an electric field reduction region from a channel region is increased, it effectively works for improvement of the drive capability of a MOS transistor. The impurity concentration of the electric field reduction region included in the above described integrated lightly doped impurity diffusion region is decreased towards the channel region and increased with distant from the channel region. Therefore, this electric field reduction region has an impurity concentration profile in the first horizontal direction, which is effective for improvements of the high voltage resistant property and the drive capability of a MOS transistor.

In order to form the above described integrated lightly doped impurity diffusion region, an impurity thermal diffusion distance L7 in the crosswise direction is required to be set to at least half of the width of the first stripe shape portion 106-1, the second stripe shape portion 106-2, or the third stripe shape portion 106-3 (i.e., L2/2=L4/2=L6/2). The following is the reason for this.

The lightly doped impurity implantation regions are selectively formed in the regions of the p-type semiconductor substrate 101 located below the first slit 107-1, the second slit 107-2, and the third slit 107-3 by conducting an ion implantation step by using the gate electrode 106 including the slit group 107 as a mask. In this phase, the positions of both edges of the lightly doped impurity implantation regions are self-aligned with the positions of both edge sidewalls of the first slit 107-1, the second slit 107-2, and the third slit 107-3 in the first horizontal direction. The adjacent lightly doped impurity implantation regions are separated from each other through the distances corresponding to the widths of the first stripe shape portion 106-1, the second stripe shape portion 106-2, and the third stripe shape portion 106-3 of the gate electrode 106 (i.e., L2=L4=L6) in the first horizontal direction, respectively. Then, a thermal diffusion step of impurities is conducted and thus those impurity diffusion regions are enlarged. This thermal diffusion step of impurities is continuously conducted at least until the adjacent impurity diffusion regions have contact with each other. As a result, the first lightly doped $N^-$ diffusion layer 109-1 and the second lightly doped $N^-$ diffusion layer 109-2 are adjacently formed without any space. Also, the second lightly doped $N^-$ diffusion layer 109-2 and the third lightly doped $N^-$ diffusion layer 109-3 are adjacently formed without any space. In addition, the third lightly doped $N^-$ diffusion layer 109-3 and the fifth lightly doped $N^-$ diffusion layer 109-5 are adjacently formed without any space. Furthermore, the integrated lightly doped impurity diffusion region is formed, which is formed by the integration of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5.

Also, the positions of both edges of the lightly doped impurity implantation regions are self-aligned with the positions of the edge sidewalls of first slit 107-1, the second slit 107-2, and the third slit 107-3 in the first horizontal direction in the above described phase in which the lightly doped impurity implantation regions are selectively formed in the regions of the p-type semiconductor substrate 101 located below the first slit 107-1, the second slit 107-2, and the third slit 107-3 by conducting an ion implantation step by using the gate electrode 106 including the slit group 107 as a mask. In addition, the above described thermal diffusion in the crosswise direction is symmetrical in the first horizontal direction. Therefore, the center location of the first lightly doped N⁻ diffusion layer 109-1 is self-aligned with the center location of the first slit 107-1. Also, the center location of the second lightly doped N⁻ diffusion layer 109-2 is self-aligned with the center location of the second slit 107-2. In addition, the center location of the third lightly doped N⁻ diffusion layer 109-3 is self-aligned with the center location of the third slit 107-3. Therefore, the above described integrated lightly doped impurity diffusion region is self-aligned with the slit group 107 in the first horizontal direction. That is to say, the above described integrated lightly doped impurity diffusion region is self-aligned with the gate electrode 106 including the slit group 107 in the first horizontal direction.

As shown in FIG. 15, the inner edge of the first lightly doped N⁻ diffusion layer 109-1 is overlapped with the sheet portion 106-4 of the gate electrode 106 by the distance corresponding to the distance L7 of the thermal diffusion of impurities in the horizontal direction. Also, the inner edge portion of the fourth lightly doped N⁻ diffusion layer 109-4 is overlapped with the sheet portion 106-4 of the gate electrode 106 by the distance corresponding to the distance L7 of the thermal diffusion of impurities in the horizontal direction. The channel length Lch is defined between the inner edge portion of the first lightly doped N⁻ diffusion layer 109-1 and the inner edge portion of the fourth lightly doped N⁻ diffusion layer 109-4. Therefore, the channel length Lch is equal to the value derived by subtracting twice of the distance L7 of the thermal diffusion of impurities in the horizontal direction from the width L8 of the sheet portion 106-4 (i.e., Lch=L8−2×L7).

The electric field produced by the gate potential is applied to the channel region, the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 by the sheet portion 106-4, the first stripe shape portion 106-1, the second stripe shape portion 106-2, and the third stripe shape portion 106-3 of the gate electrode 106. Because of this, the width of the gate electrode 106 (i.e., the dimension of the gate electrode 106 in the first horizontal direction) is defined by the distance between the first edge 106-5 (i.e., the drain side edge) of the third stripe shape portion 106-3 and the second edge 106-6 (i.e., the source side edge) of the sheet portion 106-4. In other words, the width of the gate electrode 106 corresponds to the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the width L8 of the sheet portion 106-4.

Portions of the above described integrated lightly doped impurity diffusion region are overlapped with the gate electrode 106, and these overlapped regions function as the electric field reduction regions. In the present invention, a region of the lightly doped impurity diffusion region that is overlapped with the gate electrode 106 is defined as the electric field reduction region. Because of this, the dimension of the electric field reduction region in the first horizontal direction corresponds to the gate overlap dimension. As described above, the integrated lightly doped impurity diffusion region is comprised of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5. Also, the gate electrode 106 includes the sheet portion 106-4, the first stripe shape portion 106-1, the second stripe shape portion 106-2, and the third stripe shape portion 106-3. Therefore, the overlap dimension Ld is defined by the distance between the inner side edge (i.e., the source side edge) of the first lightly doped N⁻ diffusion layer 109-1 and the first edge 106-5 of the gate electrode 106 in the first horizontal direction. Therefore, the overlap dimension Ld between the electric field reduction region and the gate electrode 106 is defined by the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the distance L7 of the thermal diffusion of impurities in the horizontal direction (i.e., Ld=L1+L2+L3+L4+L5+L6+L7).

The following is further explanation of the width L1 of the first slit 107-1, the width L3 of the second slit 107-2, the width L5 of the third slit 107-3, the width L2 of the first stripe shape portion 106-1, the width L4 of the second stripe shape portion 106-2, and the width L6 of the third stripe shape portion 106-3.

If the width of the slit is increased, the electric field applied to the above described electric field reduction region based on the gate potential and the electric field reduction effect are reduced. In addition, if the width of the slit is increased, the number of the slits and the number of the stripe shape portions that are needed to keep the necessary gate overlap amount are decreased, and impurities are easily implanted in the step of the ion implantation of impurities by using the gate electrode as a mask The maximum width of the slits is defined by the necessary minimum electric field that is applied to the above described electric field reduction region based on the gate potential and by the maximum width necessary for obtaining the minimum required electric field reduction effect.

If the width of the slit is decreased, the number of the slits and the number of the stripe shape portions of the gate electrode that are needed to keep the necessary gate overlap amount are increased, and impurities are prevented from being implanted in the step of ion implantation of impurities by using the gate electrode as a mask. This causes the concentration of the finished impurity diffusion layer to be decreased. In addition, if the width of the slit is decreased, the electric field that is applied to the above described electric field reduction region based on the gate potential and the electric field reduction effect are increased. Also, the minimum width of the slit is defined by the limit width for which patterning can be conducted.

If the width of the stripe shape portions of the gate electrode is increased, the necessary minimum distance of the diffusion of impurities in the crosswise direction is increased. In addition, if the width of the stripe shape portions of the gate electrode is increased, the number of the slits and the number of the stripe shape portions that are needed for obtaining the necessary overlap amount are decreased.

If the width of the stripe shape portions of the gate electrode is decreased, the number of the slits and the number of the stripe shape portions that are needed for obtaining the necessary overlap amount are increased. In addition, if the width of the stripe shape portions of the gate electrode is decreased, the necessary minimum diffusion distance of impurities in the crosswise direction is decreased.

Half of the width of the stripe shape portions of the gate electrode corresponds to the necessary minimum diffusion distance of impurities in the crosswise direction. Therefore, it is desirable to form the stripe shape portions of the gate electrode to have the same width with each other. If the widths of the stripe shape portions of the gate electrode are different from each other, the necessary minimum diffusion distance of impurities in the crosswise direction is half of the width of the widest stripe shape portion.

Therefore, it is desirable to define the widths of the slit and the stripe shape portion of the gate electrode in consideration of the above described relationships. In the second embodiment of the present invention, as a typical example, it is possible to set the width L2 of the first stripe shape portion 106-1, the width L3 of the second slit 107-2, the width L4 of the second stripe shape portion 106-2, and the width L6 of the third stripe shape portion 106-3 to be 0.3 µm, and set the L1 of the first slit 107-1 to 0.2 µm, and set the width L5 of the third slit 107-3 to 0.4 µm. In this case, the overlap dimension Ld is derived by the sum of "0.3 µm×4+0.2 µm+0.4 µm" and the distance L7 of the thermal diffusion of impurities in the horizontal direction. Also, the necessary minimum distance of the thermal diffusion of impurities in the horizontal direction is 0.15 (i.e., 0.3 µm/2=0.15 µm). If a step of the necessary minimum thermal diffusion of impurities is conducted, the finished overlap dimension Ld is 1.95 (i.e., 0.3 µm×4+0.2 µm+0.4 µm+0.3 µm/2=1.95 µm). In this case, the integrated lightly doped impurity diffusion region has a heterogeneous impurity concentration profile in the first horizontal direction. Also, the finished gate overlap dimension Ld is more than 1.95 µm (i.e., Ld>0.3 µm×4+0.2 µm+0.4 µm+0.3 µm/2=1.95 µm) if a step of the thermal diffusion of impurities is conducted until the thermal diffusions in the crosswise direction are overlapped with each other so that the integrated lightly doped impurity diffusion region has the homogeneous impurity concentration profile in the first horizontal direction.

For example, the gate overlap amount 2 µm may be needed in a 40 V voltage resistant MOS transistor. According to the gate overlap structure in accordance with the present invention, the gate overlap dimension Ld of more than 1.95 µm can be obtained by setting the above described widths of the three slits, the above described three stripe shape portions, and the distance L7 of the thermal diffusion in the horizontal direction to be 0.3 µm in arithmetic average, 0.3 µm, and half of the width of the above described three stripe shape portions or more, respectively. Therefore, the large gate overlap amount that is needed for a 40 V voltage resistant MOS transistor can be obtained. In the second embodiment of the present invention, three slits are formed, however, it is possible to arbitrarily change the number of the slits according to the demanded gate overlap dimension Ld. As described above, the maximum width of the slit is defined by the necessary minimum electric field applied to the above described electric field reduction region based on the gate potential and the maximum width that is needed for obtaining the necessary minimum electric field reduction effect. As an example, the maximum width of the slit can be set to 1.0 µm. The minimum width of the slit is defined by the limit width for which patterning can be conducted. Also, as an example, the minimum width of the slit can be set to 0.1 µm. If the gate overlap amount of approximately 2.0 µm, which is needed for a 40 V voltage resistant MOS transistor, is required to be obtained in forming a single slit, the width of this single slit needs to be set to more than 1.55 µm. However, if the extremely wide single slit as just stated is formed, it is impossible to obtain the necessary minimum electric field applied to the above described electric field reduction region and the necessary minimum electric field reduction effect. Therefore, at least a plurality of slits need to be formed in order to obtain the large gate overlap amount that is required for a high voltage resistant MOS transistor.

Method for Manufacturing the High Voltage Resistant MOS Transistor

With reference to the accompanying drawings, a method for manufacturing the high voltage resistant MOS transistor in accordance with the second embodiment of the present invention is hereinafter explained.

FIGS. 17 to 27 are partial vertical cross-section diagrams showing a manufacturing process of the high voltage resistant MOS transistor in accordance with the second embodiment of the present invention.

Figure 17:
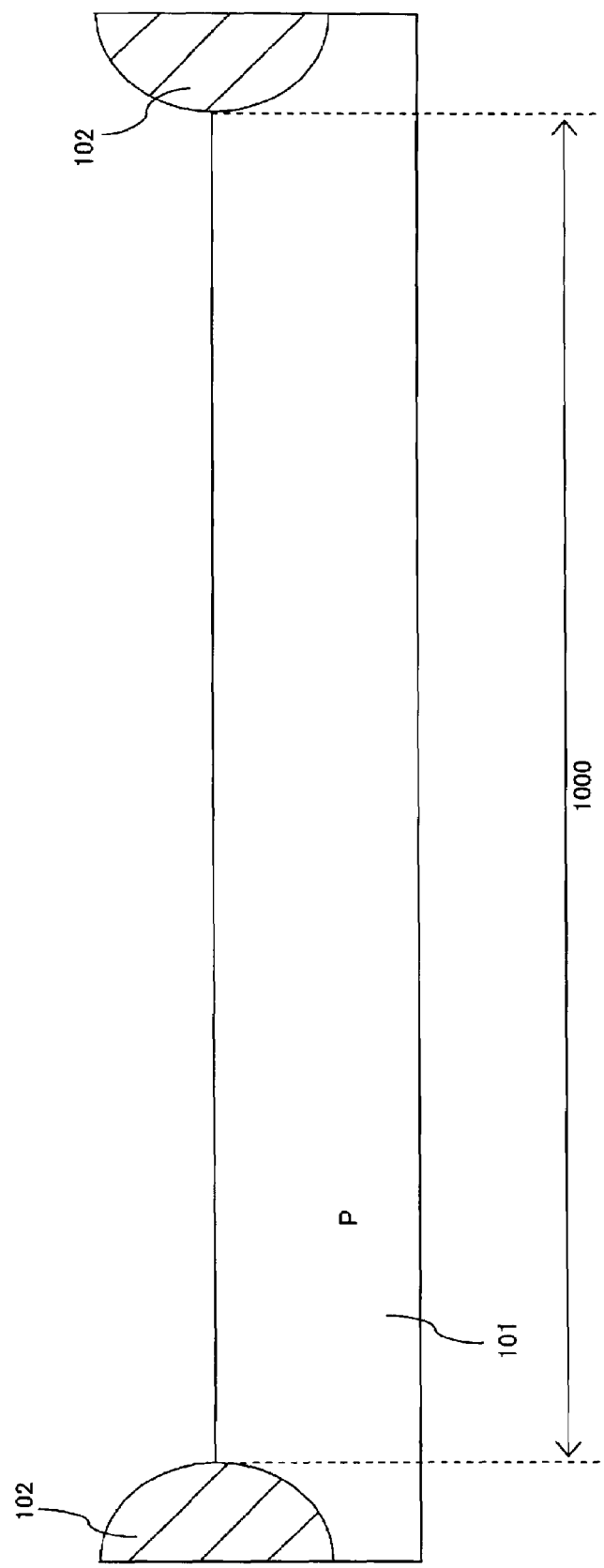
FIG. 17 is a partial vertical cross-section diagram showing a step of a method for manufacturing a high voltage resistant MOS transistor in accordance with the second embodiment of the present invention.

As shown in FIG. 17, a field oxide film 102 is formed in an element isolation region of a p-type semiconductor substrate 101 with a local oxidation of silicon (LOCOS) method. Thus an active region 1000 is defined by the field oxide film 102. The active region 1000 is a region in which a high voltage resistant MOS transistor is formed.

Figure 18:
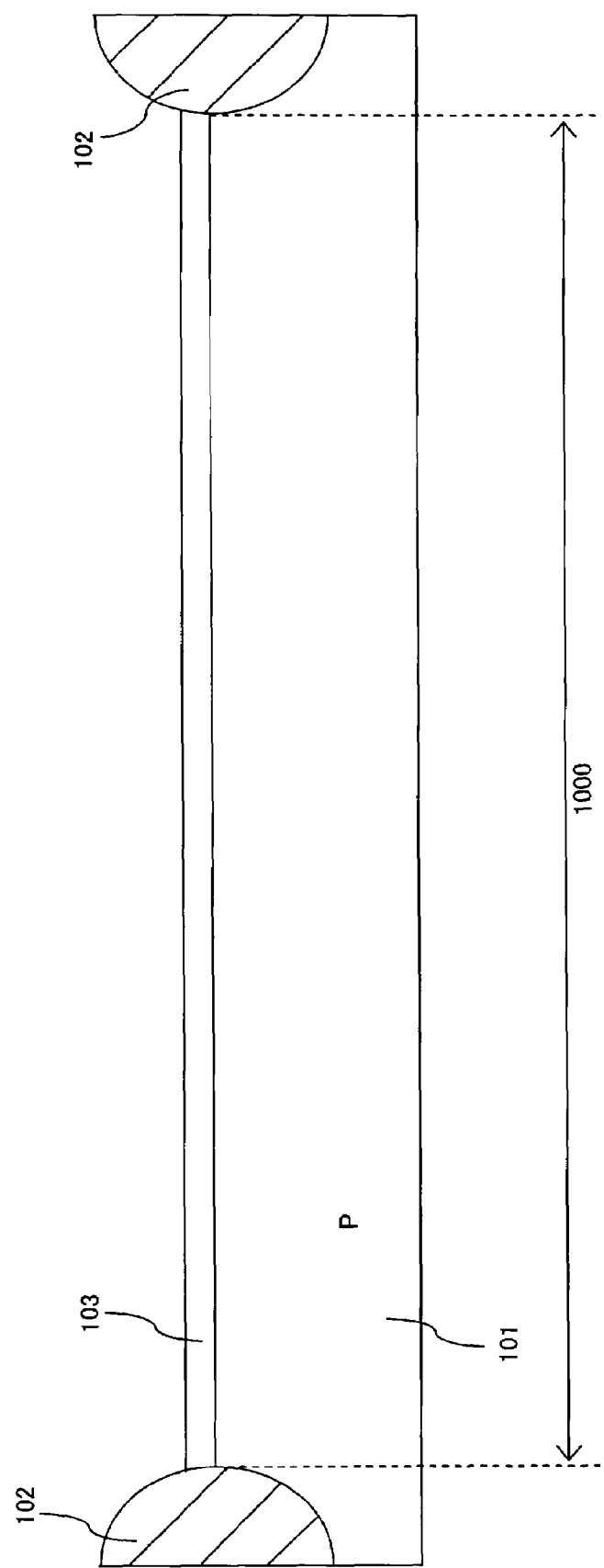
FIG. 18 is a partial vertical cross-section diagram showing a step of a method for manufacturing a high voltage resistant MOS transistor in accordance with the second embodiment of the present invention.

As shown in FIG. 18, a silicon dioxide film 103 of 100 Å in thickness is formed on the p-type semiconductor substrate 101 and the field oxide film 102 with a heretofore known method. Thermal oxidization methods and various types of chemical vapor deposition (CVD) methods can be used as a typical example of the heretofore known methods.

Figure 19:
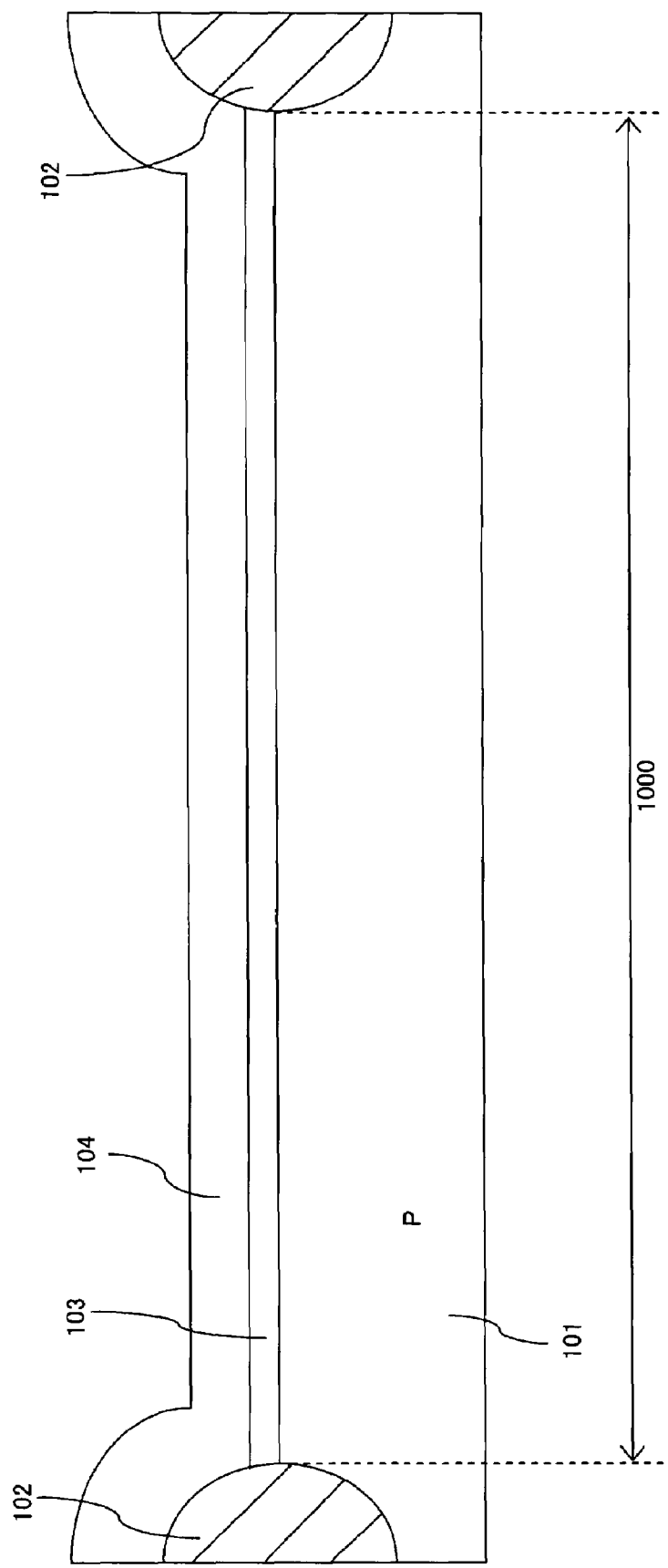
FIG. 19 is a partial vertical cross-section diagram showing a step of a method for manufacturing a high voltage resistant MOS transistor in accordance with the second embodiment of the present invention.
Figure 20:
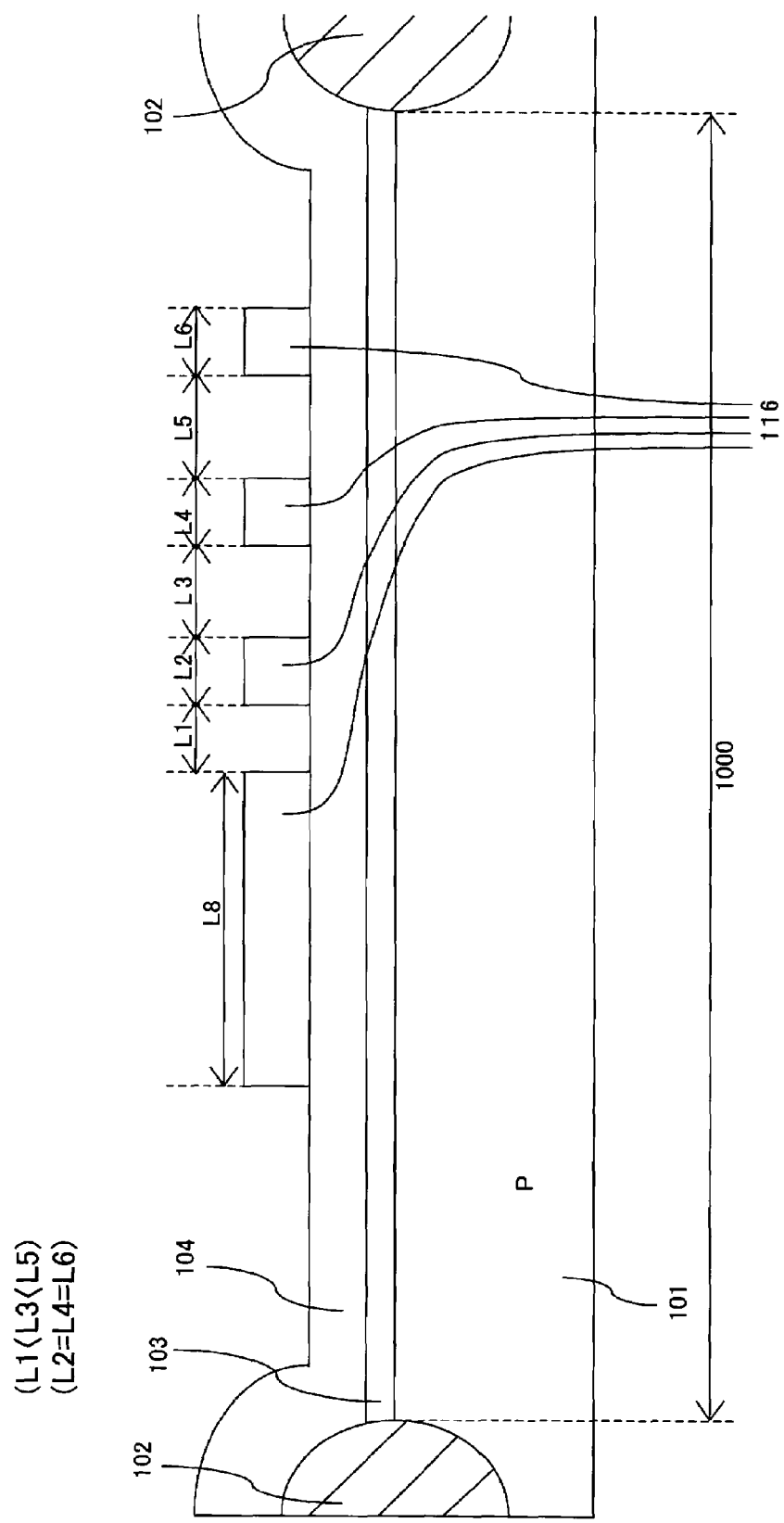
FIG. 20 is a partial vertical cross-section diagram showing a step of a method for manufacturing a high voltage resistant MOS transistor in accordance with the second embodiment of the present invention.

As shown in FIG. 19, a polysilicon film 104 is formed on the silicon dioxide film 103 with a heretofore known CVD method. As shown in FIG. 20, a resist pattern 116 is formed on the polysilicon film 104 with a heretofore known lithography technique. The resist pattern 116 includes three slit shape openings with different widths. More specifically, the resist pattern 116 is comprised of a sheet portion, three stripe shape portions with same widths, and three slits with different widths. Widths of the three slits are L1, L3, and L5, respectively, and widths of the three stripe shape portions are L2, L4, and L6, respectively. Here, the widths of the three slits and the three stripe shape portions have the following relation: L1<L2=L4=L6=L3<L5. Also, width of the sheet portion is L8.

Figure 21:
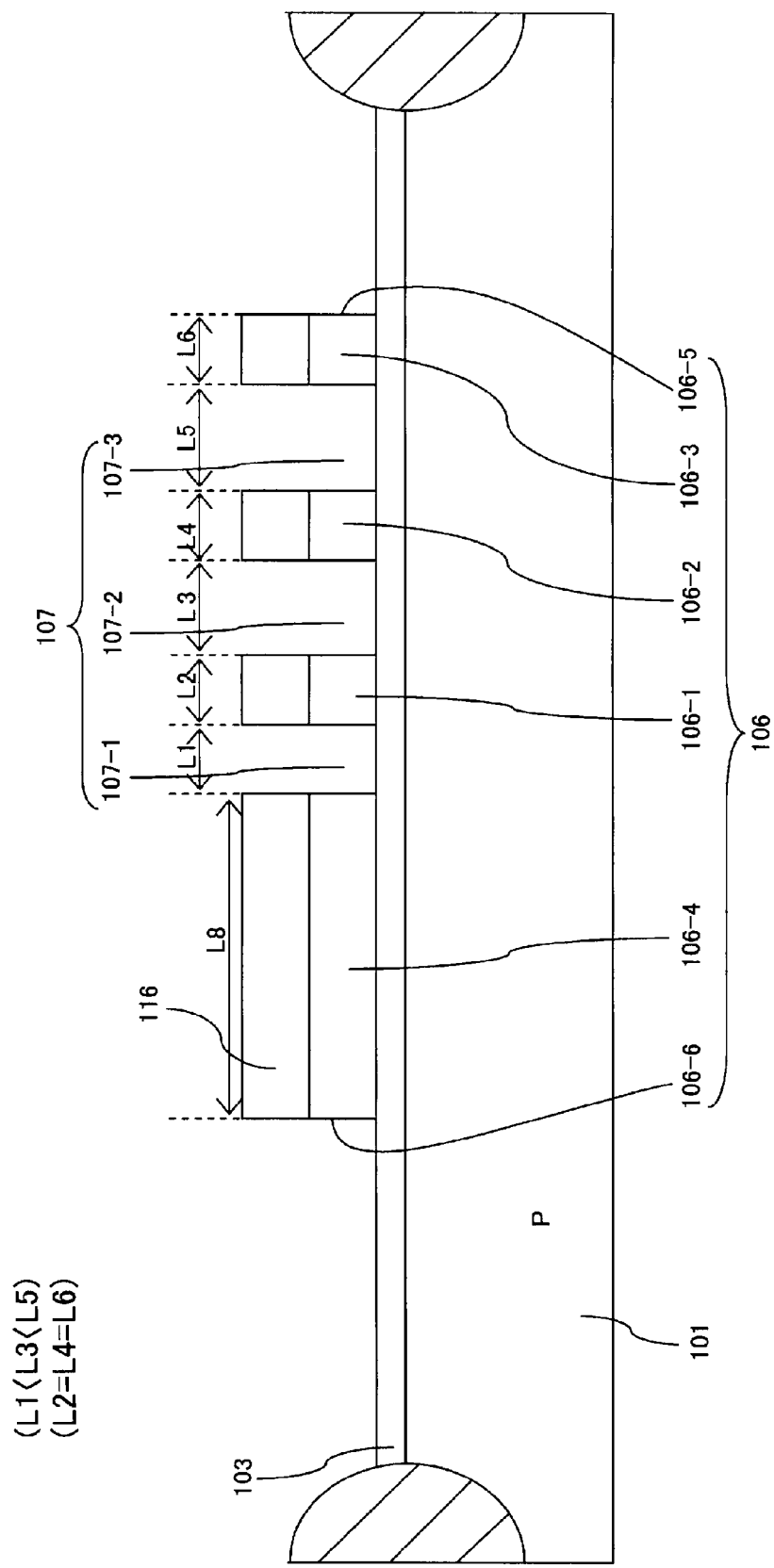
FIG. 21 is a partial vertical cross-section diagram showing a step of a method for manufacturing a high voltage resistant MOS transistor in accordance with the second embodiment of the present invention.

As shown in FIG. 21, the polysilicon film 104 is selectively etched by using the resist pattern 116 as a mask, and thus a gate electrode 106 is formed. As shown in FIGS. 16 and 17, the gate electrode 106 includes a first stripe shape portion 106-1, a second stripe shape portion 106-2, a third stripe shape portion 106-3, a sheet portion 106-4, a first edge 106-5, a second edge 106-6, a first side region 106-7, a second side region 106-8, and a slit group 107. The slit group 107 is comprised of a first slit 107-1, a second slit 107-2, and a third slit 107-3. Also, these slits 107-1, 107-2, and 107-3 are separated from each other in the first horizontal direction, and longitudinally formed in the second horizontal direction. The sheet portion 106-4 is two-dimensionally formed on the gate insulating film 103 above a channel region and has the width L8 corresponding to the eighth dimension L8.

The first stripe shape portion 106-1 has the width L2 corresponding to the second dimension L2 and separated from the sheet portion 106-4 through the first slit 107-1 with the width L1 corresponding to the first dimension L1 in the first horizontal direction. The second stripe shape portion 106-2 has the width L4 corresponding to the fourth dimension L4 and separated from the first stripe shape portion 106-1 through the second slit 107-2 with the width L3 corresponding to the third dimension L3 in the first horizontal direction. The third stripe shape portion 106-3 has the width L6 corresponding to the sixth dimension L6 and separated from the second stripe shape portion 106-2 through the third slit 107-3 with the width L5 corresponding to the fifth dimension L5 in the first horizontal direction. The first side region 106-7 and the second side region 106-8 are separated from each other in the second horizontal direction and longitudinally formed along the first horizontal direction. Both ends of the first slit 107-1, the second slit 107-2, and the third slit 107-3 are abutted against the first side region 106-7 and the second side region 106-8, respectively. In other words, the first stripe shape portion 106-1, the second stripe shape portion 106-2, the third stripe shape portion 106-3, and the sheet portion 106-4 are connected with each other through the first side region 106-7 and the second side region 106-8. That is to say, the gate electrode 106 includes the slit group 107 and an integrated structure comprised of the first stripe shape portion 106-1, the second stripe shape portion 106-2, the third stripe shape portion 106-3, the sheet portion 106-4, the first side region 106-7, and the second side region 106-8.

The first slit 107-1, the second slit 107-2, and the third slit 107-3 are formed to reach to the element isolation region across the boundary between the active region 1000 and the element isolation region comprised of the fixed oxide film 102. Each of the first slit 107-1, the second slit 107-2, and the third slit 107-3 are terminated on both sides of the first side region 106-7 and the second side region 106-8 of the gate electrode 106. Therefore, the first side region 106-7 and the second side region 106-8 of the gate electrode 106 are formed on the element isolation region comprised of the field oxide film 102.

Widths of the first slit 107-1, the second slit 107-2, and the third slit 107-3 are different from each other. Specifically, the width L3 of the second slit 107-2 is larger than the width L1 of the first slit 107-1, and the width L5 of the third slit 107-3 is larger than the width L3 of the second slit 107-2 (i.e., L1<L3<L5). Also, widths of the first stripe shape portion 106-1, the second stripe shape portion 106-2, and the third stripe shape portion 106-3 of the gate electrode 106 are the same (i.e., L2=L4=L6). In addition, the width L3 of the second slit 107-2 and widths of the first stripe shape portion 106-1, the second stripe shape portion 106-2, and the third stripe shape portion 106-3 of the gate electrode 106 (i.e., L2=L4=L6) can be set to the same. In this case, the following relation is realized: L1<L2=L4=L6=L3<L5. Furthermore, the distance between the first edge 106-5 and the second edge 106-6 of the gate electrode 106, that is, the dimension of the gate electrode 106 in the first horizontal direction, is derived by the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the width L8 of the sheet portion 106-4 (i.e., L1+L2+L3+L4+L5+L6+L8). In the second embodiment of the present invention, the arithmetic average of widths of the first slit 107-1, the second slit 107-2, and the third slit 107-3 is set to 0.3 µm and widths of the first stripe shape portion 106-1, the second stripe shape portion 106-2, and the third stripe shape portion 106-3 of the gate electrode 106 are all set to the identical value 0.3 µm (i.e., L2=L4=L6=0.3 µm).

Figure 22:
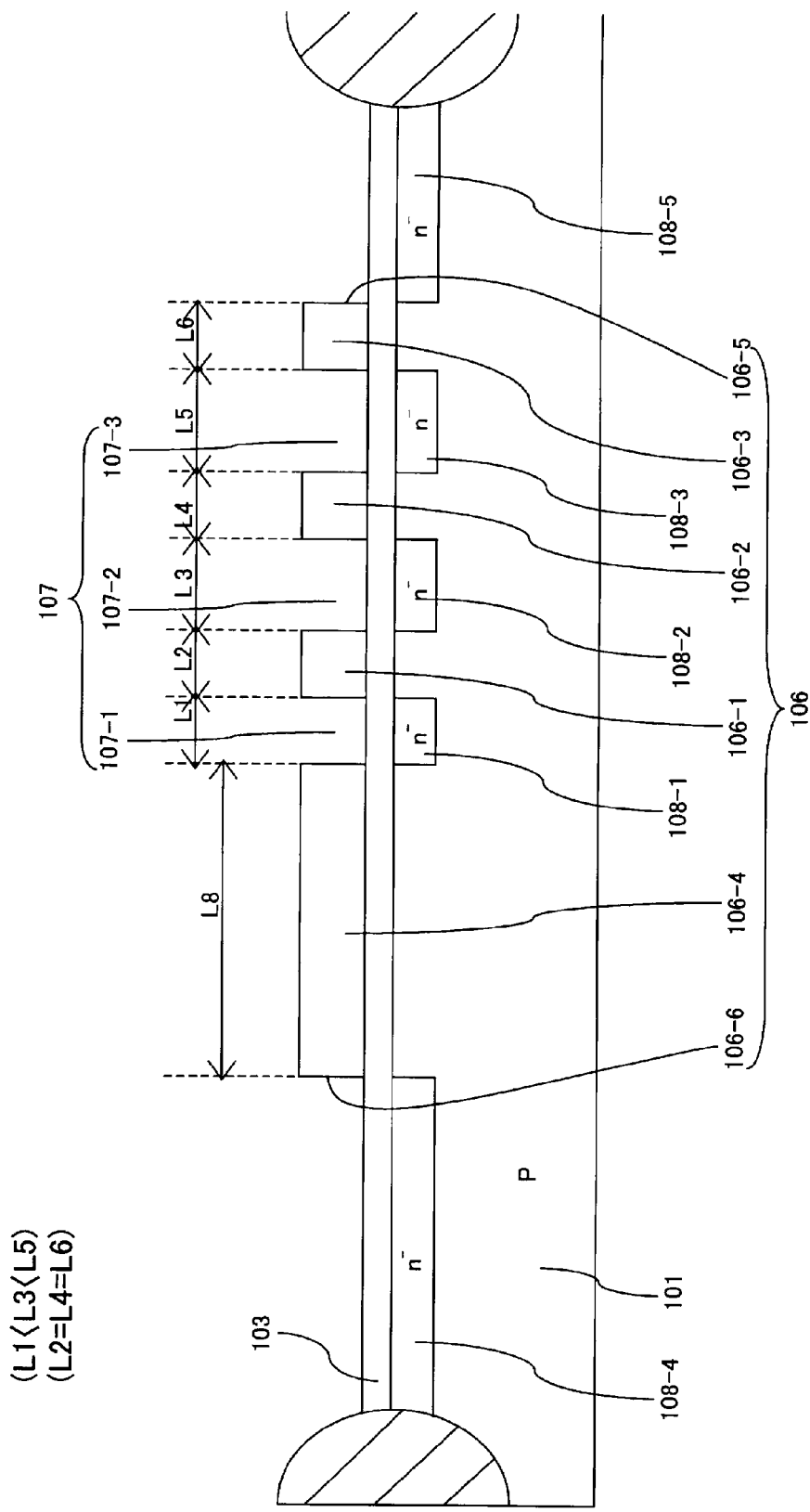
FIG. 22 is a partial vertical cross-section diagram showing a step of a method for manufacturing a high voltage resistant MOS transistor in accordance with the second embodiment of the present invention.

As shown in FIG. 22, the resist pattern 116 is eliminated with a heretofore known method. Then, with a heretofore known ion implantation technique, the n-type impurity phosphorus (P) is selectively implanted into the principal surface of the p-type semiconductor substrate 101 through the gate insulating film 103 in the vertical direction by using the gate electrode 106 as a mask with an acceleration energy of 150 keV and the dose amount of $6.0 \times 10^{12}$ cm$^{-2}$. As a result, a first lightly doped N$^-$ implantation region 108-1 is selectively formed in the upper region of the p-type semiconductor substrate 101 located below the first slit 107-1 of the gate electrode 106. A second lightly doped N$^-$ implantation region 108-2 is selectively formed in the upper region of the p-type semiconductor substrate 101 located below the second slit 107-2 of the gate electrode 106. A third lightly doped N$^-$ implantation region 108-3 is selectively formed in the upper region of the p-type semiconductor substrate 101 located below the third slit 107-3 of the gate electrode 106. A fourth lightly doped N$^-$ implantation region 108-4 is selectively formed in the upper region of the p-type semiconductor substrate 101 located below the outer side of the second edge 106-6 of the gate electrode 106. A fifth lightly doped N$^-$ implantation region 108-5 is selectively formed in the upper region of the p-type semiconductor substrate 101 located below the outer side of the first edge 106-5 of the gate electrode 106.

That is, the first lightly doped N$^-$ implantation region 108-1 is formed to be self-aligned with the first slit 107-1 of the gate electrode 106. Here, the positions of both edges of the first lightly doped N$^-$ implantation region 108-1 correspond to the positions of both sidewalls of the first slit 107-1 in the first horizontal direction. The second lightly doped N$^-$ implantation region 108-2 is formed to be self-aligned with the second slit 107-2 of the gate electrode 106. Here, the positions of both edges of the second lightly doped N$^-$ implantation region 108-2 correspond to the positions of both sidewalls of the second slit 107-2 in the first horizontal direction. The third lightly doped N$^-$ implantation region 108-3 is formed to be self-aligned with the third slit 107-3 of the gate electrode 106. Here, the positions of both edges of the third lightly doped N$^-$ implantation region 108-3 correspond to the positions of both sidewalls of the third slit 107-3 in the first horizontal direction. The fourth first lightly doped N$^-$ implantation region 108-4 is formed to be self-aligned with the second edge 106-6 of the gate electrode 106. The fifth first lightly doped N$^-$ implantation region 108-5 is formed to be self-aligned with the first edge 106-5 of the gate electrode 106. Therefore, the width of the first lightly doped N$^-$ implantation region 108-1 is defined by the width L1 of the first slit 107-1. Also, the width of the second lightly doped N$^-$ implantation region 108-2 is defined by the width L3 of the second slit 107-2. In addition, the width of the third lightly doped N$^-$ implantation region 108-3 is defined by the width L5 of the third slit 107-3.

Each of the first slit 107-1, the second slit 107-2, and the third slit 107-3 functions as a window of ion implantation. The aspect ratios of those slits are defined by the ratio of its depth with respect to its width. The depth of the slit corresponds to the thickness of the film comprising the gate electrode 106. When the aspect ratio of the slits is increased, that makes it difficult for impurity ions to be implanted. When the width of the slits is decreased, that prevents impurity ions from being implanted. This is because the depth of the slits is constant. Therefore, the impurity concentration of the first lightly doped N$^-$ implantation region 108-1 is lower than that of the second lightly doped N$^-$ implantation region 108-2. Also, the impurity concentration of the second lightly doped N⁻ implantation region 108-2 is lower than that of the third lightly doped N⁻ implantation region 108-3.

Figure 23:
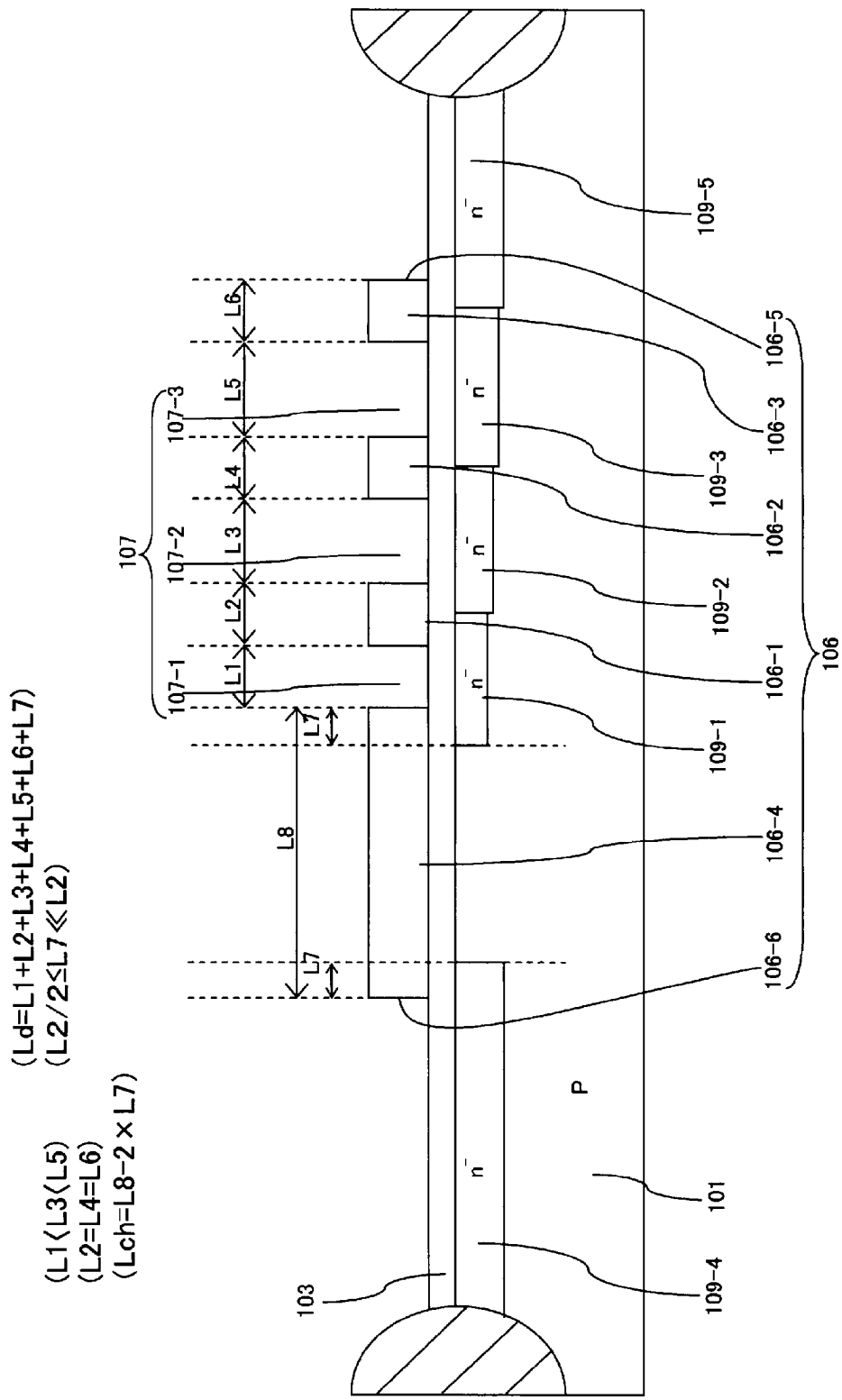
FIG. 23 is a partial vertical cross-section diagram showing a step of a method for manufacturing a high voltage resistant MOS transistor in accordance with the second embodiment of the present invention.
Figure 42A:
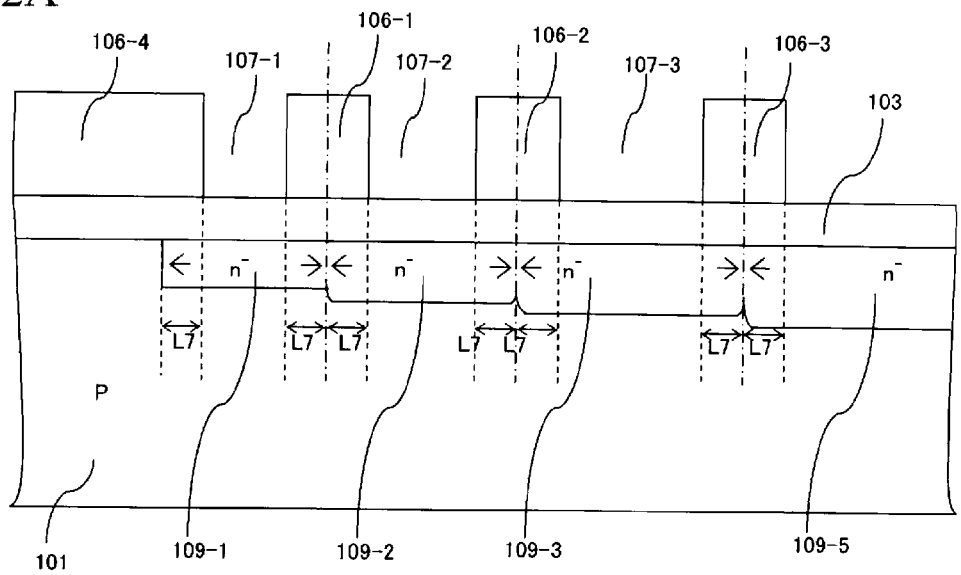
FIGS. 42A and 42B are partial vertical cross-section diagrams showing a relationship between a distance of thermal diffusion of impurities along the first horizontal direction and a width of a stripe shape portion of a gate electrode in a step of a method for manufacturing a high voltage resistant MOS transistor in accordance with the second embodiment of the present invention.
Figure 42B:
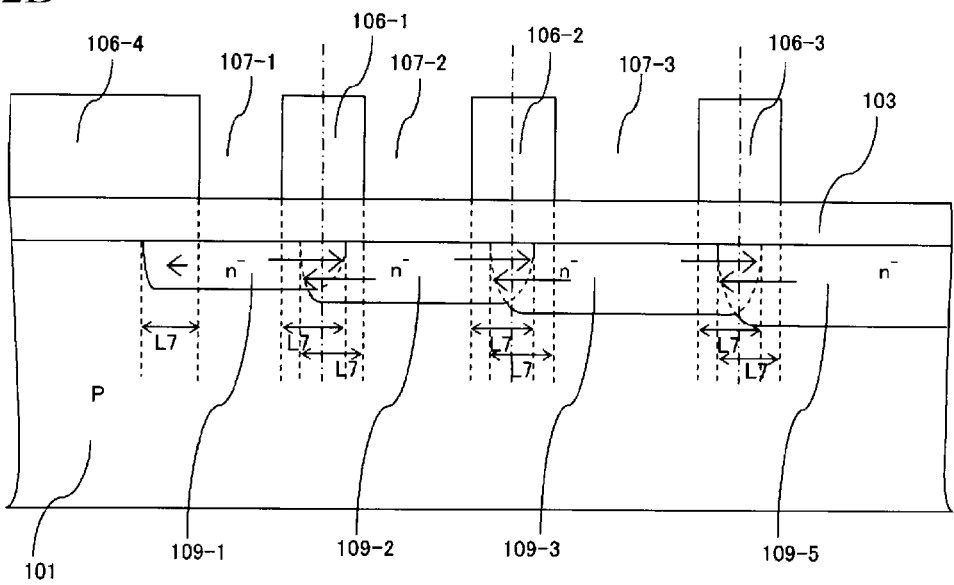

As shown in FIGS. 23, 42A and 42B, the above described ion implanted impurities are activated and thermally diffused by a thermal treatment in the N₂ atmosphere at 1000 degrees Celsius for approximately 100 minutes with a heretofore known thermal diffusion technique. The thermal diffusion of impurities is isotropic. Therefore, impurities are diffused in the depth direction and the horizontal direction (i.e., the crosswise direction). As a result, the first lightly doped N⁻ implantation region 108-1, the second lightly doped N⁻ implantation region 108-2, the third lightly doped N⁻ implantation region 108-3, the fourth lightly doped N⁻ implantation region 108-4, and the fifth lightly doped N⁻ implantation region 108-5 are turned into a first lightly doped N⁻ diffusion layer 109-1, a second lightly doped N⁻ diffusion layer 109-2, a third lightly doped N⁻ diffusion layer 109-3, a fourth lightly doped N⁻ diffusion layer 109-4, and a fifth lightly doped N⁻ diffusion layer 109-5, respectively. As shown in FIG. 22, the first lightly doped N⁻ implantation region 108-1 is self-aligned with the first slit 107-1 of the gate electrode 106, and the thermal diffusion of impurities is isotropic. Therefore, the center location of the first lightly doped N⁻ diffusion layer 109-1 is self-aligned with the center location of the first slit 107-1 in the first horizontal direction. Also, the second lightly doped N⁻ implantation region 108-2 is self-aligned with the second slit 107-2 of the gate electrode 106, and the thermal diffusion of impurities is isotropic. Therefore, the central location of the second lightly doped N⁻ diffusion layer 109-2 is self-aligned with the central location of the second slit 107-2 in the first horizontal direction. In addition, the third lightly doped N⁻ implantation region 108-3 is self-aligned with the third slit 107-3 of the gate electrode 106 and the thermal diffusion of impurities is isotropic. Therefore, the central location of the third lightly doped N⁻ diffusion layer 109-3 is self-aligned with the central location of the third slit 107-3 in the first horizontal direction.

Also, the width L1 of the first slit 107-1, the width L3 of the second slit 107-2, and the width L5 of the third slit 107-3 are different from each other. Therefore, the depth of the second lightly doped N⁻ diffusion layer 109-2 is deeper than that of the first lightly doped N⁻ diffusion layer 109-1. Also, the depth of the third lightly doped N⁻ diffusion layer 109-3 is deeper than that of the second lightly doped N⁻ diffusion layer 109-2. In addition, the width of the second lightly doped N⁻ diffusion layer 109-2 is larger than that of the first lightly doped N⁻ diffusion layer 109-1. Also, the width of the third lightly doped N⁻ diffusion layer 109-3 is larger than that of the second lightly doped N⁻ diffusion layer 109-2. Furthermore, the impurity concentration of the second lightly doped N⁻ diffusion layer 109-2 is higher than that of the first lightly doped N⁻ diffusion layer 109-1. Also, the impurity concentration of the third lightly doped N⁻ diffusion layer 109-3 is higher than that of the second lightly doped N⁻ diffusion layer 109-2.

The first lightly doped N⁻ diffusion layer 109-1 and the second lightly doped N⁻ diffusion layer 109-2 are required to be adjacently formed without any space. The second lightly doped N⁻ diffusion layer 109-2 and the third lightly doped N⁻ diffusion layer 109-3 are required to be adjacently formed without any space. The third lightly doped N⁻ diffusion layer 109-3 and the fifth lightly doped N⁻ diffusion layer 109-5 are adjacently formed without any space. Furthermore, the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 are required to form an integrated lightly doped impurity diffusion region.

The depth of this integrated lightly doped impurity diffusion region gradually becomes shallower towards the channel region and the impurity concentration of it gradually becomes lower towards the channel region. When the impurity concentration of the electric field reduction region is reduced, that makes it easy for the voltage resistant property of a MOS transistor to be improved. However, that makes it difficult for the drive capability of a MOS transistor to be improved. On the other hand, when the impurity concentration of the electric field reduction region is increased, that makes it easy for the drive capability of a MOS transistor to be improved. However, that makes it difficult for the voltage resistant property of a MOS transistor to be improved. Especially, when the impurity concentration of a closer portion of the electric field reduction region from the channel region is reduced, it effectively works for improvement of the voltage resistant property of a MOS transistor. On the other hand, when the impurity concentration of a more distant portion of the electric field reduction region from the channel region is increased, it effectively works for improvement of the drive capability of a MOS transistor. The impurity concentration of the electric field reduction region included in the above described integrated lightly doped impurity diffusion region is decreased towards the channel region and increased with distant from the channel region. Therefore, this electric field reduction region has an impurity concentration profile in the first horizontal direction, which is effective for improvements of the voltage resistant property and the drive capability of a MOS transistor.

In order to form the above described integrated lightly doped impurity diffusion region, the distance L7 of the thermal diffusion of impurities in the crosswise direction needs to be set to at least half of the widths of the first stripe shape portion 106-1, the second stripe shape portion 106-2, and the third stripe shape portion 106-3 of the gate electrode 106 (i.e., L2/2=L4/2=L6/2=0.3 μm/2=0.15 μm). Also, as described above, the lightly doped impurity implantation regions are selectively formed in the region of the p-type semiconductor substrate 101 located below the first slit 107-1, the second slit 107-2, and the third slit 107-3 by conducting an ion implantation step by using the gate electrode 106 having the slit group 107 as a mask. In this phase, the positions of both edges of the lightly doped impurity implantation regions are self-aligned with the positions of both ends of the first slit 107-1, the second slit 107-2, and the third slit 107-3. Also, the adjacent lightly doped impurity implantation regions are separated from each other by the distance corresponding to the widths of the first stripe shape portion 106-1, the second stripe shape portion 106-2, and the third stripe shape portion 106-3 of the gate electrode 106 (i.e., L2=L4=L6=0.3 μm) in the first horizontal direction. Then, the impurity implantation regions are expanded by conducting a thermal diffusion step of impurities. This thermal diffusion step of impurities is continuously conducted until the adjacent impurity diffusion regions at least have contact with each other. As a result, the first lightly doped N⁻ diffusion layer 109-1 and the second lightly doped N⁻ diffusion layer 109-2 are adjacently formed without any space. Also, the second lightly doped N⁻ diffusion layer 109-2 and the third lightly doped N⁻ diffusion layer 109-3 are adjacently formed without any space. In addition, the third lightly doped N⁻ diffusion layer 109-3 and the fifth lightly doped N⁻ diffusion layer 109-5 are adjacently formed without any space. Furthermore, the integrated lightly doped impurity diffusion region is formed, which is comprised of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5.

FIGS. 42A and 42B are partial vertical cross-section diagrams showing the relationship between the distance of the thermal diffusion of impurities and the width of the stripe shape portion of the gate electrode in the first horizontal direction. As shown in FIG. 42A, when a thermal diffusion step of impurities is stopped at the time when the distance L7 of the thermal diffusion of impurities in the first horizontal direction reaches half of the widths of the first stripe shape portion 106-1, the second stripe shape portion 106-2, and the third stripe shape portion 106-3 of the gate electrode 106 (i.e., L2/2=L4/2=L6/2=0.30 μm/2=0.15 μm), the diffusion fronts of impurities in the crosswise direction reach the positions corresponding to the central locations of the first stripe shape portion 106-1, the second stripe shape portion 106-2, and the third stripe shape portion 106-3 of the gate electrode 106, respectively, in the first horizontal direction. In other words, the diffusion fronts of impurities from the adjacent lightly doped impurity implantation regions in the crosswise direction have contact with each other. This means that the impurity with the longest distance of the thermal diffusion in the crosswise direction reaches the position corresponding to the central locations of the first stripe shape portion 106-1, the second stripe shape portion 106-2, and the third stripe shape portion 106-3 of the gate electrode 106, respectively, in the first horizontal direction. In this case, the impurity concentrations in the positions corresponding to the central locations of the first stripe shape portion 106-1, the second stripe shape portion 106-2, and the third stripe shape portion 106-3 of the gate electrode 106 are lower than those in the positions corresponding to the central locations of the first slit 107-1, the second slit 107-2, and the third slit 107-3, respectively. In other words, the integrated lightly doped impurity diffusion region, which is comprised of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5, has a heterogeneous impurity concentration profile in the first horizontal direction.

On the other hand, as shown in FIG. 42B, when the distance L7 of the thermal diffusion of impurities are set to larger than half of the widths of the first stripe shape portion 106-1, the second stripe shape portion 106-2, and the third stripe shape portion 106-3 of the gate electrode 106 (L2/2=L4/2=L6/2=0.3 μm/2=0.15 μm), the diffusion fronts of impurities from the adjacent lightly doped impurity implantation regions in the crosswise direction are mutually intersected. In other words, the diffusion fronts of impurities in the crosswise direction cross the positions corresponding to the central locations of the first stripe shape portion 106-1, the second stripe shape portion 106-2, and the third stripe shape portion 106-3 of the gate electrode 106, respectively, in the first horizontal direction, and the mutually overlapped thermal diffused regions in the crosswise direction are formed in the first stripe shape portion 106-1, the second stripe shape portion 106-2, and the third stripe shape portion 106-3 of the gate electrode 106. This means that the impurity with the longest distance of the thermal diffusion in the crosswise direction crosses the position corresponding to the central location of the first stripe shape portion 106-1, the second stripe shape portion 106-2, and the third stripe shape portion 106-3 of the gate electrode 106, respectively, in the first horizontal direction. The mutually overlapped thermal diffusions in the crosswise direction reduce the difference between the impurity concentrations in the positions corresponding to the central locations of the first stripe shape portion 106-1, the second stripe shape portion 106-2, and the third stripe shape portion 106-3 of the gate electrode 106 and the impurity concentrations in the positions corresponding to the central locations of the first slit 107-1, the second slit 107-2, and the third slit 107-3, respectively. That is to say, the thermal diffusion step is continuously conducted until the thermal diffusions in the crosswise direction are mutually overlapped, and thus the above described integrated lightly doped impurity diffusion region has a more homogeneous impurity concentration profile. Therefore, in order to obtain a more homogeneous impurity concentration profile, it is desirable to continue the thermal diffusion step until the distance L7 of the thermal diffusion of impurities in the horizontal direction exceeds half of the widths of the first stripe shape portion 106-1, the second stripe shape portion 106-2, and the third stripe shape portion 106-3 of the gate electrode 106 (i.e., L2/2=L4/2=L6/2=0.3 μm/2=0.15 μm) and the thermal diffusions in the crosswise direction are mutually overlapped. As a matter of convenience, FIG. 23 shows that the boundaries between adjacent layers of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 are formed in the central locations of the regions in which the thermal diffusions in the crosswise direction are mutually overlapped.

As shown in FIG. 23, the inner side edge of the first lightly doped N⁻ diffusion layer 109-1 is overlapped with the sheet portion 106-4 of the gate electrode 106 by the dimension corresponding to the distance L7 of the thermal diffusion of impurities in the horizontal direction. In the same way, the inner side edge of the fourth lightly doped N⁻ diffusion layer 109-4 is overlapped with the sheet portion 106-4 of the gate electrode 106 by the dimension corresponding to the distance L7 of the thermal diffusion of impurities in the horizontal direction. The channel length Lch is defined between the inner side edge of the first lightly doped N⁻ diffusion layer 109-1 and the inner side edge of the fourth lightly doped N⁻ diffusion layer 109-4. Therefore, the channel length Lch is equal to the value derived by subtracting twice of the distance L7 of the thermal diffusion of impurities in the horizontal direction from the width L8 of the sheet portion 106-4 (i.e., Lch=L8−2×L7).

The electric field produced by the gate potential is applied to the channel region, the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 by the sheet portion 106-4, the first stripe shape portion 106-1, the second stripe shape portion 106-2, and the third stripe shape portion 106-3 of the gate electrode 106. Therefore, the width of the gate electrode 106 (i.e., the dimension of the gate electrode 106 in the horizontal direction) is defined by the distance between the first edge 106-5 (i.e., the drain side edge of the third stripe shape portion 106-3) and the second edge 106-6 (i.e., the source side edge of the sheet portion 106-4). Therefore, the width of the gate electrode 106 corresponds to the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the width L8 of the sheet portion 106-4.

The above described integrated lightly doped impurity diffusion region has portions overlapped with the gate electrode 106, and these portions function as the electric field reduction regions. The dimension of the electric field reduction region in the first horizontal direction corresponds to the dimension of the gate overlap dimension. As described above, the integrated lightly doped impurity diffusion region is comprised of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5. The gate electrode 106 includes the sheet portion 106-4, the first stripe shape portion 106-1, the second stripe shape portion 106-2, and the third stripe shape portion 106-3. Therefore, the gate overlap dimension Ld is defined by the distance between the inner side edge of the first lightly doped N⁻ diffusion layer 109-1 and the first edge 106-5 of the gate electrode 106 in the first horizontal direction. Because of this, the gate overlap dimension Ld between the electric field reduction region and the gate electrode 106 is the sum of the width L1 of the first slit 107-1, the width L2 of the first stripe shape portion 106-1, the width L3 of the second slit 107-2, the width L4 of the second stripe shape portion 106-2, the width L5 of the third slit 107-3, the width L6 of the third stripe shape portion 106-3, and the distance L7 of the thermal diffusion of impurities in the horizontal direction (i.e., Ld=L1+L2+L3+L4+L5+L6+L7=0.3×6+L7=1.8 μm+L7). As described above, the distance L7 of the thermal diffusion of impurities in the horizontal direction is required to 0.15 μm or more. Therefore, the gate overlap dimension Ld is set to 1.95 μm or more.

Figure 24:
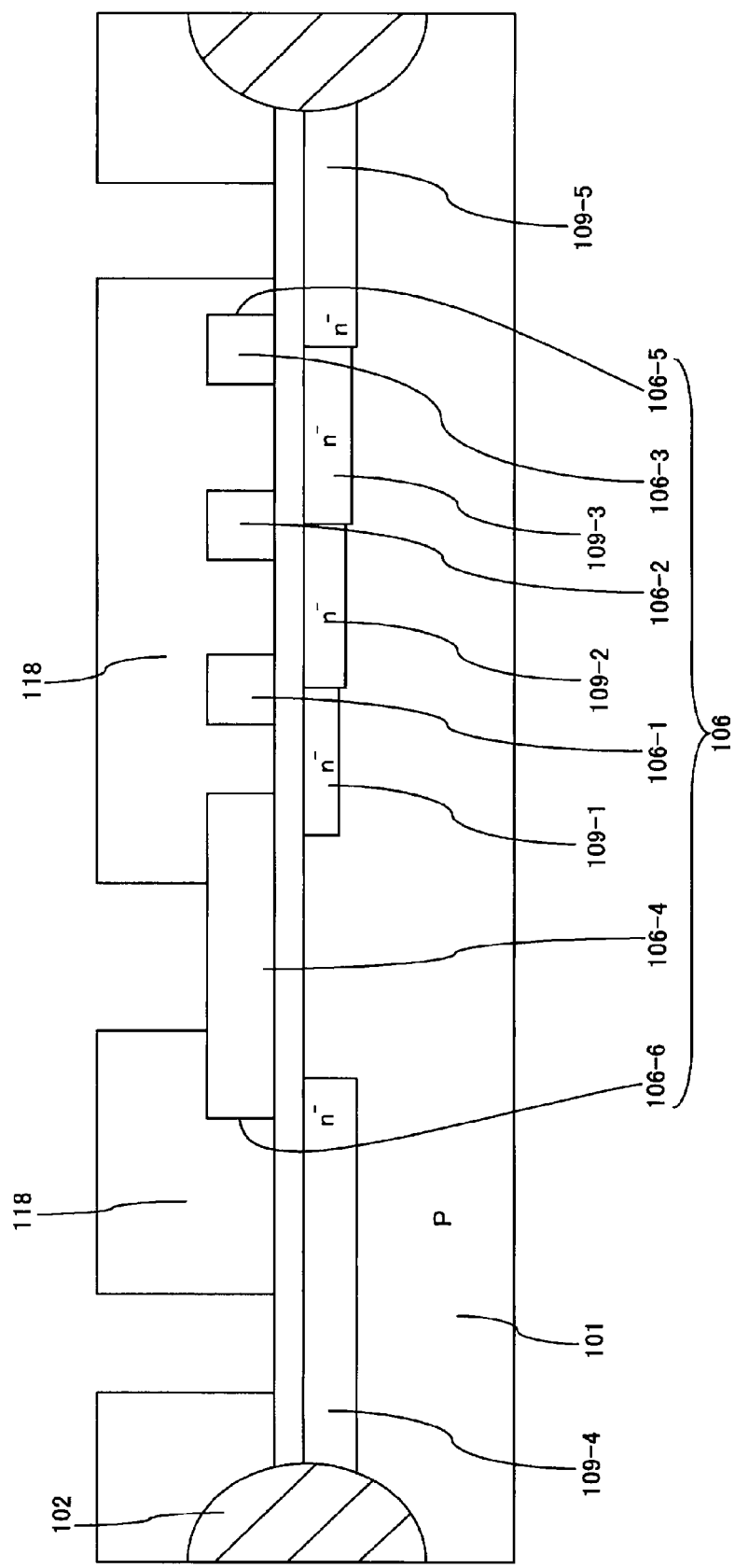
FIG. 24 is a partial vertical cross-section diagram showing a step of a method for manufacturing a high voltage resistant MOS transistor in accordance with the second embodiment of the present invention.

As shown in FIG. 24, a resist pattern 118 is formed on the gate electrode 106, the gate insulating film 103, and the field oxide film 102 with a heretofore known lithography technique.

Figure 25:
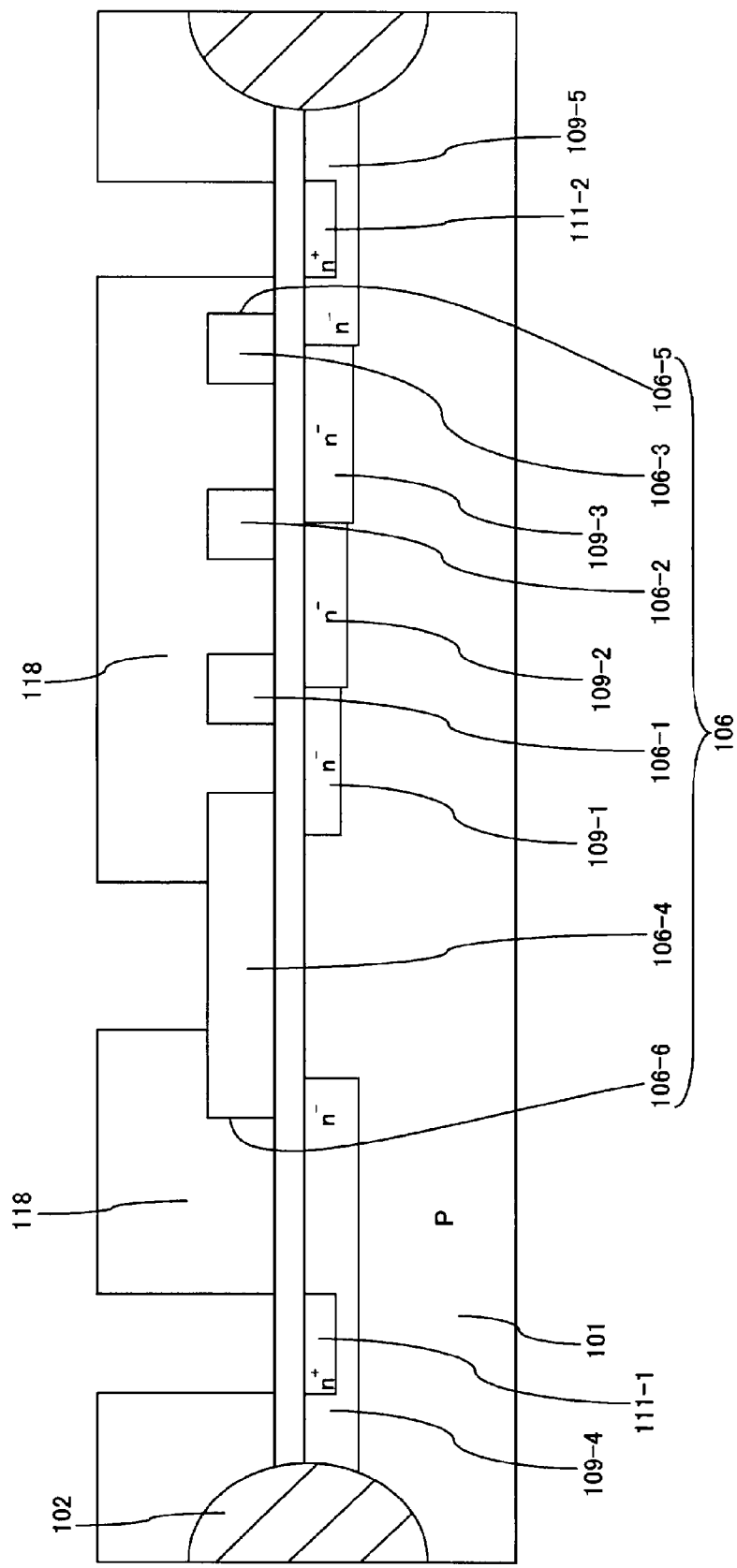
FIG. 25 is a partial vertical cross-section diagram showing a step of a method for manufacturing a high voltage resistant MOS transistor in accordance with the second embodiment of the present invention.

As shown in FIG. 25, the n-type impurity arsenic (As) is selectively implanted into the upper regions of the fourth lightly doped N⁻ diffusion layer 109-4 and the fifth lightly doped N⁻ diffusion layer 109-5 in the vertical direction by using the resist pattern 118 and the sheet portion 106-4 of the gate electrode 106 as a mask with an acceleration energy of 40 keV and the dose amount of $1.0 \times 10^{15}$ cm$^{-2}$. As a result, a source side first heavily doped N⁺ diffusion layer 111-1 is selectively formed in the upper region of the fourth lightly doped N⁻ diffusion layer 109-4, and a drain side second heavily doped N⁺ diffusion layer 111-2 is selectively formed in the upper region of the fifth lightly doped N⁻ diffusion layer 109-5.

Figure 26:
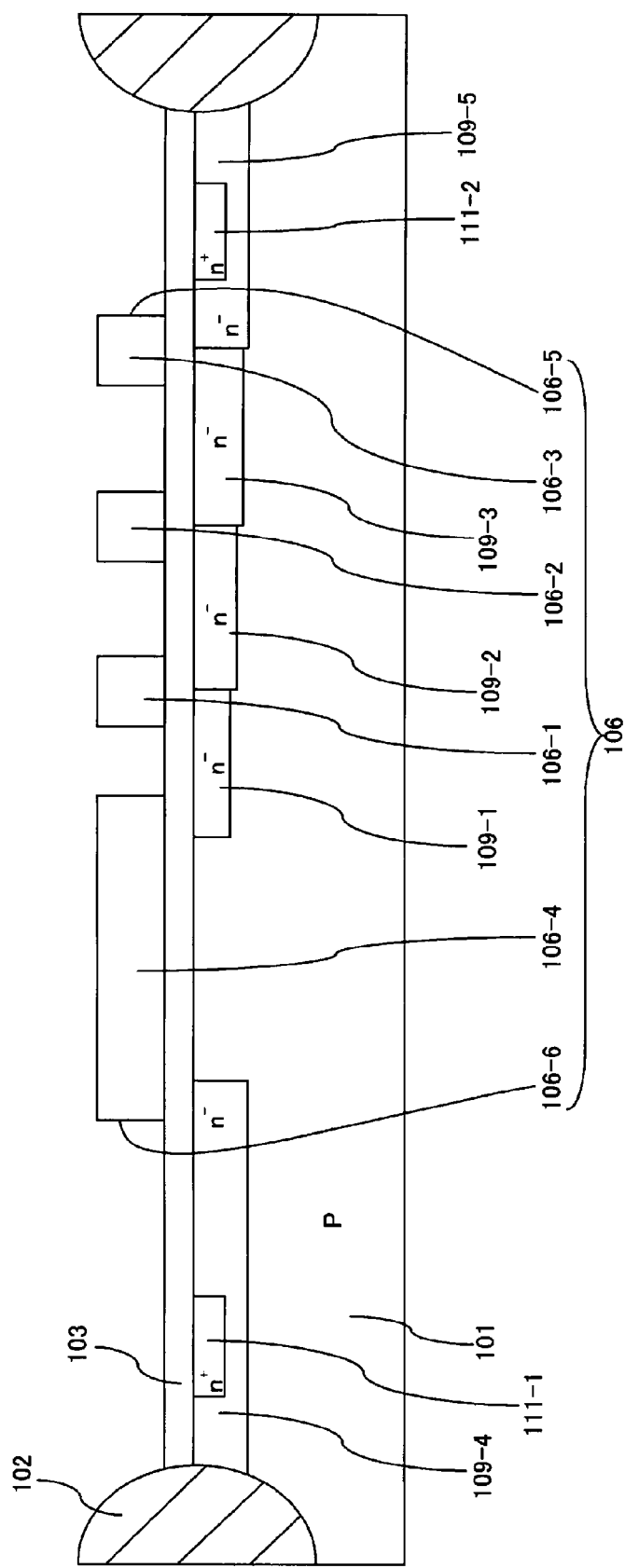
FIG. 26 is a partial vertical cross-section diagram showing a step of a method for manufacturing a high voltage resistant MOS transistor in accordance with the second embodiment of the present invention.

As shown in FIG. 26, the resist pattern 118 is eliminated with a heretofore known method.

Figure 27:
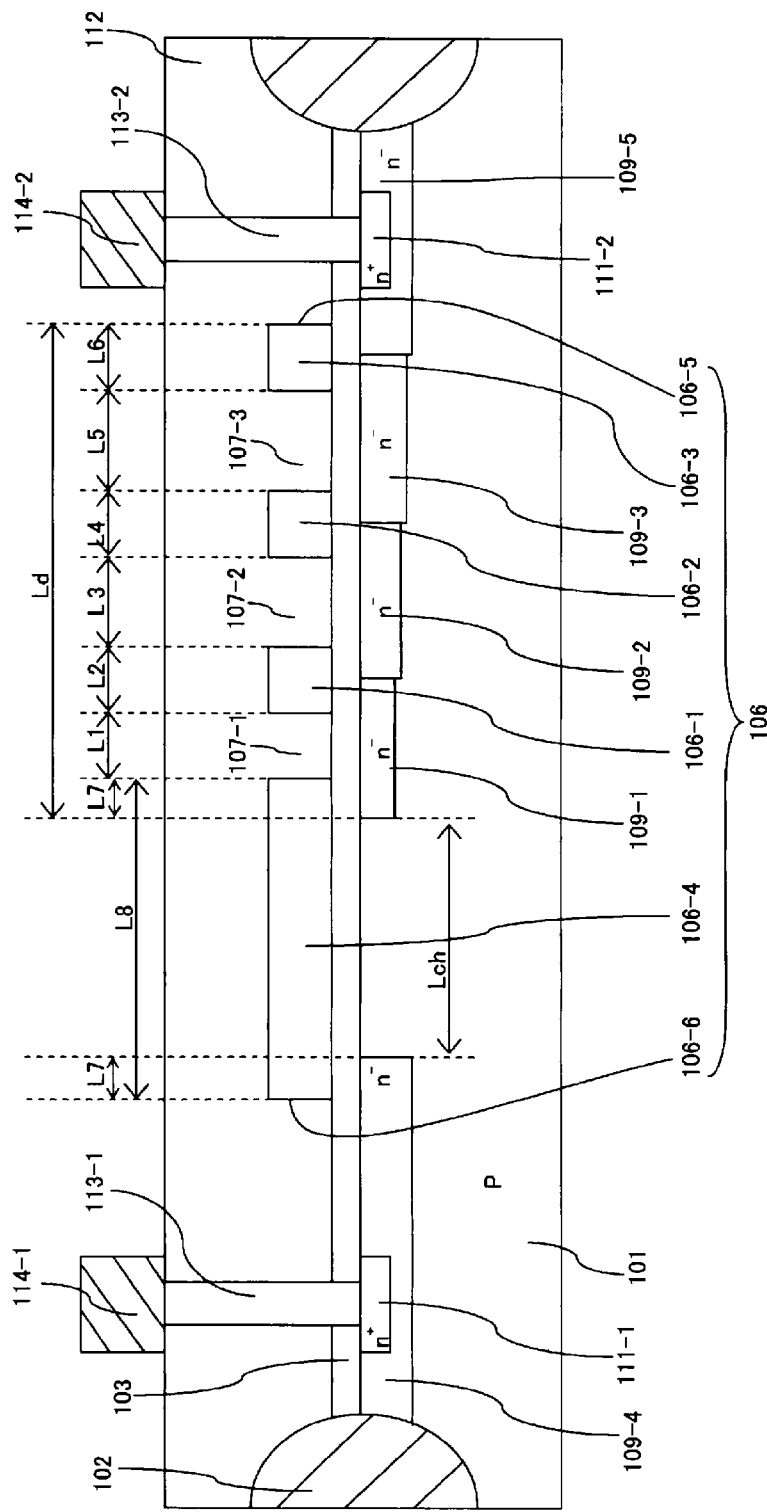
FIG. 27 is a partial vertical cross-section diagram showing a step of a method for manufacturing a high voltage resistant MOS transistor in accordance with the second embodiment of the present invention.

As shown in FIG. 27, an interlayer insulating film 112 is formed on the gate electrode 106, the gate insulating film 103, and the field oxide film 102 with a heretofore known method. Then, contact holes are formed in the interlayer insulating film 112 and the gate insulating film 103. Next, a source contact 113-1 and a drain contact 113-2 are formed in the contact holes. Thus the source contact 113-1 and the drain contact 113-2 have ohmic contacts with the source side first heavily doped N+ diffusion layer 111-1 and the drain side first heavily doped N⁺ diffusion layer 111-2, respectively. Next, a source wiring layer 114-1 and a drain wiring layer 114-2 are formed on the interlayer insulating film 112 with a heretofore known method. As a result, the source wiring layer 114-1 and the drain wiring layer 114-2 are electrically connected to the source side first heavily doped N⁺ diffusion layer 111-1 and the drain side heavily doped N⁺ diffusion layer 111-2 through the source contact 113-1 and the drain contact 113-2, respectively.

The above described interlayer insulating film 112 fills the first slit 107-1, the second slit 107-2, and the third slit 107-3. When each of the aspect ratios of the first slit 107-1, the second slit 107-2, and the third slit 107-3 is increased, this makes it difficult for each of the first slit 107-1, the second slit 107-2, and the third slit 107-3 to be filled by the interlayer insulating film 112 completely, and thus a void could be formed. However, formation of a void is not a problem as long as the interlayer insulating film 112 exerts a necessary electrolysis action. It is effective for preventing formation of a void to use a low voltage chemical vapor deposition (the low voltage CVD) with the high implantation property. Alternatively or additionally, it is effective for preventing formation of a void to form the first stripe shape portion 106-1, the second stripe shape portion 106-2, and the third stripe shape portion 106-3 of the gate electrode 106, which have a trapezoidal vertical cross-section in the first horizontal direction.

According to the present invention, as described above, the slit group 107 comprised of slits with different widths is included. Also, ion implantation of impurities is conducted by using the gate electrode 106 having the slit group 107 as a mask, and the lightly doped impurity implantation regions 108-1 to 108-5 self-aligned with the gate electrode 106 are formed. In this phase, the positions of both edges of the lightly doped impurity implantation regions are self-aligned with the positions of both edge sidewalls of the first slit 107-1, the second slit 107-2, and the third slit 107-3, which have different widths from each other, in the first horizontal direction. In addition, the above described thermal diffusion in the crosswise direction is symmetrical in the first horizontal direction. Therefore, the central location of the first lightly doped N⁻ diffusion layer 109-1 is self-aligned with the central location of the first slit 107-1 whose width is the narrowest among the slit group 107. The central location of the second lightly doped N⁻ diffusion layer 109-2 is self-aligned with the central location of the second slit 107-2 whose width is medium among the slit group 107. The central location of the third lightly doped N⁻ diffusion layer 109-3 is self-aligned with the central location of the third slit 107-3 whose width is the widest among the slit group 107. Therefore, the above described integrated lightly doped impurity diffusion region is self-aligned with the slit group 107 in the first horizontal direction. That is to say, the above described integrated lightly doped impurity diffusion region, which has changing depth in the first horizontal direction, is self-aligned with the gate electrode 106 having the slit group 107 in the position of the first horizontal direction.

The regions of the above described integrated lightly doped impurity diffusion region overlapped with the gate electrode 106 function as the electric field reduction region. Therefore, the overlap dimension Ld between the electric field reduction region and the gate electrode 106 is the sum of the width L1 of the first slit 107-1, the width L2 of the first stripe shape portion 106-1, the width L3 of the second slit 107-2 that is larger than the above described width L1, the width L4 of the second stripe shape portion 106-2, the width L5 of the third slit 107-3 that is larger than the above described width L3, the width L6 of the third stripe shape portion 106-3, and the distance L7 of the thermal diffusion of impurities in the horizontal direction (i.e., Ld=L1+L2+L3+L4+L5+L6+L7).

In addition, the impurity concentration of the second lightly doped N⁻ diffusion layer 109-2 is higher than that of the first lightly doped N⁻ diffusion layer 109-1, and the impurity concentration of the third lightly doped N⁻ diffusion layer 109-3 is higher than that if the second lightly doped N⁻ diffusion layer 109-2. The depth of this integrated lightly doped impurity diffusion region becomes gradually shallower towards the channel regions and the impurity concentration of it becomes gradually decreased towards the channel region.

Therefore, the second embodiment of the present invention has the following effects.

First, misalignment between the patterning to form the electric field reduction region and the patterning to form the gate electrode 106 is not caused, although the above described three slits have different widths from each other. Because of this, a variation from a design value of the overlap dimension Ld based on the misalignment between those patternings is not caused. Therefore, the gate overlap dimension Ld can be defined without any regard for the alignment margin between the patterning to form the electric field reduction region and the patterning to form the gate electrode 106. When a gate overlap structure is formed in a non-self-alignment fashion, a design value needs to be set to the dimension derived by adding the above described alignment margin between those patternings to the originally necessary gate overlap dimension. On the other hand, when a gate overlap structure is formed in a self-alignment fashion, the above described alignment margin between those patternings is not needed and a design value may be set to the originally necessary gate overlap dimension as it is. Because of this, the current drive capability of the high voltage resistant MOS transistor can be improved. As a result, the device size can be reduced.

Second, the gate overlap dimension Ld can be regulated by regulating the number of slits having different widths from each other. In general, a high voltage resistant MOS transistor needs the large gate overlap amount. However, a desired large gate overlap amount can be obtained by increasing the number of slits without any regard for the alignment margin between the patterning to form the electric field reduction region and the patterning to form the gate electrode 106. For example, a 40 V voltage resistant MOS transistor may need the gate overlap amount of 2 μm. According to the gate overlap structure in accordance with the second embodiment of the present invention, the gate overlap dimension Ld of 1.95 μm or more can be obtained by setting the arithmetic average of the widths of the above described three slits having different widths from each other, the widths of the above described three stripe shape portions, and the distance L7 of the thermal diffusion in the horizontal direction to 0.3 μm, 0.3 μm, and half of the width of the above described three stripe shape portions or more, respectively. Therefore, the large gate overlap amount required for the 40 V voltage resistant MOS transistor can be obtained. Also, three slits having different widths with each other are formed in the first embodiment of the present invention. However, the number of the slits can be arbitrarily changed according to the demanded gate overlap dimension Ld.

Third, the integrated lightly doped impurity diffusion region including the electric field reduction region is formed by conducting ion implantation by using the gate electrode as a mask. In other words, formation of a mask comprised of a resist pattern is not needed for the ion implantation step to form the integrated impurity diffusion region including the electric field reduction region. Therefore, a MOS transistor can be manufactured in less manufacturing steps.

Fourth, the impurity concentration of the above described integrated lightly doped impurity diffusion region becomes gradually lower towards the channel region. When the impurity concentration of the electric field reduction region is decreased, this makes it easy for the high voltage property of a MOS transistor to be improved. However, this makes it difficult for the drive capability to be improved. On the other hand, when the impurity concentration of the electric field reduction region is increased, this makes it easy for the drive capability of a MOS transistor to be improved. However, this makes it difficult for the high voltage resistant property to be improved. Especially, when the impurity concentration of a closer portion of the electric field reduction region from the channel region is decreased, this effectively works for improvement of the high voltage resistant property of a MOS transistor. On the other hand, when the impurity concentration of a more distant portion of the electric field reduction region from the channel region is increased, this effectively works for improvement of the drive capability of a MOS transistor. The impurity concentration of the electric field reduction region included in the above described integrated lightly doped impurity diffusion region becomes gradually lower towards the channel region and becomes gradually higher with distant from the channel region. Therefore, this electric field reduction region has an impurity concentration profile in the first horizontal direction, which is effective for improvements of the high voltage resistant property and the drive capability of a MOS transistor.

Third Embodiment

High Voltage Resistant MOS Transistor Structure

According to the present invention, a high voltage resistant MOS transistor including a lightly doped diffusion layer that is overlapped with a gate electrode in a self-alignment fashion and functions as an electric field reduction region, and a method for manufacturing thereof are provided.

Figure 28:
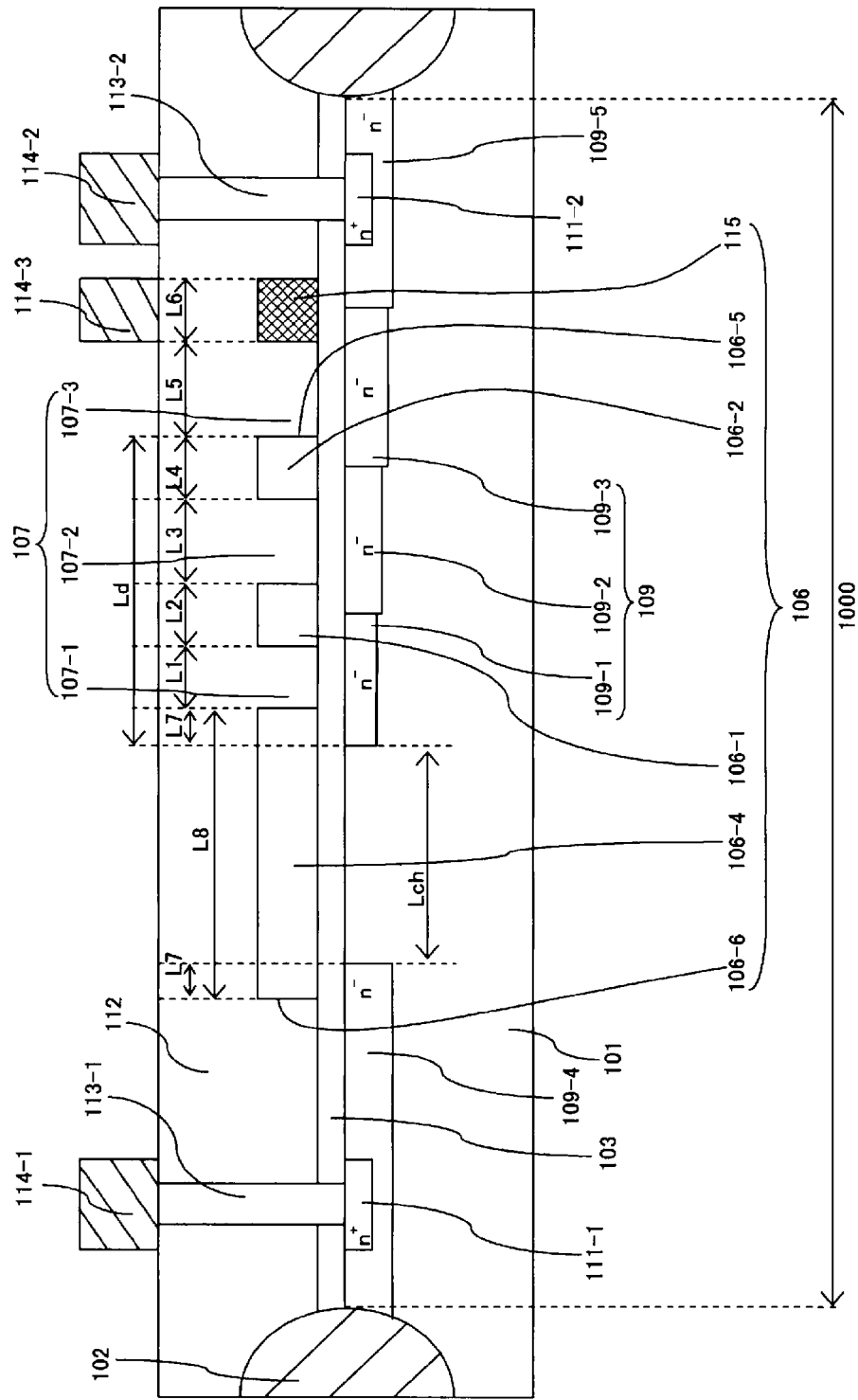
FIG. 28 is a partial vertical cross-section diagram showing the structure of a high voltage resistant MOS transistor in accordance with a third embodiment of the present invention.
Figure 29:
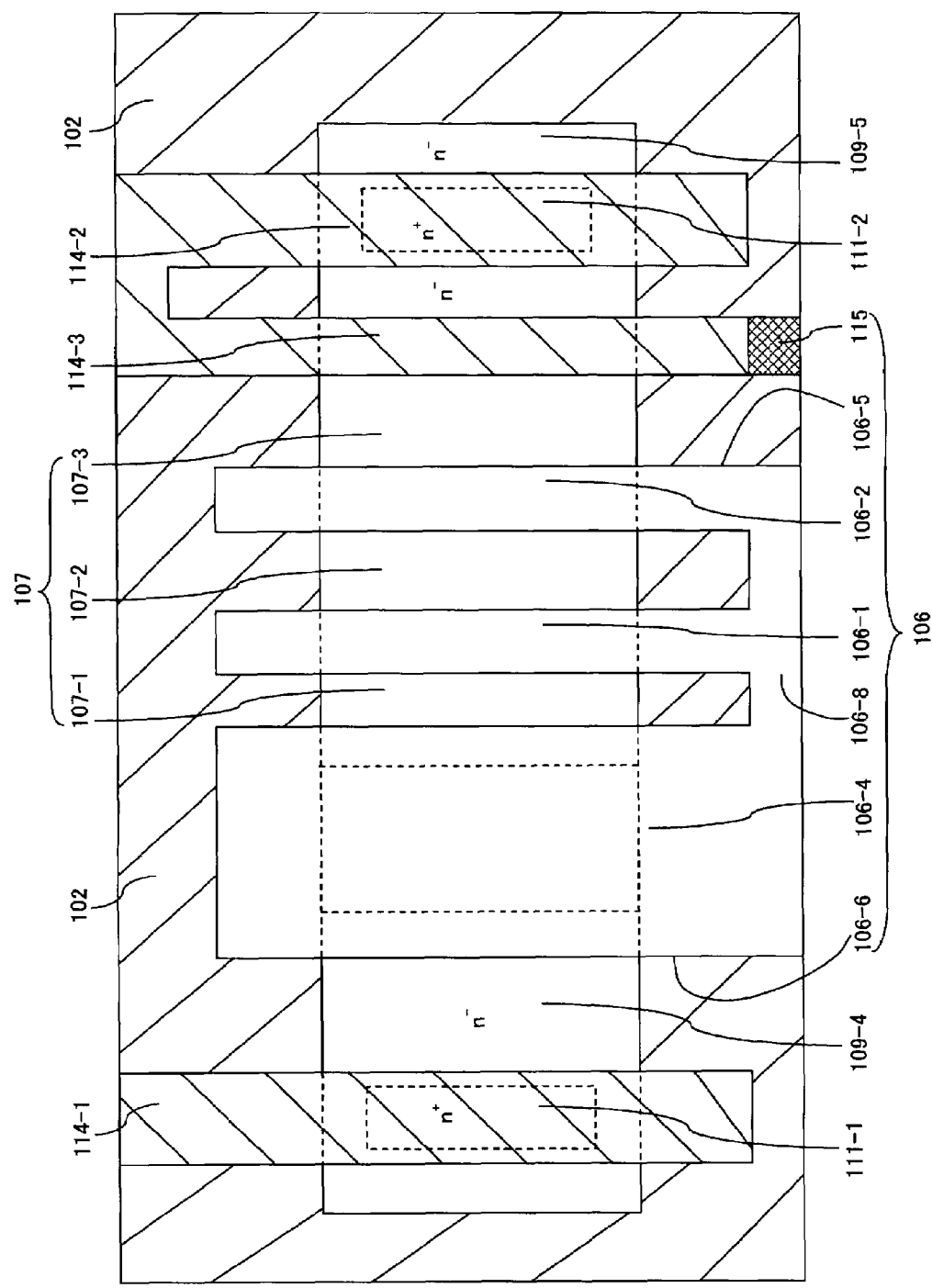
FIG. 29 is a partial plan view showing the structure of a high voltage resistant MOS transistor in accordance with the third embodiment of the present invention.

FIG. 28 is a partial vertical cross-section diagram of a high voltage resistant MOS transistor in accordance with a third embodiment of the present invention. Also, FIG. 29 is a partial plan view of the high voltage resistant MOS transistor shown in FIG. 28 in accordance with the third embodiment of the present invention.

The high voltage resistant MOS transistor in accordance with the third embodiment of the present invention has the following structure. The principal surface of a p-type semiconductor substrate 101 includes an element isolation region comprised of a field oxide film 102 and an active region 1000 defined by the field oxide film 102. A first lightly doped N⁻ diffusion layer 109-1 and a fourth lightly doped N⁻ diffusion layer 109-4, which are separated from each other through a channel region having a channel length Lch, are formed in the active region 1000 of the p-type semiconductor substrate 101. In other words, the channel region is defined between the first lightly doped N⁻ diffusion layer 109-1 and the fourth lightly doped N⁻ diffusion layer 109-4, and the channel length Lch is defined by the horizontal distance between the first lightly doped N⁻ diffusion layer 109-1 and the fourth lightly doped N⁻ diffusion layer 109-4. The first lightly doped N⁻ diffusion layer 109-1 is located on the drain side, and the fourth lightly doped N⁻ diffusion layer 109-4 is located on the source side.

A second lightly doped N⁻ diffusion layer 109-2 is formed adjacent to the first lightly doped N⁻ diffusion layer 109-1 and separated from the channel region through this first lightly doped N⁻ diffusion layer 109-1. A third lightly doped N⁻ diffusion layer 109-3 is formed adjacent to the second lightly doped N⁻ diffusion layer 109-2 and separated from the channel region through the first lightly doped N⁻ diffusion layer 109-1 and the second lightly doped N⁻ diffusion layer 109-2. A fifth lightly doped N⁻ diffusion layer 109-5 is formed adjacent to the third lightly doped N⁻ diffusion layer 109-3 and separated from the channel region through the first lightly doped N⁻ diffusion layer 109-1, the second lightly doped N⁻ diffusion layer 109-2, and the third lightly doped N⁻ diffusion layer 109-3.

The active region 1000 of the p-type semiconductor substrate 101 is defined by the element isolation region comprised of the field oxide film 102. Also, the first lightly doped N⁻ diffusion layer 109-1, the second lightly doped N⁻ diffusion layer 109-2, the third lightly doped N⁻ diffusion layer 109-3, the fourth lightly doped N⁻ diffusion layer 109-4, and the fifth lightly doped N⁻ diffusion layer 109-5 are formed in the active region 1000. These lightly doped N⁻ diffusion layers 109-1, 109-2, 109-3, 109-4, and 109-5 are abutted against the boundary between the active region 1000 and the element isolation region comprised of the field oxide film 102.

A first heavily doped N⁺ diffusion layer 111-1 is selectively formed in the upper region of the fourth lightly doped N⁻ diffusion layer 109-4. A second heavily doped N⁺ diffusion layer 111-2 is selectively formed in the upper region of the fifth lightly doped N⁻ diffusion layer 109-5.

A gate insulating film 103 is formed on the principal surface of the p-type semiconductor substrate 101. More specifically, the gate insulating film 103 is continuously formed on the channel region, the first lightly doped N⁻ diffusion layer 109-1, the second lightly doped N⁻ diffusion layer 109-2, the third lightly doped N⁻ diffusion layer 109-3, the fourth lightly doped N⁻ diffusion layer 109-4, and the fifth lightly doped N⁻ diffusion layer 109-5, the first heavily doped N⁺ diffusion layer 111-1, and the second heavily doped N⁺ diffusion layer 111-2 of the p-type semiconductor substrate 101.

A gate electrode 106 is selectively formed on the gate insulating film 103. The gate electrode 106 is comprised of a polysilicon film and has a slit group 107. The gate electrode 106 is comprised of a first stripe shape portion 106-1, a second stripe shape portion 106-2, a floating gate electrode 115, a sheet portion 106-4, a first edge 106-5, a second edge 106-6, a second side region 106-8, and the slit group 107. The slit group 107 is comprised of a first slit 107-1, a second slit 107-2, and a third slit 107-3. These slits 107-1, 107-2, and 107-3 are separated from each other in the first horizontal direction and longitudinally formed along the second horizontal direction. The sheet portion 106-4 is formed above the channel region, more specifically, on the gate insulating film 103, and has a width L8 corresponding to an eighth dimension L8. The first stripe shape portion 106-1 is formed to be separated from the sheet portion 106-4 through the first slit 107-1 having a width L1 corresponding to a first dimension L1 in the first horizontal direction, and has a width L2 corresponding to a second dimension L2. The second stripe shape portion 106-2 is formed to be separated from the first stripe shape portion 106-1 through the second slit 107-2 having a width L3 corresponding to a third dimension L3 in the first horizontal direction, and has a width L4 corresponding to a fourth dimension L4. The floating gate electrode 115 is separated from the second stripe shape portion 106-2 through the third slit 107-3 having a width L5 corresponding to a fifth dimension L5, and has a width L6 corresponding to a sixth dimension L6. Here, the floating gate electrode 115 is comprised of a discrete portion that is separated from the other portions of the gate electrode 106. The second side region 106-8 is longitudinally formed along the first horizontal direction. Each of the first slit 107-1 and the second slit 107-2 is terminated in the second side region 106-8. In other words, the first stripe shape portion 106-1, the second stripe shape portion 106-2, and the sheet portion 106-4 are connected with each other through the second side region 106-8.

On the other hand, the floating gate electrode 115 is separated from the first stripe shape portion 106-1, the second stripe shape portion 106-2, the sheet portion 106-4, the second side region 106-8 through the third slit 107-3. That is to say, the gate electrode 106 includes (i) an integrated structure comprised of the first stripe shape portion 106-1, the second stripe shape portion 106-2, the sheet portion 106-4, and the second side region 106-8, (ii) the floating gate electrode 115 that is separated from this integrated structure through the third slit 107-3, and (iii) the slit group 107 including the third slit 107-3. Also, the floating gate electrode 115 has a stripe shape and its width is the same with the widths of the first stripe shape portion 106-1 and the second stripe shape portion 106-2.

The widths of the first stripe shape portion 106-1, the second stripe shape portion 106-2, the floating gate electrode 115, the sheet portion 106-4 of the gate electrode 106, and the widths of the first slit 107-1, the second slit 107-2, and the third slit 107-3 are defined as their dimensions in the first horizontal direction.

The first slit 107-1, the second slit 107-2, and the third slit 107-3 are formed to reach the element isolation region across the boundary between the active region 1000 and the element isolation region comprised of the field oxide film 102. Each of the first slit 107-1 and the second slit 107-2 are abutted against the second side region 106-8 of the gate electrode 106. Therefore, the second side region 106-8 of the gate electrode 106 is located on the element isolation region comprised of the field oxide film 102.

In the third embodiment, the widths of the first slit 107-1, the second slit 107-2, and the third slit 107-2 have different widths from each other. More specifically, the width L3 of the second slit 107-2 is larger than the width L1 of the first slit, and the width L5 of the third slit 107-3 is larger than the width L3 of the second slit 107-2 (i.e., L1<L3<L5). Also, the widths of the first stripe shape portion 106-1, the second stripe shape portion 106-2, and the floating gate electrode 115 are the same with each other (i.e., L2=L4=L6). In addition, the widths of the first stripe shape portion 106-1, the second stripe shape portion 106-2, and the floating gate electrode 115 (i.e., L2=L4=L6) can be set to the same with the width L3 of the second slit 107-2 (i.e., L1<L2=L4=L6=L3<L5).

The central location of the first lightly dope N⁻ diffusion layer 109-1 is self-aligned with the central location of the first slit 107-1 in the first horizontal direction. The central location of the second lightly dope N⁻ diffusion layer 109-2 is self-aligned with the central location of the second slit 107-2 in the first horizontal direction. The central location of the third lightly dope N⁻ diffusion layer 109-3 is self-aligned with the central location of the third slit 107-3 in the first horizontal direction.

Impurity ions are implanted into the p-type semiconductor substrate 101 through the slit group 107 of the gate electrode 106 by using the gate electrode 106 as a mask. Then, thermal oxidization is conducted with respect to the implanted impurities and the first lightly dope N⁻ diffusion layer 109-1, the second lightly dope N⁻ diffusion layer 109-2, and the third lightly dope N⁻ diffusion layer 109-3 are formed. The depth of the second lightly dope N⁻ diffusion layer 109-2 is deeper than that of the first lightly dope N⁻ diffusion layer 109-1, and the depth of the third lightly dope N⁻ diffusion layer 109-3 is deeper than that of the second lightly dope N⁻ diffusion layer 109-2. Also, the width of the second lightly dope N⁻ diffusion layer 109-2 is larger than that of the first lightly dope N⁻ diffusion layer 109-1, and the width of the third lightly dope N⁻ diffusion layer 109-3 is larger than that of the second lightly dope N⁻ diffusion layer 109-2. In addition, the impurity concentration of the second lightly dope N⁻ diffusion layer 109-2 is higher than that of the first lightly dope N⁻ diffusion layer 109-1, and the impurity concentration of the third lightly dope N⁻ diffusion layer 109-3 is higher than that of the second lightly dope N⁻ diffusion layer 109-2. The first lightly dope N⁻ diffusion layer 109-1 and the second lightly dope N⁻ diffusion layer 109-2 are required to be adjacently formed without any space. Also, the second lightly dope N⁻ diffusion layer 109-2 and the third lightly dope N⁻ diffusion layer 109-3 are required to be adjacently formed without any space. In addition, the third lightly dope N⁻ diffusion layer 109-3 and the fifth lightly dope N⁻ diffusion layer 109-5 are required to be adjacently formed without any space. Also, the first lightly dope N⁻ diffusion layer 109-1, the second lightly dope N⁻ diffusion layer 109-2, the third lightly dope N⁻ diffusion layer 109-3, and the fifth lightly dope N⁻ diffusion layer 109-5 are required to comprise an integrated lightly doped impurity diffusion region.

The depth of the integrated lightly doped impurity diffusion region gradually becomes shallower and the impurity concentration of it gradually becomes lower towards the channel region. If the impurity concentration of an electric field reduction region is decreased, it makes it easy to improve the high voltage resistant property of a MOS transistor. However, it also makes it difficult to improve the drive capability of a MOS transistor. On the other hand, when the impurity concentration of an electric field reduction region is increased, it makes it easy to improve the drive capability of a MOS transistor. However, it also makes it difficult to improve the high voltage resistant property of a MOS transistor. Especially, when the impurity concentration of a closer portion of an electric field reduction region from a channel region is decreased, it effectively works for improvement of the high voltage resistant property of a MOS transistor. On the other hand, when the impurity concentration of a more distant portion of an electric field reduction region from a channel region is increased, it effectively works for improvement of the drive capability of a MOS transistor. The impurity concentration of the electric field reduction region included in the above described integrated lightly doped impurity diffusion region is decreased towards the channel region and increased with distant from the channel region. Therefore, this electric field reduction region has an impurity concentration profile in the first horizontal direction, which is effective for improvements of the high voltage resistant property and the drive capability of a MOS transistor.

In order to form the above described integrated lightly doped impurity diffusion region, an impurity thermal diffusion distance L7 in the crosswise direction is required to be set to at least half of the width of the first stripe shape portion 106-1, the second stripe shape portion 106-2, or the third stripe shape portion 106-3 (i.e., L2/2=L4/2=L6/2). The following is the reason for this.

The lightly doped impurity implantation regions are selectively formed in the regions of the p-type semiconductor substrate 101 located below the first slit 107-1, the second slit 107-2, and the third slit 107-3 by conducting an ion implantation step by using the gate electrode 106 including the slit group 107 as a mask. In this phase, the positions of both edges of the lightly doped impurity implantation regions are self-aligned with the positions of both edge sidewalls of the first slit 107-1, the second slit 107-2, and the third slit 107-3 in the first horizontal direction. The adjacent lightly doped impurity implantation regions are separated from each other through the distances corresponding to the widths of the first stripe shape portion 106-1, the second stripe shape portion 106-2, and the floating gate electrode 115 of the gate electrode 106 (i.e., L2=L4=L6) in the first horizontal direction, respectively. Then, a thermal diffusion step of impurities is conducted and thus those impurity diffusion regions are enlarged. This thermal diffusion step of impurities is continuously conducted at least until the adjacent impurity diffusion regions have contact with each other. As a result, the first lightly doped N⁻ diffusion layer 109-1 and the second lightly doped N⁻ diffusion layer 109-2 are adjacently formed without any space. Also, the second lightly doped N⁻ diffusion layer 109-2 and the third lightly doped N⁻ diffusion layer 109-3 are adjacently formed without any space. In addition, the third lightly doped N⁻ diffusion layer 109-3 and the fifth lightly doped N⁻ diffusion layer 109-5 are adjacently formed without any space. Furthermore, the integrated lightly doped impurity diffusion region is formed, which is formed by the integration of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5.

Also, the positions of both edges of the lightly doped impurity implantation regions are self-aligned with the positions of the edge sidewalls of first slit 107-1, the second slit 107-2, and the third slit 107-3 in the first horizontal direction in the above described phase in which the lightly doped impurity implantation regions are selectively formed in the regions of the p-type semiconductor substrate 101 located below the first slit 107-1, the second slit 107-2, and the third slit 107-3 by conducting an ion implantation step by using the gate electrode 106 including the slit group 107 as a mask. In addition, the above described thermal diffusion in the crosswise direction is symmetrical in the first horizontal direction. Therefore, the center location of the first lightly doped N⁻ diffusion layer 109-1 is self-aligned with the center location of the first slit 107-1. Also, the center location of the second lightly doped N⁻ diffusion layer 109-2 is self-aligned with the center location of the second slit 107-2. In addition, the center location of the third lightly doped N⁻ diffusion layer 109-3 is self-aligned with the center location of the third slit 107-3. Therefore, the above described integrated lightly doped impurity diffusion region is self-aligned with the slit group 107 in the first horizontal direction. That is to say, the above described integrated lightly doped impurity diffusion region is self-aligned with the gate electrode 106 including the slit group 107 in the first horizontal direction.

As shown in FIG. 28, the inner edge of the first lightly doped N⁻ diffusion layer 109-1 is overlapped with the sheet portion 106-4 of the gate electrode 106 by the distance corresponding to the distance L7 of the thermal diffusion of impurities in the horizontal direction. Also, the inner edge portion of the fourth lightly doped N⁻ diffusion layer 109-4 is overlapped with the sheet portion 106-4 of the gate electrode 106 by the distance corresponding to the distance L7 of the thermal diffusion of impurities in the horizontal direction. The channel length Lch is defined between the inner edge portion of the first lightly doped N⁻ diffusion layer 109-1 and the inner edge portion of the fourth lightly doped N⁻ diffusion layer 109-4. Therefore, the channel length Lch is equal to the value derived by subtracting twice the distance L7 of the thermal diffusion of impurities in the horizontal direction from the width L8 of the sheet portion 106-4 (i.e., Lch=L8−2×L7).

The electric field produced by the gate potential is applied to the channel region, the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 by the sheet portion 106-4, the first stripe shape portion 106-1, and the second stripe shape portion 106-2 of the gate electrode 106.

In the third embodiment of the present invention, the gate electrode 106 includes the floating gate electrode 115. However, the gate voltage that is applied to the gate electrode 106 is not applied to this floating gate electrode 115. In addition, the floating gate electrode 115 is not influenced by the gate voltage. Therefore, an integrated portion is comprised of the portions of the gate electrode 106 other than the floating gate electrode 115, that is, the sheet portion 106-4, the first stripe shape portion 106-1, the second stripe shape portion 106-2, and the second side region 106-8. This integrated potion has a gate potential. Because of this, the electric field based on the gate potential is applied to a portion of the above described integrated lightly doped impurity diffusion region and the channel region by the above described integrated portion. The region of the above described integrated lightly doped impurity diffusion region in which the electric field based on the gate potential is applied corresponds to an electric field reduction region. Therefore, the first edge 106-5 of the gate electrode 106 corresponds to the sidewall of the second stripe shape portion 106-2 and faces the floating gate electrode 115. In other words, the width of the gate electrode 106 corresponds to the sum of the width L1 of the first slit 107-1, the width L2 of the first stripe shape portion 106-1, the width L3 of the second slit 107-2, the width L4 of the second stripe shape portion 106-2, and the width L8 of the sheet portion 106-4.

Furthermore, in the third embodiment of the present invention, an interlayer insulating film 112 is formed on the gate electrode 106, the gate insulating film 103, and the field oxide film 102. Also, contact holes are formed in the interlayer insulating film 112 and the gate insulating film 103, and a source contact 113-1 and a drain contact 113-2 are formed in the contact holes formed in the interlayer insulating film 112 and the gate insulating film 103. The source contact 113-1 and the drain contact 113-2 have ohmic contacts with the source side first heavily doped $N^+$ diffusion layer 111-1 and the drain side first heavily doped $N^+$ diffusion layer 111-2, respectively. A source wiring layer 114-1, a drain wiring layer 114-2, and an extended portion 114-3 of the drain wiring layer are formed on the interlayer insulating film 112. The source wiring layer 114-1 is electrically connected to the source side first heavily doped $N^+$ diffusion layer 111-1 through the source contact 113-1. Also, the drain wiring layer 114-2 is electrically connected to the drain side first heavily doped $N^+$ diffusion layer 111-2 through the drain contact 113-2.

On the other hand, the extended portion 114-3 of the drain wiring layer is electrically connected to the drain wiring layer 114-2. Therefore, the extended portion 114-3 of the drain wiring layer always has the same level of the electric potential with the drain wiring layer 114-2. That is to say, the drain voltage is applied to the extended portion 114-3 of the drain wiring layer. This extended portion 114-3 of the drain wiring layer is formed on the interlayer insulating film 112 and above the above described floating gate electrode 115. Because of this, the electric potential of the floating gate electrode 115 depends on that of the extended portion 114-3 of the drain wiring layer. The electric potential of the floating gate electrode 115 is raised by applying positive high voltage to the drain wiring layer 114-2 and the extended portion 114-3 of the drain wiring layer. Because of the raised electric potential of the floating gate electrode 115, the electric field based on this raised electric potential is applied to a vicinity of the upper surface of the above described integrated lightly doped impurity diffusion region, which is located below the floating gate electrode 115. Thus electrons are concentrated in the region. The electrons function as carriers of the above described integrated lightly doped impurity diffusion region. Because of this, concentration of electrons in the above described region means a pseudo-elevation of the impurity concentration of this region. Therefore, applying positive high voltage to the drain wiring layer reduces resistance of a vicinity of the upper surface of the above described integrated lightly doped impurity diffusion region, which is located below the floating gate electrode 115. This resistance reduction increases the drive capability of a MOS transistor. The pseudo-elevation of the impurity concentration, which is caused by applying positive high voltage to the drain wiring layer, is caused only on a vicinity of the upper surface of the above described integrated lightly doped impurity diffusion region. Voltage resistance of the MOS transistor depends on the impurity concentration of a vicinity of the upper surface of the above described integrated lightly doped impurity diffusion region as well as the impurity concentration of the other regions. Therefore, the above described pseudo-elevation of the impurity concentration barely has an impact on the voltage resistant property of the MOS transistor. Therefore, the drive capability of the MOS transistor can be increased with little impact on the voltage resistant property of a MOS transistor by forming the floating gate electrode 115 and the extended portion 114-3 of the drain wiring layer.

Also, the above described integrated lightly doped impurity diffusion region includes portions overlapped with the gate electrode 106, and these overlapped regions function as the electric field reduction regions. In the present invention, a region of the lightly doped impurity diffusion region that is overlapped with the gate electrode 106 is defined as the electric field reduction region. Because of this, the dimension of the electric field reduction region in the first horizontal direction corresponds to the gate overlap dimension. As described above, the integrated lightly doped impurity diffusion region is comprised of the first lightly doped $N^-$ diffusion layer 109-1, the second lightly doped $N^-$ diffusion layer 109-2, the third lightly doped $N^-$ diffusion layer 109-3, and the fifth lightly doped $N^-$ diffusion layer 109-5. Also, the gate electrode 106 includes the sheet portion 106-4, the first stripe shape portion 106-1, the second stripe shape portion 106-2, and the floating gate electrode 115. However, as described above, the gate voltage applied to the gate electrode 106 is not applied to this floating gate electrode 115. Furthermore, the floating gate electrode 115 is not influenced by the gate voltage. Therefore, the portions of the gate electrode 106 other than the floating gate electrode 115, that is, the sheet portion 106-4, the first stripe shape portion 106-1, the second stripe shape portion 106-2, and the second side region 106-8 comprises the integrated portion. This integrated portion has a gate potential. The overlap dimension Ld is defined by the distance between the boundary of the first lightly doped $N^-$ diffusion layer 109-1 with respect to the channel region and the first edge 106-5 of the gate electrode 106. Therefore, the overlap dimension Ld between the electric field reduction region and the gate electrode 106 is defined by the sum of the width L1 of the first slit 107-1, the width L2 of the first stripe shape portion 106-1, the width L3 of the second slit 107-2, the width L4 of the second stripe shape portion 106-2, and the distance L7 of the thermal diffusion of impurities in the horizontal direction (i.e., Ld=L1+L2+L3+L4+L7).

The following is a further explanation of the width L1 of the first slit 107-1, the width L3 of the second slit 107-2, the width L5 of the third slit 107-3, the width L2 of the first stripe shape portion 106-1, the width L4 of the second stripe shape portion 106-2, and the width L6 of the floating gate electrode 115.

If the width of the slit is increased, the electric field applied to the above described electric field reduction region based on the gate potential and the electric field reduction effect are reduced. In addition, if the width of the slits is increased, the number of the slits and the number of the stripe shape portions that are needed to keep the necessary gate overlap amount are decreased, and impurities are easily implanted in the step of the ion implantation of impurities by using the gate electrode as a mask The maximum width of the slits is defined by the necessary minimum electric field that is applied to the above described electric field reduction region based on the gate potential and by the maximum width necessary for obtaining the minimum required electric field reduction effect.

If the width of the slits is decreased, the number of the slits and the number of the stripe shape portions of the gate electrode that are needed to keep the necessary gate overlap amount are increased, and impurities are prevented from being implanted in the step of ion implantation of impurities by using the gate electrode as a mask. This causes the concentration of the finished impurity diffusion layer to be decreased. In addition, if the width of the slits is decreased, the electric field that is applied to the above described electric field reduction region based on the gate potential and the electric field reduction effect are increased. Also, the minimum width of the slits is defined by the limit width for which patterning can be conducted.

If the widths of the stripe shape portion of the gate electrode and the floating gate electrode are increased, the necessary minimum distance of the diffusion of impurities in the crosswise direction is increased. In addition, if the widths of the stripe shape portion of the gate electrode and the floating gate electrode are increased, the number of the slits and the number of the stripe shape portions that are needed for obtaining the necessary overlap amount are decreased.

If the width of the stripe shape portions of the gate electrode is decreased, the number of the slits and the number of the stripe shape portions that are needed for obtaining the necessary overlap amount are increased. In addition, if the width of the stripe shape portions of the gate electrode is decreased, the necessary minimum diffusion distance of impurities in the crosswise direction is decreased.

Half of the width of the stripe shape portions of the gate electrode and half of the width of the floating gate electrode 115 correspond to the necessary minimum diffusion distance of impurities in the crosswise direction. Therefore, it is desirable to form the stripe shape portions of the gate electrode and the floating gate electrode 115 to have the same width with each other. If the widths of the stripe shape portions of the gate electrode and the floating gate electrode 115 are different from each other, the necessary minimum diffusion distance of impurities in the crosswise direction is half of the width of the widest of the stripe shape portion and the floating gate electrode 115.

Therefore, it is desirable to define the widths of the slit, the stripe shape portion, and the floating gate electrode 115 of the gate electrode in consideration of the above described relations. In the third embodiment of the present invention, as a typical example, it is possible to set the width L2 of the first stripe shape portion 106-1, the width L3 of the second slit 107-2, the width L4 of the second stripe shape portion 106-2, and the width L6 of the floating gate electrode 115 to be 0.3 µm, and set the L1 of the first slit 107-1 to 0.2 µm, and set the width L5 of the third slit 107-3 to 0.4 µm. In this case, the overlap dimension Ld is derived by the sum of "0.3 µm×2+0.2 µm+0.3 µm" and the distance L7 of the thermal diffusion of impurities in the horizontal direction. Also, the necessary minimum distance of the thermal diffusion of impurities in the horizontal direction is 0.15 µm (i.e., 0.3 µm/2=0.15 µm). If a step of the necessary minimum thermal diffusion of impurities is conducted, the finished overlap dimension Ld is 1.25 (i.e., 0.3 µm×2+0.2 µm+0.3 µm+0.3 m/2=1.25 µm). In this case, the integrated lightly doped impurity diffusion region has a heterogeneous impurity concentration profile in the first horizontal direction. Also, the finished gate overlap dimension Ld is more than 1.25 µm (i.e., Ld>0.3 µm×2+0.2 µm+0.3 µm+0.3 µm/2=1.25 µm) if a step of the thermal diffusion of impurities is conducted until the thermal diffusions in the crosswise direction are overlapped with each other so that the integrated lightly doped impurity diffusion region has the homogeneous impurity concentration profile in the first horizontal direction.

In the third embodiment of the present invention, three slits are formed, however, it is possible to arbitrarily change the number of the slits according to the demanded gate overlap dimension Ld. As described above, the maximum width of the slits is defined by the necessary minimum electric field applied to the above described electric field reduction region based on the gate potential and the maximum width that is needed for obtaining the necessary minimum electric field reduction effect. As an example, the maximum width of the slits can be set to 1.0 µm. The minimum width of the slits is defined by the limit width for which patterning can be conducted. Also, as an example, the minimum width of the slits can be set to 0.1 µm. If the gate overlap amount of approximately 2.0 µm, which is needed for a 40 V voltage resistant MOS transistor, is required to be obtained in forming a single slit, the width of this single slit needs to be set to more than 1.55 µm. However, if the extremely wide single slit as just stated is formed, it is impossible to obtain the necessary minimum electric field applied to the above described electric field reduction region and the necessary minimum electric field reduction effect. Therefore, at least a plurality of slits need to be formed in order to obtain the large gate overlap amount that is required for a high voltage resistant MOS transistor.

Method for Manufacturing the High Voltage Resistant MOS Transistor

With reference to the accompanying drawings, a method for manufacturing the high voltage resistant MOS transistor in accordance with the third embodiment of the present invention is hereinafter explained.

Figure 30:
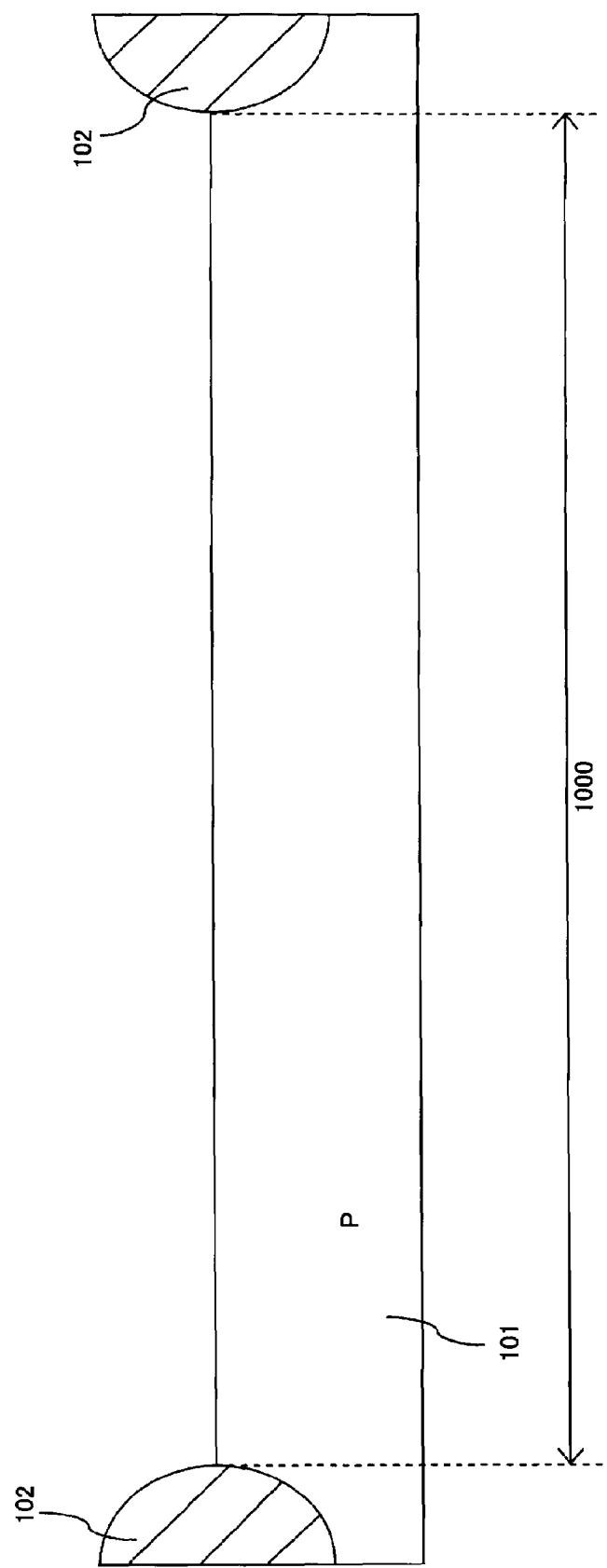
FIG. 30 is a partial vertical cross-section diagram showing a step of a method for manufacturing a high voltage resistant MOS transistor in accordance with the third embodiment of the present invention.

FIGS. 30 to 40 are partial vertical cross-section diagrams showing a manufacturing process of the high voltage resistant MOS transistor in accordance with the third embodiment of the present invention. As shown in FIG. 30, a field oxide film 102 is formed in an element isolation region of a p-type semiconductor substrate 101 with a local oxidation of silicon (LOCOS) method. Thus an active region 1000 is defined by the field oxide film 102. The active region 1000 is a region in which a high voltage resistant MOS transistor is formed.

Figure 31:
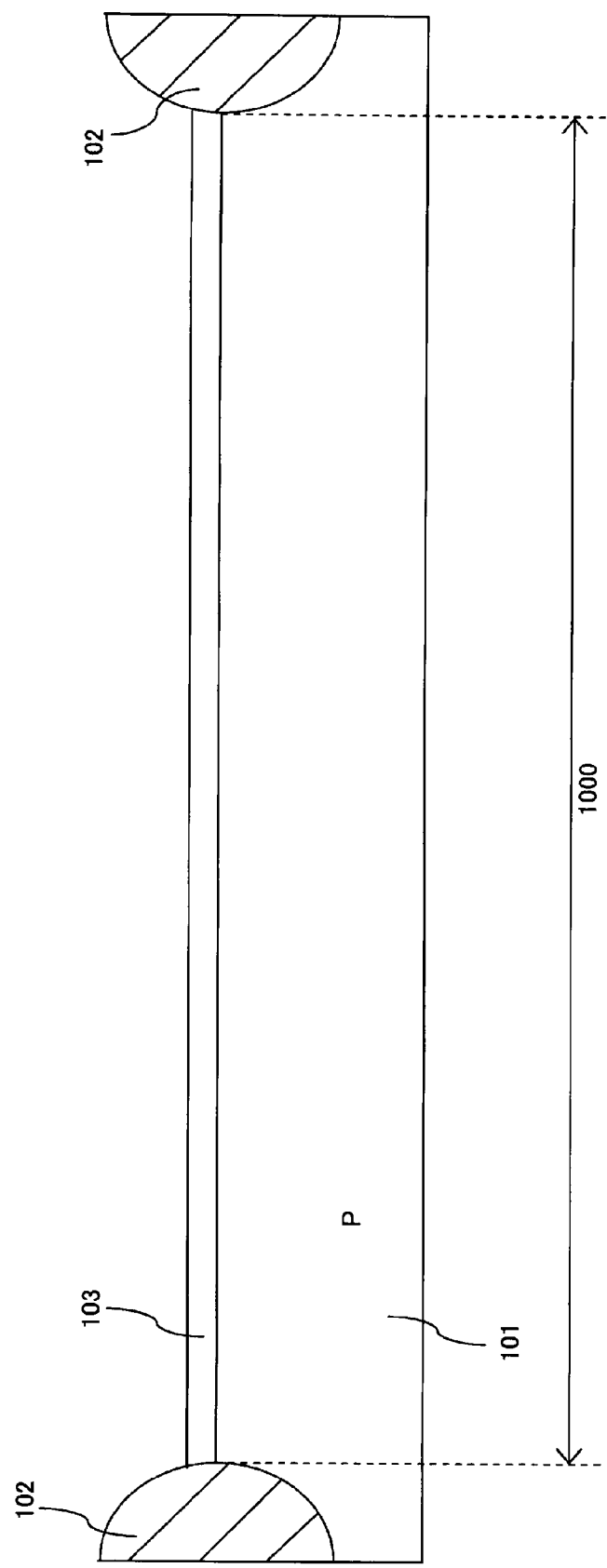
FIG. 31 is a partial vertical cross-section diagram showing a step of a method for manufacturing a high voltage resistant MOS transistor in accordance with the third embodiment of the present invention.

As shown in FIG. 31, a silicon dioxide film 103 of 100 Å in thickness is formed on the p-type semiconductor substrate 101 and the field oxide film 102 with a heretofore known method. Thermal oxidization methods and various types of chemical vapor deposition (CVD) methods can be used as a typical example of the heretofore known methods.

Figure 32:
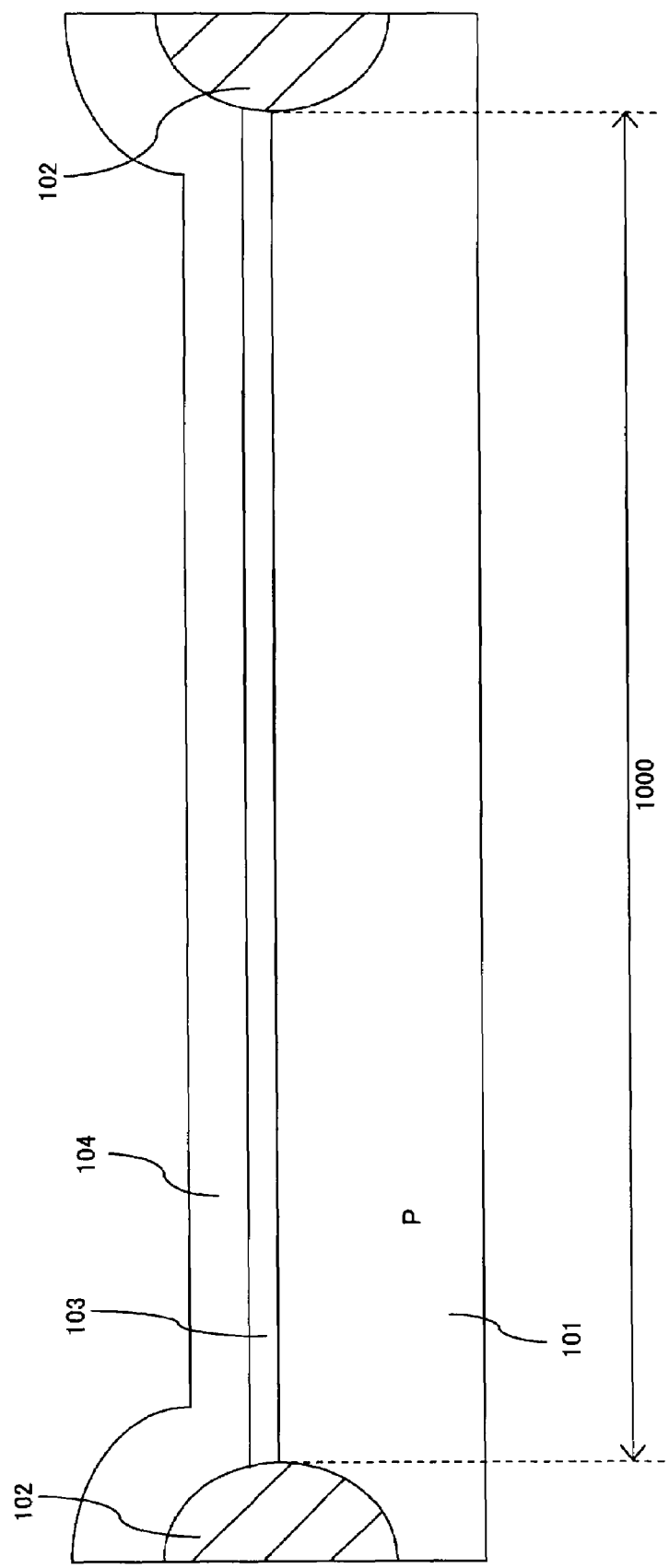
FIG. 32 is a partial vertical cross-section diagram showing a step of a method for manufacturing a high voltage resistant MOS transistor in accordance with the third embodiment of the present invention.
Figure 33:
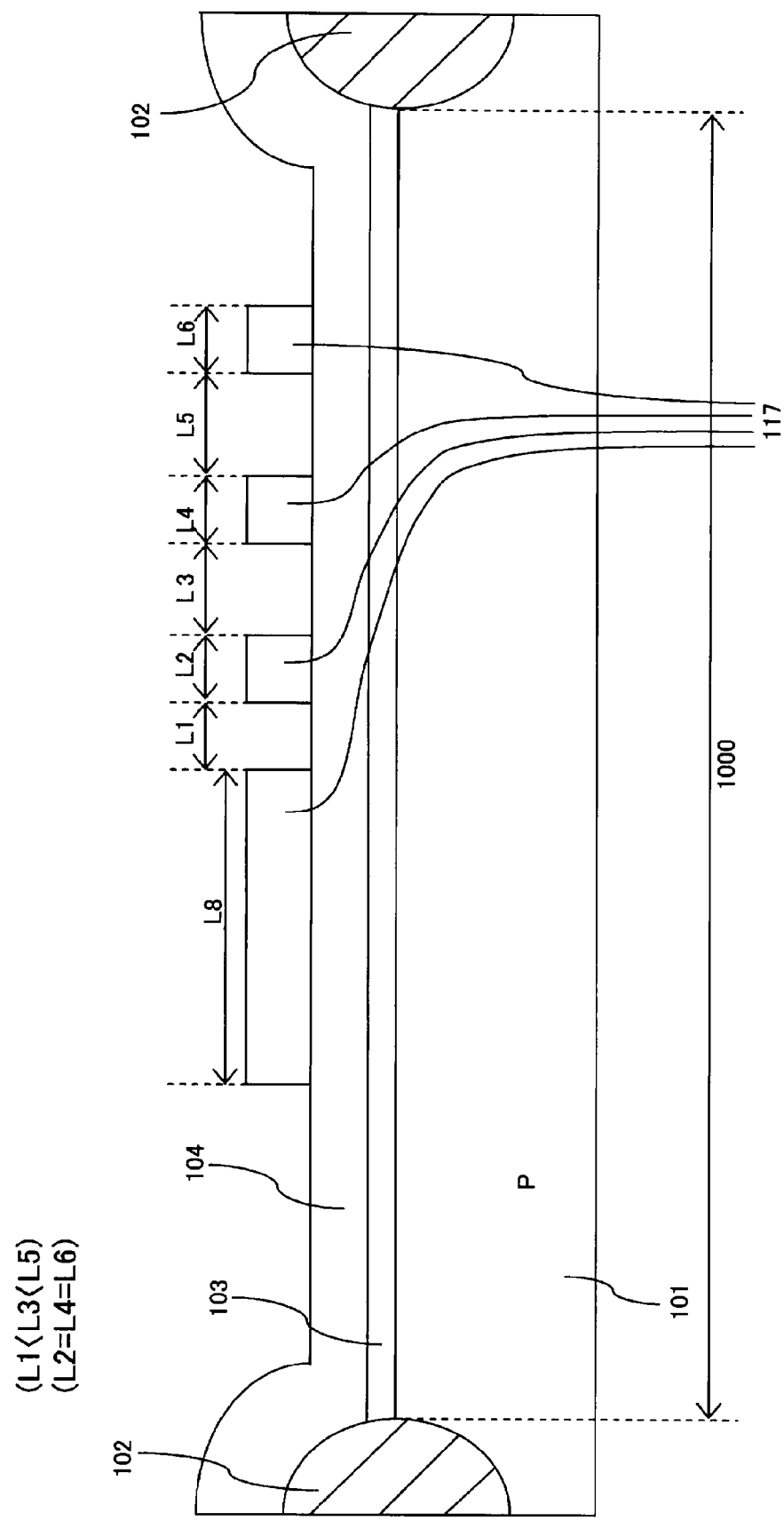
FIG. 33 is a partial vertical cross-section diagram showing a step of a method for manufacturing a high voltage resistant MOS transistor in accordance with the third embodiment of the present invention.

As shown in FIG. 32, a polysilicon film 104 is formed on the silicon dioxide film 103 with a heretofore known CVD method. As shown in FIG. 33, a resist pattern 117 is formed on the polysilicon film 104 with a heretofore known lithography technique. The resist pattern 117 includes three slit shape openings with different widths. More specifically, the resist pattern 117 is comprised of a sheet portion, three stripe shape portions with different widths, and three slits with different widths. Widths of the three slits are L1, L3, and L5, respectively, and widths of the three stripe shape portions are L2, L4, and L6, respectively. Here, the widths of the three slits and the three stripe shape portions have the following relation: L1<L2=L4=L6=L3<L5. Also, width of the sheet portion is L8. Two stripe shape portions of the three stripe shape portions, which are closer to the sheet portion, are formed to be integrated with the sheet portion through a side region. On the other hand, the most-distant stripe shape portion from the sheet portion is separated from the above described integrated portion through the widest slit.

Figure 34:
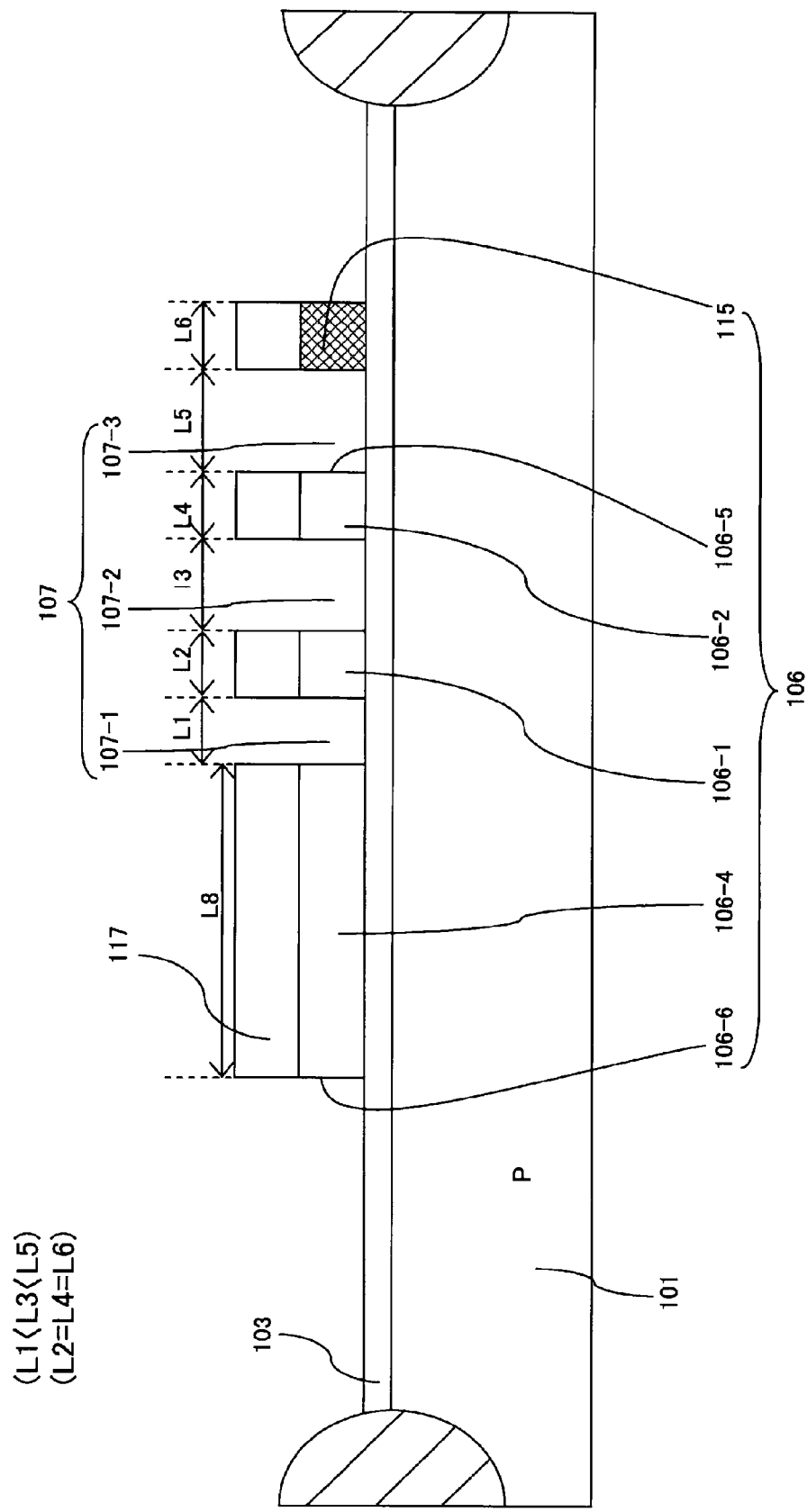
FIG. 34 is a partial vertical cross-section diagram showing a step of a method for manufacturing a high voltage resistant MOS transistor in accordance with the third embodiment of the present invention.

As shown in FIG. 34, the polysilicon film 104 is selectively etched by using the resist pattern 117 as a mask, and thus a gate electrode 106 is formed. As shown in FIG. 29, the gate electrode 106 includes a first stripe shape portion 106-1, a second stripe shape portion 106-2, a floating gate electrode 115, a sheet portion 106-4, a first edge 106-5, a second edge 106-6, a second side region 106-8, and a slit group 107. The slit group 107 is comprised of a first slit 107-1, a second slit 107-2, and a third slit 107-3. Also, these slits 107-1, 107-2, and 107-3 are separated from each other in the first horizontal direction, and longitudinally formed in the second horizontal direction. The sheet portion 106-4 is two-dimensionally formed on the gate insulating film 103 above a channel region and has the width L8 corresponding to the eighth dimension L8.

The first stripe shape portion 106-1 has the width L2 corresponding to the second dimension L2 and separated from the sheet portion 106-4 through the first slit 107-1 with the width L1 corresponding to the first dimension L1 in the first horizontal direction. The second stripe shape portion 106-2 has the width L4 corresponding to the fourth dimension L4 and separated from the first stripe shape portion 106-1 through the second slit 107-2 with the width L3 corresponding to the third dimension L3 in the first horizontal direction. The floating gate electrode 115 has the width L6 corresponding to the sixth dimension L6 and separated from the second stripe shape portion 106-2 through the third slit 107-3 with the width L5 corresponding to the fifth dimension L5 in the first horizontal direction. The second side region 106-8 is longitudinally formed along the first horizontal direction. Both ends of the first slit 107-1 and the second slit 107-2 are abutted against the second side region 106-8, respectively. In other words, the first stripe shape portion 106-1, the second stripe shape portion 106-2, and the sheet portion 106-4 are connected with each other through the second side region 106-8. On the other hand, the floating gate electrode 115 is separated from the first stripe shape portion 106-1, the second stripe shape portion 106-2, and the sheet portion 106-4. Also, the floating gate electrode 115 is not connected to the second side region 106-8. That is to say, the gate electrode 106 includes the slit group 107, an integrated structure comprised of the first stripe shape portion 106-1, the second stripe shape portion 106-2, the sheet portion 106-4, and the second side region 106-8, and the floating gate electrode 115 separated from this integrated structure.

The first slit 107-1, the second slit 107-2, and the third slit 107-3 are formed to reach to the element isolation region across the boundary between the active region 1000 and the element isolation region comprised of the fixed oxide film 102. Ends of the first slit 107-1 and the second slit 107-2 are terminated on the second side region 106-8 of the gate electrode 106, respectively. Therefore, the second side region 106-8 of the gate electrode 106 is formed on the element isolation region comprised of the field oxide film 102.

Widths of the first slit 107-1, the second slit 107-2, and the third slit 107-3 are different from each other. Specifically, the width L3 of the second slit 107-2 is larger than the width L1 of the first slit 107-1, and the width L5 of the third slit 107-3 is larger than the width L3 of the second slit 107-2 (i.e., L1<L3<L5). Also, widths of the first stripe shape portion 106-1, the second stripe shape portion 106-2, and the floating gate electrode 115 of the gate electrode 106 are the same (i.e., L2=L4=L6). In addition, the width L3 of the second slit 107-2 and widths of the first stripe shape portion 106-1, the second stripe shape portion 106-2, and the floating gate electrode 115 of the gate electrode 106 (i.e., L2=L4=L6) can be set to the same. In this case, the following relation is realized: L1<L2=L4=L6=L3<L5.

As described above, the gate voltage that is applied to the gate electrode 106 is not applied to the floating gate electrode 115. In addition, the floating gate electrode 115 is not influenced by this gate electrode. Therefore, an integrated portion is comprised of the portions of the gate electrode 106 excluding the floating gate electrode 115, that is, the sheet portion 106-4, the first stripe shape portion 106-1, the second stripe shape portion 106-2, the second side region 106-8. This integrated portion has a gate potential. Therefore, the electric field based on the gate potential is applied to a portion of the above described integrated lightly doped impurity diffusion region and the channel region by the above described integrated portion. A region of the above described integrated lightly doped impurity diffusion region to which this electric field based on this gate potential is applied corresponds to the electric field reduction region. Here, the first edge 106-5 of the gate electrode 106 is a sidewall of the second stripe shape portion 106-2 and faces the floating gate electrode 115.

Furthermore, the width of the gate electrode 106 corresponds to the sum of the width L1 of the first slit 107-1, the width L2 of the first stripe shape portion 106-1, the width L3 of the second slit 107-2, the width L4 of the second stripe shape portion 106-2, and the width L8 of the sheet portion 106-4 (i.e., L1+L2+L3+L4+L8). In the third embodiment of the present invention, the arithmetic average of widths of the first slit 107-1, the second slit 107-2, and the third slit 107-3 is set to 0.3 μm and widths of the first stripe shape portion 106-1, the second stripe shape portion 106-2, and the floating gate electrode 115 of the gate electrode 106 are all set to the identical value 0.3 m (i.e., L2=L4=L6=0.3 μm).

As shown in FIG. 34, the resist pattern 117 is eliminated with a heretofore known method.

Then, with a heretofore known ion implantation technique, the n-type impurity phosphorus (P) is selectively implanted into the principal surface of the p-type semiconductor substrate 101 through the gate insulating film 103 in the vertical direction by using the gate electrode 106 as a mask with an acceleration energy of 150 keV and the dose amount of 6.0× $10^{12}$ cm$^{-2}$. As a result, a first lightly doped N$^-$ implantation region 108-1 is selectively formed in the upper region of the p-type semiconductor substrate 101 located below the first slit 107-1 of the gate electrode 106. A second lightly doped N$^-$ implantation region 108-2 is selectively formed in the upper region of the p-type semiconductor substrate 101 located below the second slit 107-2 of the gate electrode 106. A third lightly doped N$^-$ implantation region 108-3 is selectively formed in the upper region of the p-type semiconductor substrate 101 located below the third slit 107-3 of the gate electrode 106. A fourth lightly doped N$^-$ implantation region 108-4 is selectively formed in the upper region of the p-type semiconductor substrate 101 located below the outer side of the second edge 106-6 of the gate electrode 106. A fifth lightly doped N$^-$ implantation region 108-5 is selectively formed in the upper region of the p-type semiconductor substrate 101 located below the outer side of the floating gate electrode 115.

That is, the first lightly doped N$^-$ implantation region 108-1 is formed to be self-aligned with the first slit 107-1 of the gate electrode 106. Here, the positions of both edges of the first lightly doped N$^-$ implantation region 108-1 correspond to the positions of both sidewalls of the first slit 107-1 in the first horizontal direction. The second lightly doped N$^-$ implantation region 108-2 is formed to be self-aligned with the second slit 107-2 of the gate electrode 106. Here, the positions of both edges of the second lightly doped N⁻ implantation region 108-2 correspond to the positions of both sidewalls of the second slit 107-2 in the first horizontal direction.

The third lightly doped N⁻ implantation region 108-3 is formed to be self-aligned with the third slit 107-3 of the gate electrode 106. Here, the positions of both edges of the third lightly doped N⁻ implantation region 108-3 correspond to the positions of both sidewalls of the third slit 107-3 in the first horizontal direction. The fourth first lightly doped N⁻ implantation region 108-4 is formed to be self-aligned with the second edge 106-6 of the gate electrode 106. The fifth first lightly doped N⁻ implantation region 108-5 is formed to be self-aligned with the floating gate electrode 115 included in the gate electrode 106. Therefore, the width of the first lightly doped N⁻ implantation region 108-1 is defined by the width L1 of the first slit 107-1. Also, the width of the second lightly doped N⁻ implantation region 108-2 is defined by the width L3 of the second slit 107-2. In addition, the width of the third lightly doped N⁻ implantation region 108-3 is defined by the width L5 of the third slit 107-3.

Each of the first slit 107-1, the second slit 107-2, and the third slit 107-3 functions as a window of ion implantation. The aspect ratios of those slits are defined by the ratio of its depth with respect to its width. The depth of the slit corresponds to the thickness of the film comprising the gate electrode 106. When the aspect ratio of the slit is increased, that makes it difficult for impurity ions to be implanted. When the width of the slit is decreased, that prevents impurity ions from being implanted. This is because the depth of the slit is constant. Therefore, the impurity concentration of the first lightly doped N⁻ implantation region 108-1 is lower than that of the second lightly doped N⁻ implantation region 108-2. Also, the impurity concentration of the second lightly doped N⁻ implantation region 108-2 is lower than that of the third lightly doped N⁻ implantation region 108-3.

Figure 35:
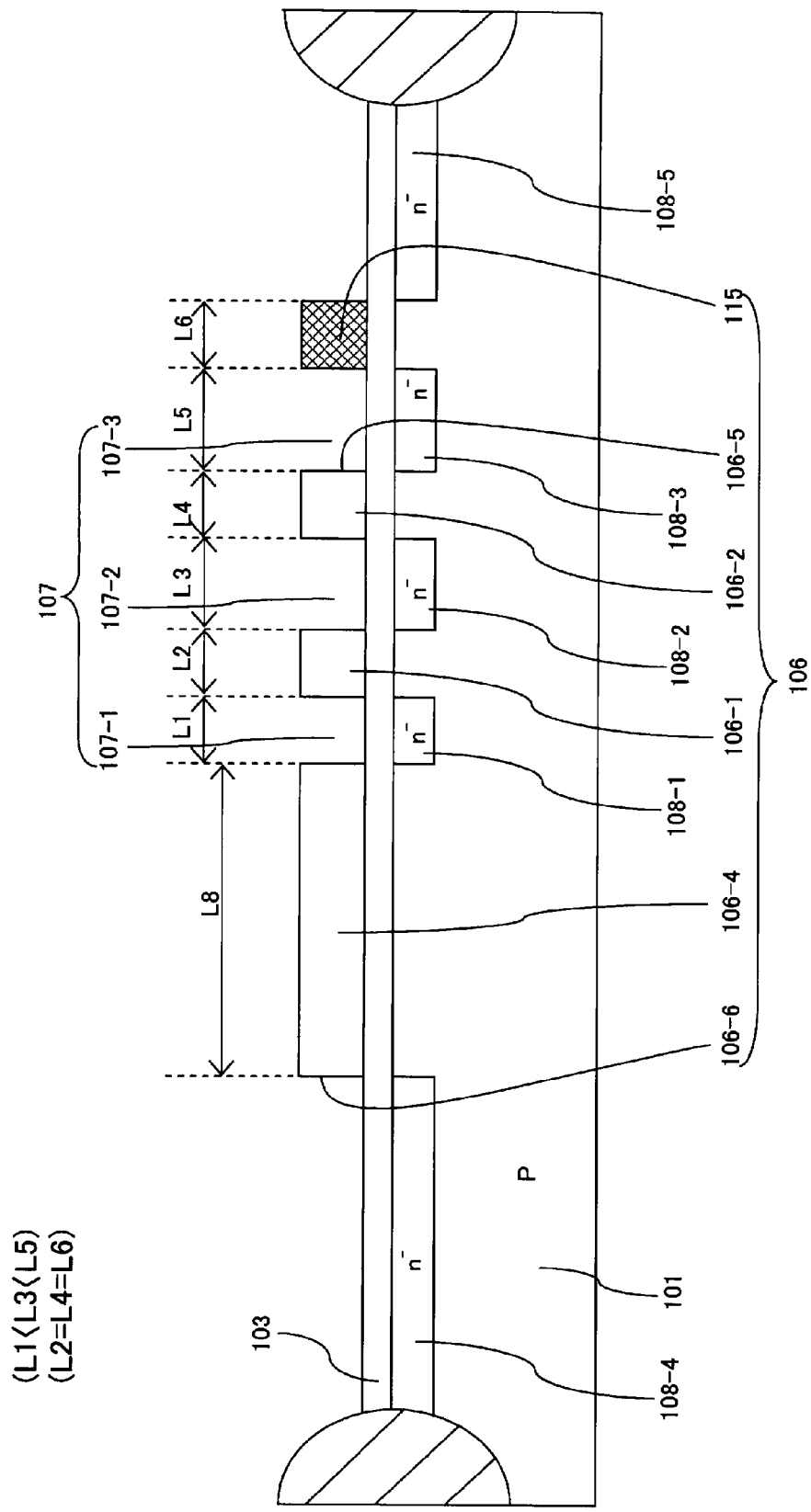
FIG. 35 is a partial vertical cross-section diagram showing a step of a method for manufacturing a high voltage resistant MOS transistor in accordance with the third embodiment of the present invention.
Figure 36:
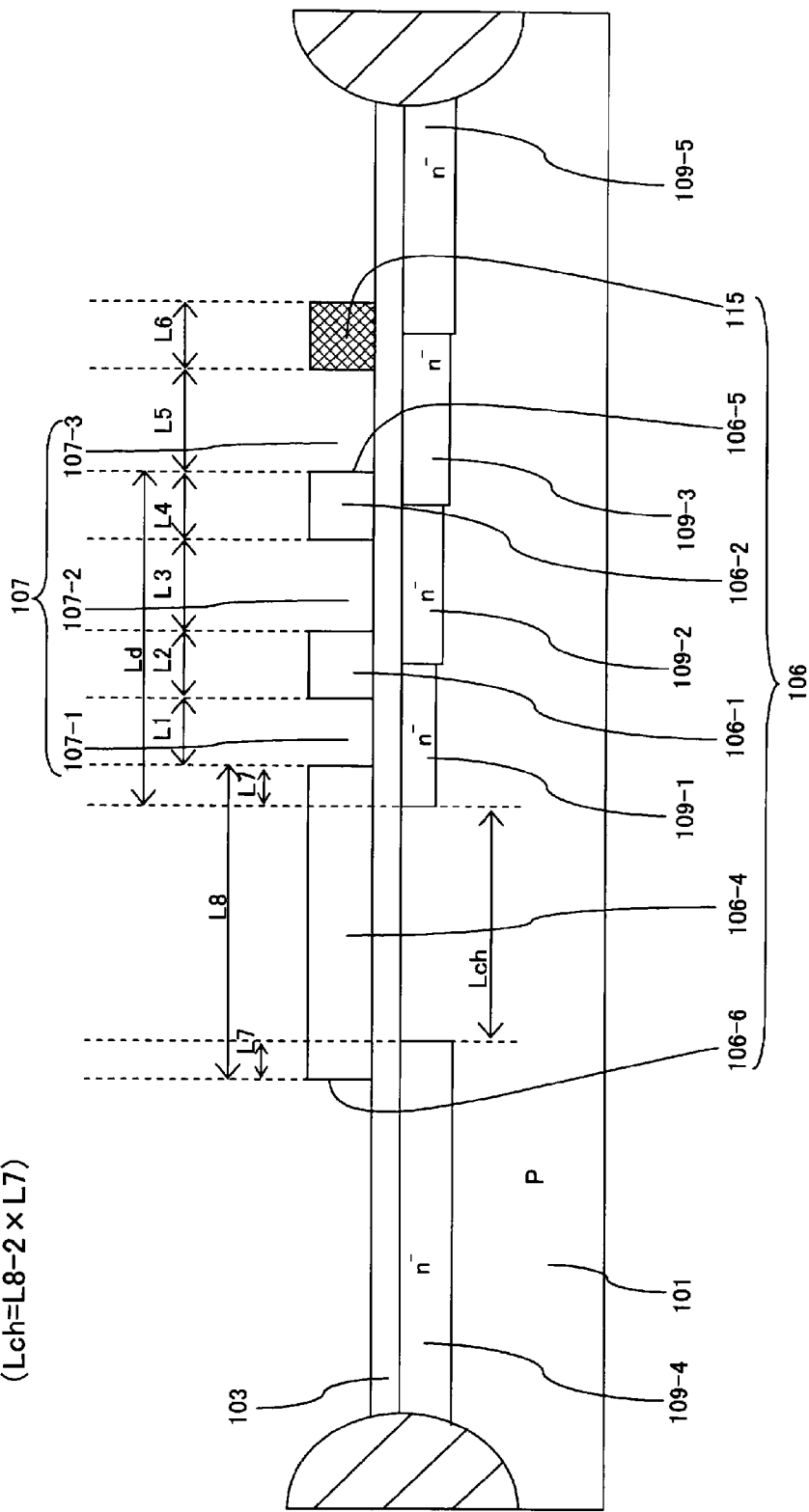
FIG. 36 is a partial vertical cross-section diagram showing a step of a method for manufacturing a high voltage resistant MOS transistor in accordance with the third embodiment of the present invention.
Figure 43A:
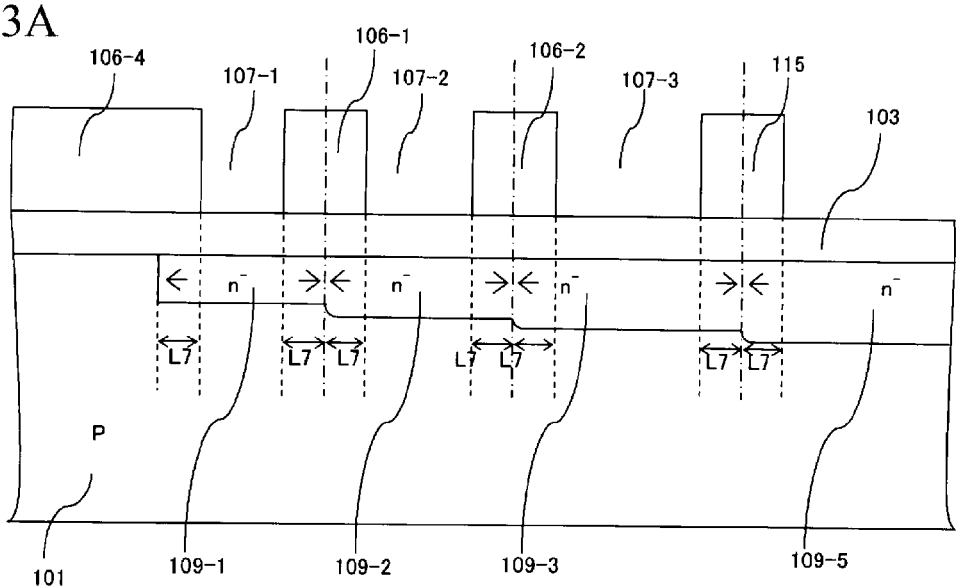
FIGS. 43A and 43B are partial vertical cross-section diagrams showing a relationship between a distance of thermal diffusion of impurities along the first horizontal direction and a width of a stripe shape portion of a gate electrode in a step of a method for manufacturing a high voltage resistant MOS transistor in accordance with the third embodiment of the present invention.
Figure 43B:
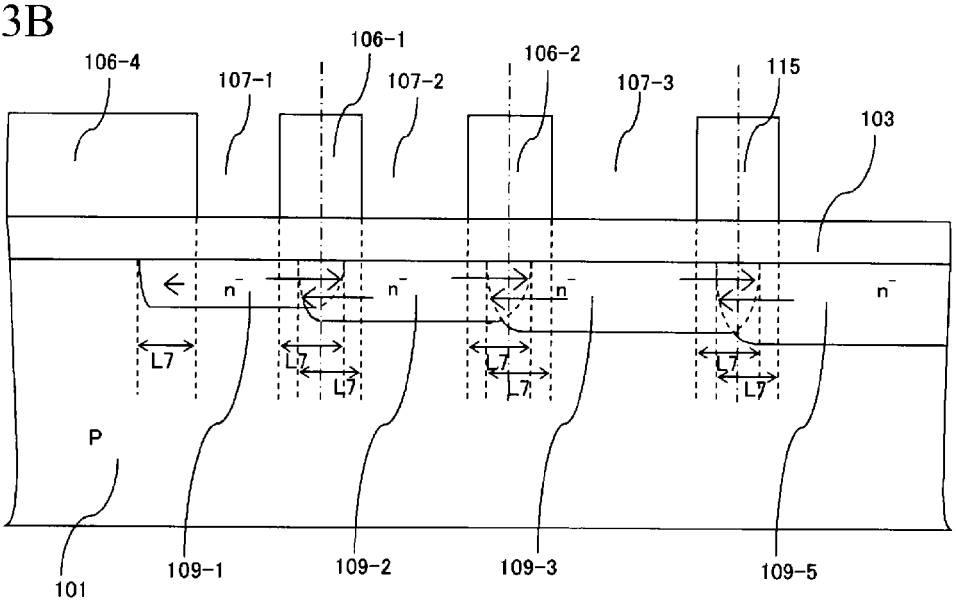

As shown in FIGS. 36, 43A and 43B, the above described ion implanted impurities are activated and thermally diffused by a thermal treatment in the $N_2$ atmosphere at 1000 degrees Celsius for approximately 100 minutes with a heretofore known thermal diffusion technique. The thermal diffusion of impurities is isotropic. Therefore, impurities are diffused in the depth direction and the horizontal direction (i.e., the crosswise direction). As a result, the first lightly doped N⁻ implantation region 108-1, the second lightly doped N⁻ implantation region 108-2, the third lightly doped N⁻ implantation region 108-3, the fourth lightly doped N⁻ implantation region 108-4, and the fifth lightly doped N⁻ implantation region 108-5 are turned into a first lightly doped N⁻ diffusion layer 109-1, a second lightly doped N⁻ diffusion layer 109-2, a third lightly doped N⁻ diffusion layer 109-3, a fourth lightly doped N⁻ diffusion layer 109-4, and a fifth lightly doped N⁻ diffusion layer 109-5, respectively. As shown in FIG. 35, the first lightly doped N⁻ implantation region 108-1 is self-aligned with the first slit 107-1 of the gate electrode 106, and the thermal diffusion of impurities is isotropic. Therefore, the center location of the first lightly doped N⁻ diffusion layer 109-1 is self-aligned with the center location of the first slit 107-1 in the first horizontal direction. Also, the second lightly doped N⁻ implantation region 108-2 is self-aligned with the second slit 107-2 of the gate electrode 106, and the thermal diffusion of impurities is isotropic. Therefore, the central location of the second lightly doped N⁻ diffusion layer 109-2 is self-aligned with the central location of the second slit 107-2 in the first horizontal direction. In addition, the third lightly doped N⁻ implantation region 108-3 is self-aligned with the third slit 107-3 of the gate electrode 106 and the thermal diffusion of impurities is isotropic. Therefore, the central location of the third lightly doped N⁻ diffusion layer 109-3 is self-aligned with the central location of the third slit 107-3 in the first horizontal direction.

Also, the width L1 of the first slit 107-1, the width L3 of the second slit 107-2, and the width L5 of the third slit 107-3 are different from each other. Therefore, the depth of the second lightly doped N⁻ diffusion layer 109-2 is deeper than that of the first lightly doped N⁻ diffusion layer 109-1. Also, the depth of the third lightly doped N⁻ diffusion layer 109-3 is deeper than that of the second lightly doped N⁻ diffusion layer 109-2. In addition, the width of the second lightly doped N⁻ diffusion layer 109-2 is larger than that of the first lightly doped N⁻ diffusion layer 109-1. Also, the width of the third lightly doped N⁻ diffusion layer 109-3 is larger than that of the second lightly doped N⁻ diffusion layer 109-2. Furthermore, the impurity concentration of the second lightly doped N⁻ diffusion layer 109-2 is higher than that of the first lightly doped N⁻ diffusion layer 109-1. Also, the impurity concentration of the third lightly doped N⁻ diffusion layer 109-3 is higher than that of the second lightly doped N⁻ diffusion layer 109-2.

The first lightly doped N⁻ diffusion layer 109-1 and the second lightly doped N⁻ diffusion layer 109-2 are required to be adjacently formed without any space. The second lightly doped N⁻ diffusion layer 109-2 and the third lightly doped N⁻ diffusion layer 109-3 are required to be adjacently formed without any space. The third lightly doped N⁻ diffusion layer 109-3 and the fifth lightly doped N⁻ diffusion layer 109-5 are adjacently formed without any space. Furthermore, the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 are required to form an integrated lightly doped impurity diffusion region.

The depth of this integrated lightly doped impurity diffusion region gradually becomes shallower towards the channel region and the impurity concentration of it gradually becomes lower towards the channel region. When the impurity concentration of the electric field reduction region is reduced, that makes it easy for the voltage resistant property of a MOS transistor to be improved. However, that makes it difficult for the drive capability of a MOS transistor to be improved. On the other hand, when the impurity concentration of the electric field reduction region is increased, that makes it easy for the drive capability of a MOS transistor to be improved. However, that makes it difficult for the voltage resistant property of a MOS transistor to be improved. Especially, when the impurity concentration of a closer portion of the electric field reduction region from the channel region is reduced, it effectively works for improvement of the voltage resistant property of a MOS transistor. On the other hand, when the impurity concentration of a more distant portion of the electric field reduction region from the channel region is increased, it effectively works for improvement of the drive capability of a MOS transistor. The impurity concentration of the electric field reduction region included in the above described integrated lightly doped impurity diffusion region is decreased towards the channel region and increased with distant from the channel region. Therefore, this electric field reduction region has an impurity concentration profile in the first horizontal direction, which is effective for improvements of the voltage resistant property and the drive capability of a MOS transistor.

In order to form the above described integrated lightly doped impurity diffusion region, the distance L7 of the thermal diffusion of impurities in the crosswise direction needs to be set to at least half of the widths of the first stripe shape portion 106-1, the second stripe shape portion 106-2, and the floating gate electrode 115 of the gate electrode 106 (i.e., L2/2=L4/2=L6/2=0.3 μm/2=0.15 μm). Also, as described above, the lightly doped impurity implantation regions are selectively formed in the region of the p-type semiconductor substrate 101 located below the first slit 107-1, the second slit 107-2, and the third slit 107-3 by conducting an ion implantation step by using the gate electrode 106 having the slit group 107 as a mask. In this phase, the positions of both edges of the lightly doped impurity implantation regions are self-aligned with the positions of both ends of the first slit 107-1, the second slit 107-2, and the third slit 107-3. Also, the adjacent lightly doped impurity implantation regions are separated from each other by the distance corresponding to the widths of the first stripe shape portion 106-1, the second stripe shape portion 106-2, and the floating gate electrode 115 of the gate electrode 106 (i.e., L2=L4=L6=0.3 μm) in the first horizontal direction. Then, the impurity implantation regions are expanded by conducting a thermal diffusion step of impurities. This thermal diffusion step of impurities is continuously conducted until the adjacent impurity diffusion regions at least have contact with each other. As a result, the first lightly doped N⁻ diffusion layer 109-1 and the second lightly doped N⁻ diffusion layer 109-2 are adjacently formed without any space. Also, the second lightly doped N⁻ diffusion layer 109-2 and the third lightly doped N⁻ diffusion layer 109-3 are adjacently formed without any space. In addition, the third lightly doped N⁻ diffusion layer 109-3 and the fifth lightly doped N⁻ diffusion layer 109-5 are adjacently formed without any space. Furthermore, the integrated lightly doped impurity diffusion region is formed, which is comprised of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5.

FIGS. 43A and 43B are partial vertical cross-section diagrams showing the relationship between the distance of the thermal diffusion of impurities and the width of the stripe shape portion of the gate electrode in the first horizontal direction. As shown in FIG. 43A, when a thermal diffusion step of impurities is stopped at the time when the distance L7 of the thermal diffusion of impurities in the first horizontal direction reaches half of the widths of the first stripe shape portion 106-1, the second stripe shape portion 106-2, and the floating gate electrode 115 of the gate electrode 106 (i.e., L2/2=L4/2=L6/2=0.30 μm/2=0.15 μm), the diffusion fronts of impurities in the crosswise direction reach the positions corresponding to the central locations of the first stripe shape portion 106-1, the second stripe shape portion 106-2, and the floating gate electrode 115 of the gate electrode 106, respectively, in the first horizontal direction. In other words, the diffusion fronts of impurities from the adjacent lightly doped impurity implantation regions in the crosswise direction have contact with each other. This means that the impurity with the longest distance of the thermal diffusion in the crosswise direction reaches the position corresponding to the central locations of the first stripe shape portion 106-1, the second stripe shape portion 106-2, and the floating gate electrode 115 of the gate electrode 106, respectively, in the first horizontal direction. In this case, the impurity concentrations in the positions corresponding to the central locations of the first stripe shape portion 106-1, the second stripe shape portion 106-2, and the floating gate electrode 115 of the gate electrode 106 are lower than those in the positions corresponding to the central locations of the first slit 107-1, the second slit 107-2, and the third slit 107-3, respectively. In other words, the integrated lightly doped impurity diffusion region, which is comprised of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5, has a heterogeneous impurity concentration profile in the first horizontal direction.

On the other hand, as shown in FIG. 43B, when the distance L7 of the thermal diffusion of impurities are set to larger than half of the widths of the first stripe shape portion 106-1, the second stripe shape portion 106-2, and the floating gate electrode 115 of the gate electrode 106 (L2/2=L4/2=L6/2=0.3 μm/2=0.15 μm), the diffusion fronts of impurities from the adjacent lightly doped impurity implantation regions in the crosswise direction are mutually intersected. In other words, the diffusion fronts of impurities in the crosswise direction cross the positions corresponding to the central locations of the first stripe shape portion 106-1, the second stripe shape portion 106-2, and the floating gate electrode 115 of the gate electrode 106, respectively, in the first horizontal direction, and the mutually overlapped thermal diffused regions in the crosswise direction are formed in the first stripe shape portion 106-1, the second stripe shape portion 106-2, and the floating gate electrode 115 of the gate electrode 106. This means that the impurity with the longest distance of the thermal diffusion in the crosswise direction crosses the position corresponding to the central locations of the first stripe shape portion 106-1, the second stripe shape portion 106-2, and the floating gate electrode 115 of the gate electrode 106, respectively, in the first horizontal direction. The mutually overlapped thermal diffusions in the crosswise direction reduce the difference between the impurity concentrations in the positions corresponding to the central locations of the first stripe shape portion 106-1, the second stripe shape portion 106-2, and the floating gate electrode 115 of the gate electrode 106 and the impurity concentrations in the positions corresponding to the central locations of the first slit 107-1, the second slit 107-2, and the third slit 107-3, respectively. That is to say, the thermal diffusion step is continuously conducted until the thermal diffusions in the crosswise direction are mutually overlapped, and thus the above described integrated lightly doped impurity diffusion region has a more homogeneous impurity concentration profile. Therefore, in order to obtain a more homogeneous impurity concentration profile, it is desirable to continue the thermal diffusion step until the distance L7 of the thermal diffusion of impurities in the horizontal direction exceeds half of the widths of the first stripe shape portion 106-1, the second stripe shape portion 106-2, and the floating gate electrode 115 of the gate electrode 106 (i.e., L2/2=L4/2=L6/2=0.3 μm/2=0.15 μm) and the thermal diffusions in the crosswise direction are mutually overlapped. As a matter of convenience, FIG. 36 shows that the boundaries between adjacent layers of the first lightly doped N⁻ diffusion layer 109-1, the second lightly doped N⁻ diffusion layer 109-2, the third lightly doped N⁻ diffusion layer 109-3, and the fifth lightly doped N⁻ diffusion layer 109-5 are formed in the central locations of the regions in which the thermal diffusions in the crosswise direction are mutually overlapped.

As shown in FIG. 36, the inner side edge of the first lightly doped N⁻ diffusion layer 109-1 is overlapped with the sheet portion 106-4 of the gate electrode 106 by the dimension corresponding to the distance L7 of the thermal diffusion of impurities in the horizontal direction. In the same way, the inner side edge of the fourth lightly doped N⁻ diffusion layer 109-4 is overlapped with the sheet portion 106-4 of the gate electrode 106 by the dimension corresponding to the distance L7 of the thermal diffusion of impurities in the horizontal direction. The channel length Lch is defined between the inner side edge of the first lightly doped $N^-$ diffusion layer 109-1 and the inner side edge of the fourth lightly doped $N^-$ diffusion layer 109-4. Therefore, the channel length Lch is equal to the value derived by subtracting twice of the distance L7 of the thermal diffusion of impurities in the horizontal direction from the width L8 of the sheet portion 106-4 (i.e., Lch=L8−2×L7).

The floating gate electrode 115 is included in the gate electrode 106. However, the gate voltage that is applied to the gate electrode 106 is not applied to the floating gate electrode 115. In addition, the floating gate electrode is not influenced by this gate voltage. Therefore, an integrated portion is comprised of portions of the gate electrode 106 excluding the floating gate electrode 115, that is, the sheet portion 106-4, the first stripe shape portion 106-1, the second stripe shape portion 106-2, and the second side portion 108-8. This integrated portion has a gate potential. Therefore, the electric field based on the gate potential is applied to apportion of the above described integrated lightly doped impurity diffusion region and the channel region by the above described integrated portion. The region in the above described integrated lightly doped impurity diffusion region to which the electric field based on this gate potential is applied corresponds to the electric-field reduction region. Also, the first edge 106-5 of the gate electrode 106 is a sidewall of the second stripe shape portion 106-2 and faces the floating gate electrode 115. Therefore, the width of the gate electrode 106 corresponds to the sum of the width L1 of the first slit 107-1, the width L2 of the first stripe shape portion 106-1, the width L3 of the second slit 107-2, the width L4 of the second stripe shape portion 106-2, and the width L8 of the sheet portion 106-4.

The above described integrated lightly doped impurity diffusion region has portions overlapped with the gate electrode 106, and these portions function as the electric field reduction regions. In other words, the lightly doped impurity diffusion region that is overlapped with the gate electrode 106 is defined as the electric field reduction region. Therefore, the dimension of the electric field reduction region in the first horizontal direction corresponds to the dimension of the gate overlap dimension. As described above, the integrated lightly doped impurity diffusion region is comprised of the first lightly doped $N^-$ diffusion layer 109-1, the second lightly doped $N^-$ diffusion layer 109-2, the third lightly doped $N^-$ diffusion layer 109-3, and the fifth lightly doped $N^-$ diffusion layer 109-5. The gate electrode 106 includes the sheet portion 106-4, the first stripe shape portion 106-1, the second stripe shape portion 106-2, and the floating gate electrode 115. However, as described above, the gate voltage that is applied to the gate electrode 106 is not applied to the floating gate electrode 115. In addition, the floating gate electrode 115 is not influenced by the gate voltage. Therefore, an integrated portion is comprised of the portions of the gate electrode 106 excluding the floating gate electrode 115, that is, the sheet portion 106-4, the first stripe shape portion 106-1, the second stripe shape portion 106-2, and the second side region 106-8. This integrated portion has a gate potential. Therefore, the gate overlap dimension Ld is defined by the distance between the inner side edge of the first lightly doped $N^-$ diffusion layer 109-1 (i.e., the boundary between the channel region and the first lightly doped $N^-$ diffusion layer 109-1) and the first edge 106-5 of the gate electrode 106 in the first horizontal direction. Because of this, the gate overlap dimension Ld between the electric field reduction region and the gate electrode 106 is the sum of the width L1 of the first slit 107-1, the width L2 of the first stripe shape portion 106-1, the width L3 of the second slit 107-2, the width L4 of the second stripe shape portion 106-2, and the distance L7 of the thermal diffusion of impurities in the horizontal direction (i.e., Ld=L1+L2+L3+L4+L7=1.1 μm+L7). As described above, the distance L7 of the thermal diffusion of impurities in the horizontal direction is required to 0.15 μm or more. Therefore, the gate overlap dimension Ld is set to 1.25 μm or more.

Figure 37:
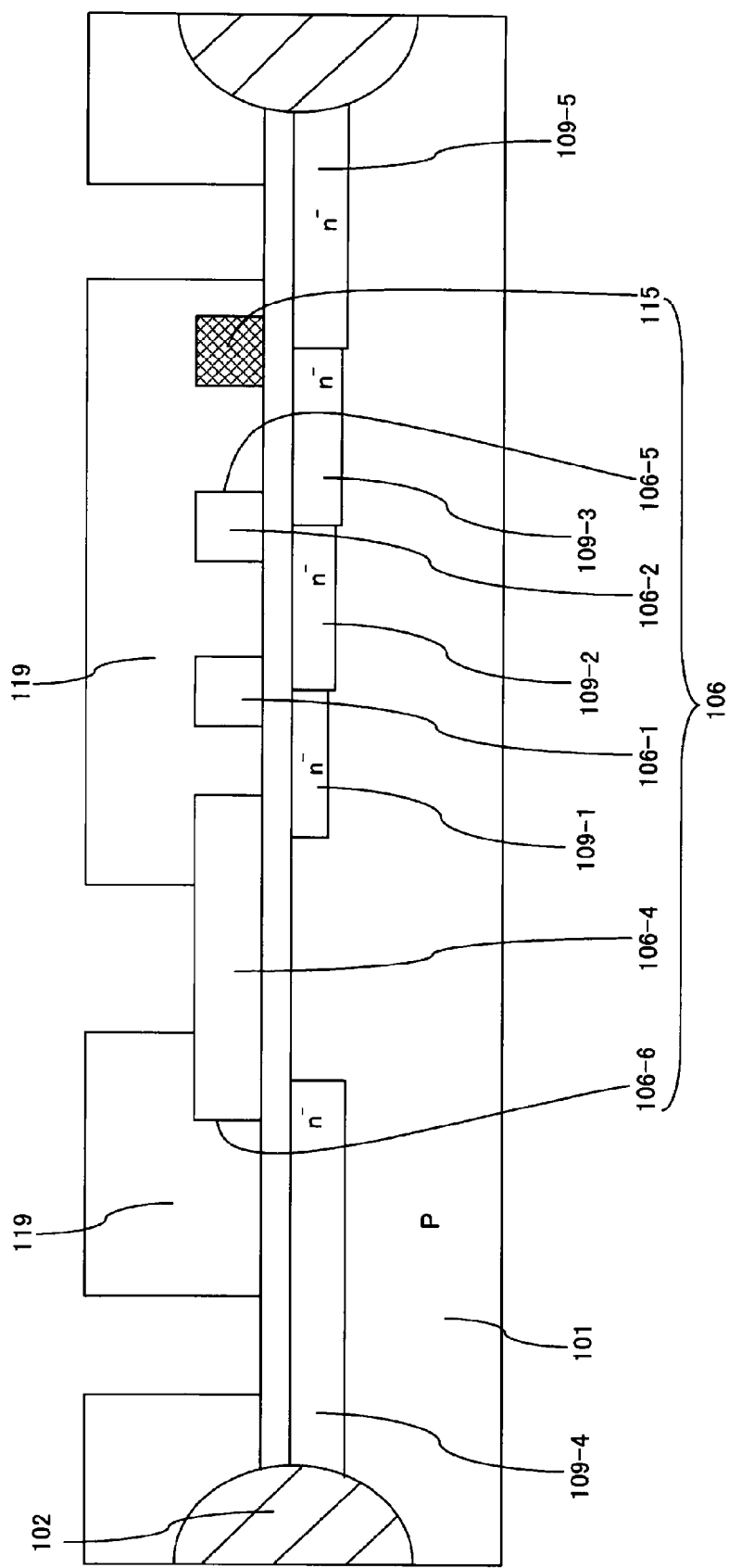
FIG. 37 is a partial vertical cross-section diagram showing a step of a method for manufacturing a high voltage resistant MOS transistor in accordance with the third embodiment of the present invention.

As shown in FIG. 37, a resist pattern 119 is formed on the gate electrode 106, the gate insulating film 103, and the field oxide film 102 with a heretofore known lithography technique.

Figure 38:
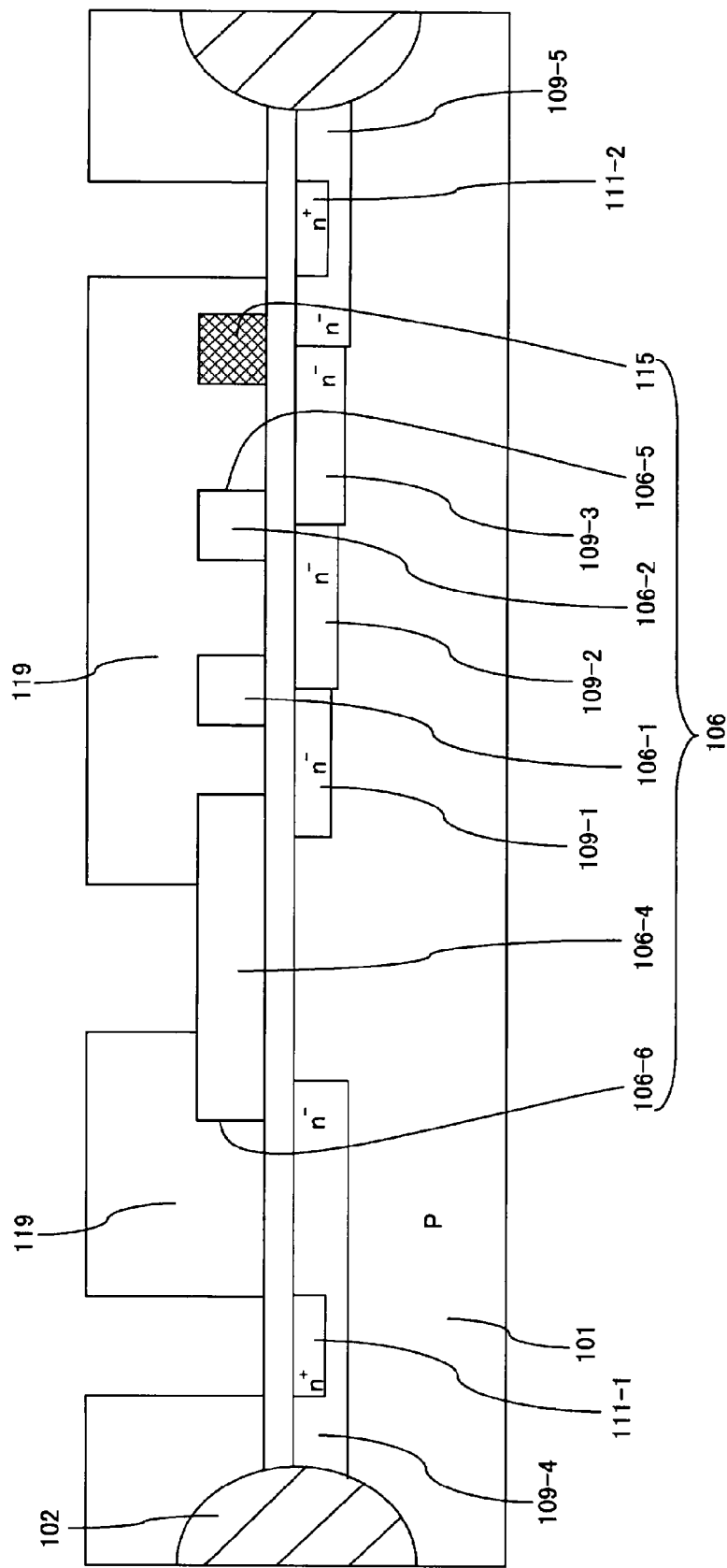
FIG. 38 is a partial vertical cross-section diagram showing a step of a method for manufacturing a high voltage resistant MOS transistor in accordance with the third embodiment of the present invention.

As shown in FIG. 38, the n-type impurity arsenic (As) is selectively implanted into the upper regions of the fourth lightly doped $N^-$ diffusion layer 109-4 and the fifth lightly doped $N^-$ diffusion layer 109-5 in the vertical direction by using the resist pattern 119 and the sheet portion 106-4 of the gate electrode 106 as a mask with an acceleration energy of 40 keV and the dose amount of $1.0 \times 10^{15}$ $cm^{-2}$. As a result, a source side first heavily doped $N^+$ diffusion layer 111-1 is selectively formed in the upper region of the fourth lightly doped $N^-$ diffusion layer 109-4, and a drain side second heavily doped $N^+$ diffusion layer 111-2 is selectively formed in the upper region of the fifth lightly doped $N^-$ diffusion layer 109-5.

Figure 39:
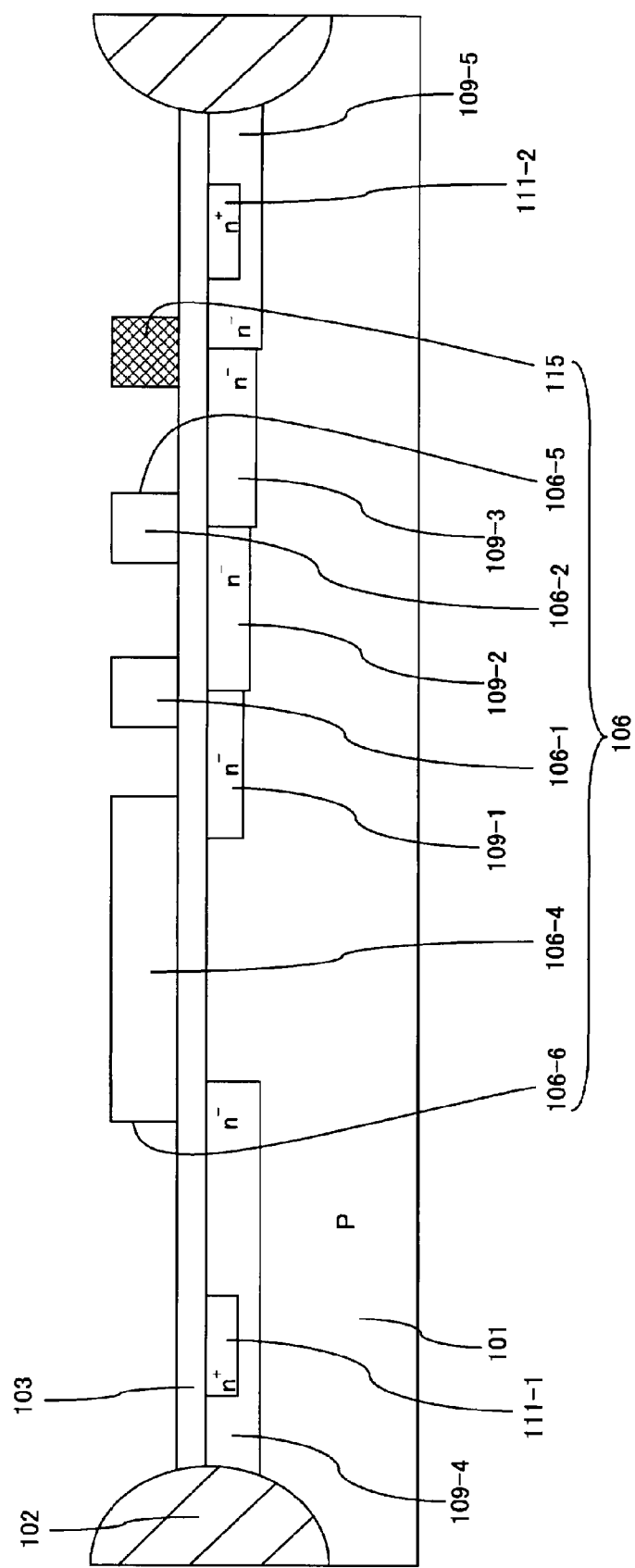
FIG. 39 is a partial vertical cross-section diagram showing a step of a method for manufacturing a high voltage resistant MOS transistor in accordance with the third embodiment of the present invention.

As shown in FIG. 39, the resist pattern 119 is eliminated with a heretofore known method.

As shown in FIG. 40, an interlayer insulating film 112 is formed on the gate electrode 106, the gate insulating film 103, and the field oxide film 102 with a heretofore known method. Then, contact holes are formed in the interlayer insulating film 112 and the gate insulating film 103. Next, a source contact 113-1 and a drain contact 113-2 are formed in the contact holes. Thus the source contact 113-1 and the drain contact 113-2 have ohmic contacts with the source side first heavily doped $N^+$ diffusion layer 111-1 and the drain side first heavily doped $N^+$ diffusion layer 111-2, respectively. Next, a source wiring layer 114-1, a drain wiring layer 114-2, and an extended portion 114-3 of the drain wiring layer are formed on the interlayer insulating film 112 with a heretofore known method. As a result, the source wiring layer 114-1 and the drain wiring layer 114-2 are electrically connected to the source side first heavily doped $N^+$ diffusion layer 111-1 and the drain side heavily doped $N^+$ diffusion layer 111-2 through the source contact 113-1 and the drain contact 113-2, respectively.

On the other hand, the extended portion 114-3 of the drain wiring layer is electrically connected to the drain wiring layer 114-2. Therefore, the extended portion 114-3 of the drain wiring layer has the same level of the electric potential with the drain wiring layer 114-2. That is to say, the drain voltage is applied to the extended portion 114-3 of the drain wiring layer. This extended portion 114-3 of the drain wiring layer is formed on the interlayer insulating film 112 and above the above described floating gate electrode 115. Because of this, the electric potential of the floating gate electrode 115 depends on that of the extended portion 114-3 of the drain wiring layer. The electric potential of the floating gate electrode 115 is raised by applying positive high voltage to the drain wiring layer 114-2 and the extended portion 114-3 of the drain wiring layer. Because of the raised electric potential of the floating gate electrode 115, the electric field based on this raised electric potential is applied to a vicinity of the upper surface of the above described integrated lightly doped impurity diffusion region, which is located below the floating gate electrode 115. Thus electrons are concentrated in the region. The electrons function as carriers of the above described integrated lightly doped impurity diffusion region. Because of this, concentration of electrons in the above described region means a pseudo-elevation of the impurity concentration of this region. Therefore, applying positive high voltage to the drain wiring layer reduces resistance of a vicinity of the upper surface of the above described integrated lightly doped impurity diffusion region, which is located below the floating gate electrode 115. This resistance reduction increases the drive capability of a MOS transistor. The pseudo-elevation of the impurity concentration, which is caused by applying positive high voltage to the drain wiring layer, is caused only on a vicinity of the upper surface of the above described integrated lightly doped impurity diffusion region. Voltage resistance of the MOS transistor depends on the impurity concentration of a vicinity of the upper surface of the above described integrated lightly doped impurity diffusion region as well as the impurity concentration of the other regions. Therefore, the above described pseudo-elevation of the impurity concentration barely has an impact on the voltage resistant property of the MOS transistor. Therefore, the drive capability of the MOS transistor can be increased with little impact on the voltage resistant property of a MOS transistor by forming the floating gate electrode 115 and the extended portion 114-3 of the drain wiring layer.

The above described interlayer insulating film 112 fills the first slit 107-1, the second slit 107-2, and the third slit 107-3. When each of the aspect ratios of the first slit 107-1, the second slit 107-2, and the third slit 107-3 is increased, this makes it difficult for each of the first slit 107-1, the second slit 107-2, and the third slit 107-3 to be filled by the interlayer insulating film 112 completely, and thus a void could be formed. However, formation of a void is not a problem as long as the interlayer insulating film 112 exerts a necessary electrolysis action. It is effective for preventing formation of a void to use a low voltage chemical vapor deposition (the low voltage CVD) with the high implantation property. Alternatively or additionally, it is effective for preventing formation of a void to form the first stripe shape portion 106-1, the second stripe shape portion 106-2, and the floating gate electrode 115 of the gate electrode 106, which have a trapezoidal vertical cross-section in the first horizontal direction.

According to the present invention, as described above, the slit group 107 comprised of slits with different widths is included. Also, ion implantation of impurities is conducted by using the gate electrode 106 having the slit group 107 as a mask, and the lightly doped impurity implantation regions 108-1 to 108-5 self-aligned with the gate electrode 106 are formed. In this phase, the positions of both edges of the lightly doped impurity implantation regions are self-aligned with the positions of both edge sidewalls of the first slit 107-1, the second slit 107-2, and the third slit 107-3, which have different widths from each other, in the first horizontal direction. In addition, the above described thermal diffusion in the crosswise direction is symmetrical in the first horizontal direction. Therefore, the central location of the first lightly doped $N^-$ diffusion layer 109-1 is self-aligned with the central location of the first slit 107-1 whose width is the narrowest among the slit group 107. The central location of the second lightly doped $N^-$ diffusion layer 109-2 is self-aligned with the central location of the second slit 107-2 whose width is medium among the slit group 107. The central location of the third lightly doped $N^-$ diffusion layer 109-3 is self-aligned with the central location of the third slit 107-3 whose width is the widest among the slit group 107. Therefore, the above described integrated lightly doped impurity diffusion region is self-aligned with the slit group 107 in the first horizontal direction. That is to say, the above described integrated lightly doped impurity diffusion region, which has changing depth in the first horizontal direction, is self-aligned with the gate electrode 106 having the slit group 107 in the position of the first horizontal direction.

The regions of the above described integrated lightly doped impurity diffusion region overlapped with the gate electrode 106 function as the electric field reduction region. Therefore, the overlap dimension Ld between the electric field reduction region and the gate electrode 106 is the sum of the width L1 of the first slit 107-1, the width L2 of the first stripe shape portion 106-1, the width L3 of the second slit 107-2 that is larger than the above described width L1, the width L4 of the second stripe shape portion 106-2, and the distance L7 of the thermal diffusion of impurities in the horizontal direction (i.e., Ld=L1+L2+L3+L4+L7).

In addition, the impurity concentration of the second lightly doped $N^-$ diffusion layer 109-2 is higher than that of the first lightly doped $N^-$ diffusion layer 109-1, and the impurity concentration of the third lightly doped $N^-$ diffusion layer 109-3 is higher than that if the second lightly doped $N^-$ diffusion layer 109-2. The depth of this integrated lightly doped impurity diffusion region becomes gradually shallower towards the channel regions and the impurity concentration of it becomes gradually decreased towards the channel region.

Also, the floating gate electrode 115 is formed on the gate insulating film 103, and the extended portion 114-3 of the drain wiring layer is formed on the interlayer insulating film 112 and above the floating gate electrode 115.

Therefore, the third embodiment of the present invention has the following effects.

First, misalignment between the patterning to form the electric field reduction region and the patterning to form the gate electrode 106 is not caused although the above described three slits have different widths from each other. Because of this, a variation from a design value of the overlap dimension Ld based on the misalignment between those patternings is not caused. Therefore, the gate overlap dimension Ld can be defined without any regard for the alignment margin between the patterning to form the electric field reduction region and the patterning to form the gate electrode 106. When a gate overlap structure is formed in a non-self-alignment fashion, a design value needs to be set to the dimension derived by adding the above described alignment margin between those patternings to the originally necessary gate overlap dimension. On the other hand, when a gate overlap structure is formed in a self-alignment fashion, the above described alignment margin between those patternings is not needed and a design value may be set to the originally necessary gate overlap dimension as it is. Because of this, the current drive capability of the high voltage resistant MOS transistor can be improved. As a result, the device size can be reduced.

Second, the gate overlap dimension Ld can be regulated by regulating the number of slits having different widths from each other. In general, a high voltage resistant MOS transistor needs the large gate overlap amount. However, a desired large gate overlap amount can be obtained by increasing the number of slits without any regard for the alignment margin between the patterning to form the electric field reduction region and the patterning to form the gate electrode 106.

Third, the integrated lightly doped impurity diffusion region including the electric field reduction region is formed by conducting ion implantation by using the gate electrode as a mask. In other words, formation of a mask comprised of a resist pattern is not needed for the ion implantation step to form the integrated impurity diffusion region including the electric field reduction region. Therefore, a MOS transistor can be manufactured in less manufacturing steps.

Fourth, the impurity concentration of the above described integrated lightly doped impurity diffusion region becomes gradually lower towards the channel region. When the impurity concentration of the electric field reduction region is decreased, this makes it easy for the high voltage property of a MOS transistor to be improved. However, this makes it difficult for the drive capability to be improved. On the other hand, when the impurity concentration of the electric field reduction region is increased, this makes it easy for the drive capability of a MOS transistor to be improved. However, this makes it difficult for the high voltage resistant property to be improved. Especially, when the impurity concentration of a closer portion of the electric field reduction region from the channel region is decreased, this effectively works for improvement of the high voltage resistant property of a MOS transistor. On the other hand, when the impurity concentration of a more distant portion of the electric field reduction region from the channel region is increased, this effectively works for improvement of the drive capability of a MOS transistor. The impurity concentration of the electric field reduction region included in the above described integrated lightly doped impurity diffusion region becomes gradually lower towards the channel region and becomes gradually higher with distant from the channel region. Therefore, this electric field reduction region has an impurity concentration profile in the first horizontal direction, which is effective for improvements of the high voltage resistant property and the drive capability of a MOS transistor.

Fifth, the electric potential of the floating gate electrode 115 is raised by applying the positive high voltage to the drain wiring layer 114-2 and the extended portion 114-3 of the drain wiring layer, and the electric field based on this raised electric potential is applied to the vicinity of the upper surface of the above described integrated lightly doped impurity diffusion region, which is located below the floating gate electrode 115, and thus electrons are concentrated on this region. As a result, resistance of the vicinity of the upper surface of the above described integrated lightly doped impurity diffusion region, which is located below the floating gate electrode 115, is reduced. Because of this reduction of resistance, the drive capability of a MOS transistor is improved. The above described pseudo-elevation of the impurity concentration, which is caused by application of the positive high voltage to the drain wiring layer, is caused only in the vicinity of the upper surface of the above described integrated lightly doped impurity diffusion region. On the other hand, the voltage resistance of a MOS transistor depends on the impurity concentration of the vicinity of the upper surface of the above described integrated lightly doped impurity diffusion region as well as the impurity concentration of the other regions. Therefore, the above described pseudo-elevation of the impurity concentration barely has an impact on the voltage resistant property of the MOS transistor. In other words, the drive capability of the MOS transistor can be increased with little impact on the voltage resistant property of a MOS transistor by forming the floating gate electrode 115 and the extended portion 114-3 of the drain wiring layer.

Also, as described above, the gate electrode 106 has three slits in the third embodiment of the present invention. However, it is possible for the gate electrode 106 to have two slits. In this case, the gate electrode 106 includes a stripe shape portion and a floating gate electrode 115.

In addition, the gate electrode 106 may include a plurality of floating gate electrodes.

ALTERNATIVE EMBODIMENTS

In the above described first to third embodiments, the gate electrode 106 is formed by patterning the polysilicon film 104. Here, the gate electrode 106 is comprised of the first region that is comprised of the sheet portion 106-4 formed above the channel region and the second region that is formed adjacent to this first region. This second region includes the one-dimensional array of the first slit 107-1, the second slit 107-2, and the third slit 107-3, which are longitudinally formed in the second horizontal direction, and the first stripe shape portion 106-1, the second stripe shape portion 106-2, and the third stripe shape portion 106-3, which separate the slit group 107 from each other. Then, impurities are ion implanted into the p-type semiconductor substrate 101 by using the gate electrode 106 having this unique pattern as a mask. Thus a plurality of impurity implantation regions 108, which are self-aligned with the first slit 107-1, the second slit 107-2, and the third slit 107-3 (i.e., the slit group 107), respectively, are formed in portions of the p-type semiconductor substrate 101 located below the above described first slit 107-1, the second slit 107-2, and the third slit 107-3. Then, an integrated impurity diffusion region comprised of a plurality of impurity diffusion regions 109, which are self-aligned with the first slit 107-1, the second slit 107-2, and the third slit 107-3, respectively and adjacently formed without any space, is formed by conducting a thermal diffusion treatment of impurities implanted into a plurality of impurity implantation regions 108. Here, the electric field reduction region is included in the integrated impurity diffusion region and formed below the second region of the gate electrode 106. Also, this electric field reduction region is self-aligned with and overlapped with the gate electrode 106.

In other words, according to the above described first to third embodiments, a plurality of openings are formed in the second region of the gate electrode that is formed adjacent to the first region formed above the channel region and formed above the electric field reduction region. Impurities are ion implanted into the semiconductor substrate by using this gate electrode as a mask. As a result, a plurality of impurity implantation regions, which are self-aligned with a plurality of openings, respectively, are formed in a portion of the semiconductor substrate located below a plurality of openings. Then, a thermal diffusion treatment is conducted with respect to the impurities implanted into a plurality of impurity implantation regions. Thus the integrated impurity diffusion region comprised of a plurality of impurity diffusion regions are formed, which are self-aligned with a plurality of openings, respectively, and adjacently formed without any space. Here, the electric field reduction region is included in the integrated impurity diffusion region and formed below the second region of the gate electrode. Also, this electric field reduction region is self-aligned with and overlapped with the gate electrode.

Within the scope of the above described invention, the following embodiments can be provided as alternative embodiments of the above described first to third embodiments.

First Alternative Embodiment

Figure 44:
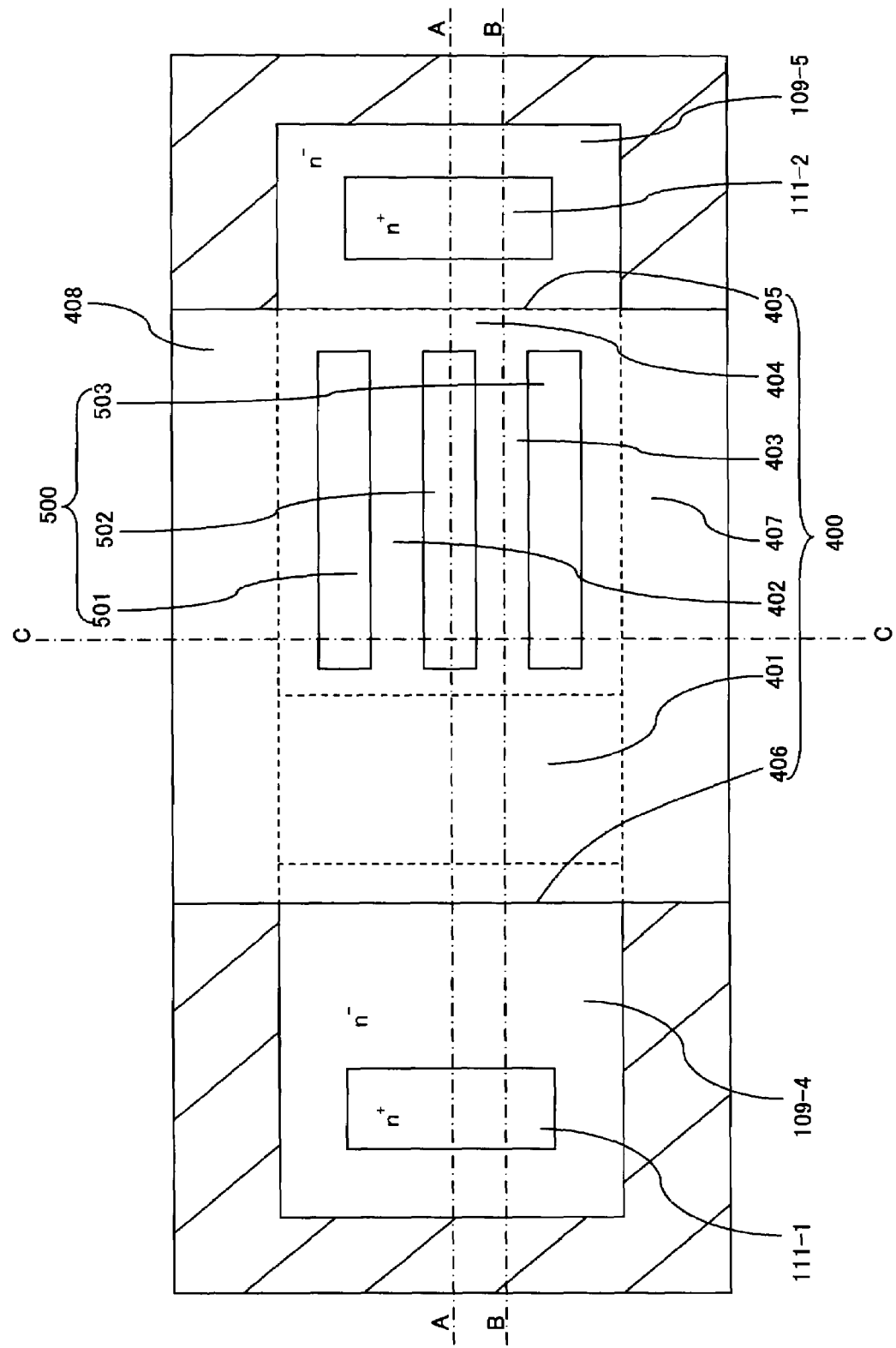
FIG. 44 is a partial plan view showing the structure of a high voltage resistant MOS transistor in accordance with a first alternative embodiment of the present invention.
Figure 45:
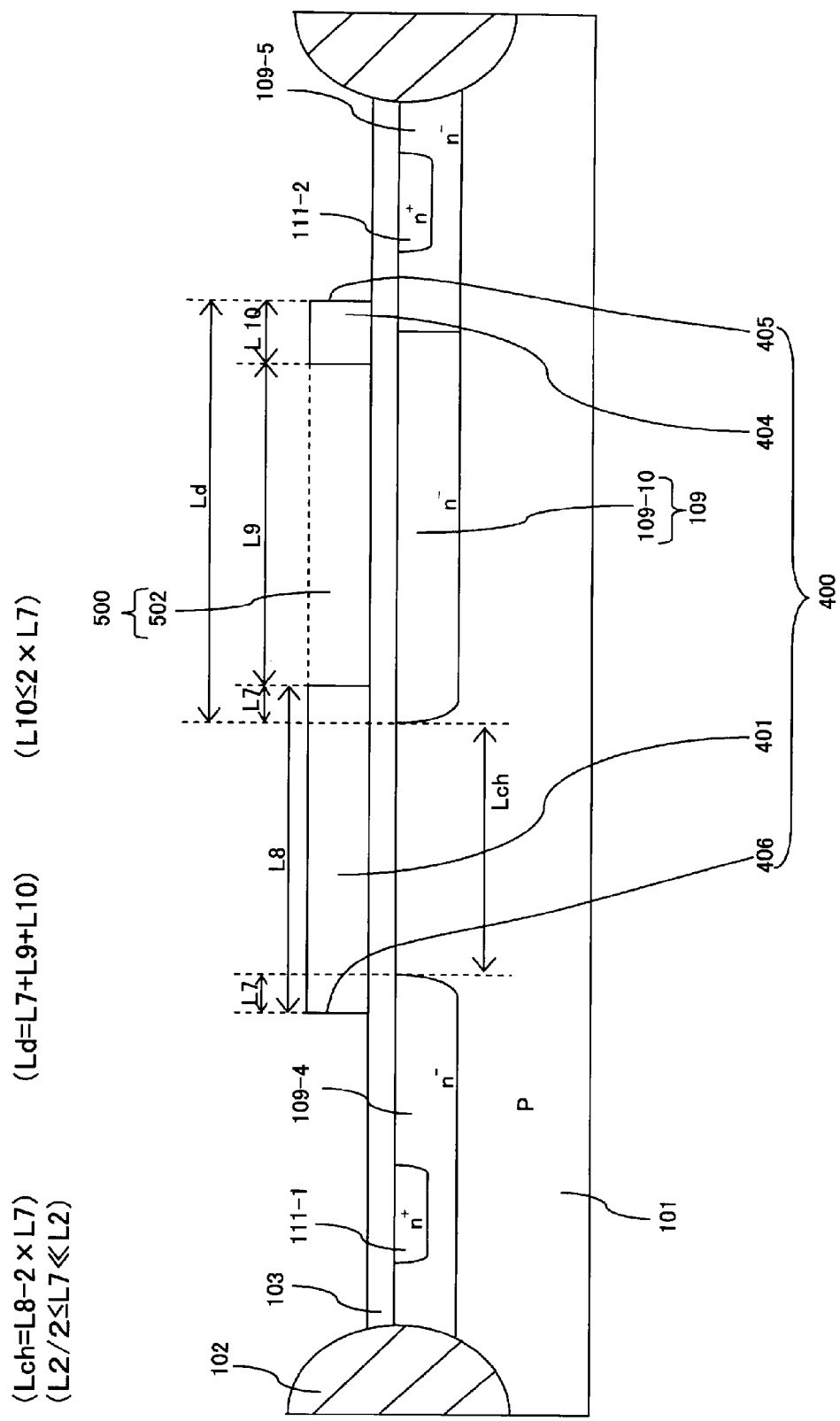
FIG. 45 is a partial vertical cross-section diagram in an A-A line of the structure of a high voltage resistant MOS transistor shown in FIG. 44 in accordance with the first alternative embodiment of the present invention.
Figure 46:
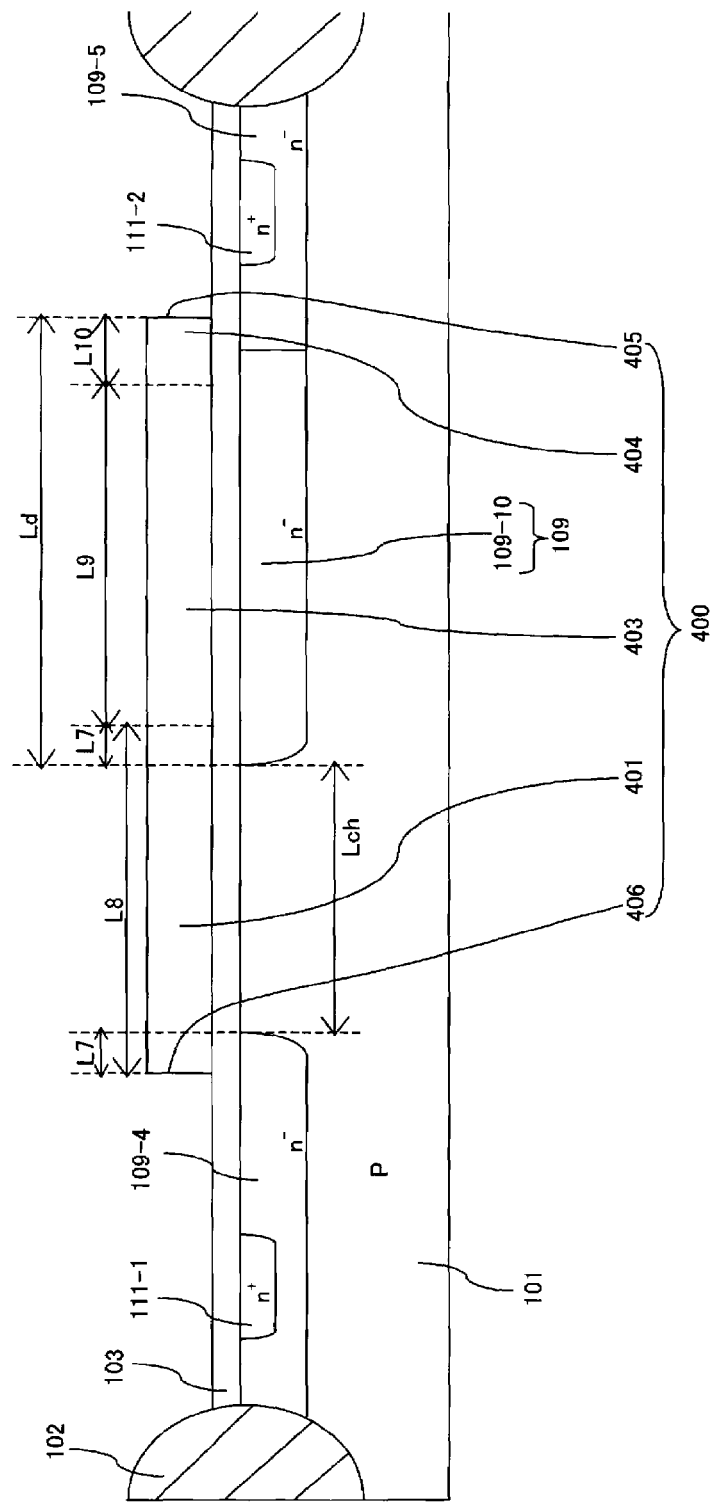
FIG. 46 is a partial vertical cross-section diagram in a B-B line of the structure of a high voltage resistant MOS transistor shown in FIG. 44 in accordance with the first alternative embodiment of the present invention.
Figure 47:
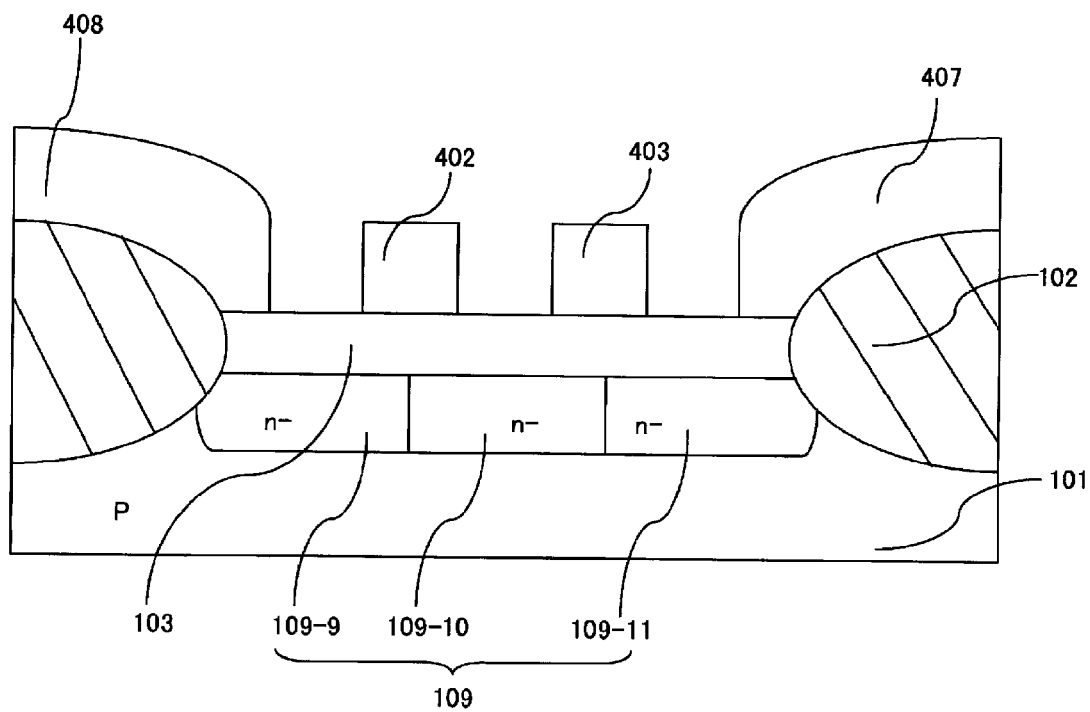
FIG. 47 is a partial vertical cross-section diagram in a C-C line of the structure of a high voltage resistant MOS transistor shown in FIG. 44 in accordance with the first alternative embodiment of the present invention.

FIG. 44 is a partial plan view of a high voltage resistant MOS transistor structure in accordance with the first alternative embodiment of the present invention. FIG. 45 is a partial vertical cross-section diagram of a high voltage resistant MOS transistor along an A-A line shown in FIG. 44 in accordance with the first alternative embodiment. FIG. 46 is a partial vertical cross-section diagram of a high voltage resistant MOS transistor along a B-B line shown in FIG. 44 in accordance with the first alternative embodiment. FIG. 47 is a partial vertical cross-section diagram of a high voltage resistant MOS transistor along a C-C line shown in FIG. 44 in accordance with the first alternative embodiment.

As shown in FIGS. 44, 45, 46, and 47, a gate electrode structure in a high voltage resistant MOS transistor structure in accordance with the first alternative embodiment is different from that in the above described first embodiment. Therefore, only differences between a high voltage resistant MOS transistor structure in accordance with the first alternative embodiment and that in accordance with the above described first embodiment are provided as follows.

The above described gate electrode 106 in accordance with the above described first embodiment includes the slit group 107, and this slit group 107 is comprised of the first slit 107-1, the second slit 107-2, and the third slit 107-3 which are longitudinally formed along the first horizontal direction.

On the other hand, a high voltage resistant MOS transistor in accordance with the first alternative embodiment has a gate electrode 400 comprised of a first region that is comprised of a sheet portion 401 formed above a channel region and a second region that is formed adjacent to this first region and formed above an electric field reduction region. Also, this second region includes a slit group 500. This slit group 500 is comprised of one-dimensional array of a first slit 501, a second slit 502, and a third slit 503 that are formed along the second horizontal direction. In addition, the second region includes a first stripe shape portion 402 and a second stripe shape portion 403 that separate the first slit 501, the second slit 502, and the third slit 503 from each other. Also, the second region includes a first side region 404. The first slit 501, the second slit 502, and the third slit 503 are abutted against this first side region 404 and separated form the above described first region. In addition, the first side region 404 has a stripe shape portion and longitudinally formed in the second horizontal direction. An outer side sidewall of this first side region 404 comprises a first edge 405 of the gate electrode 400. On the other hand, an outer side sidewall of the sheet portion 401 comprises a second edge 406 of the gate electrode 400.

In addition, the gate electrode 400 includes a second side region 407 and a third side region 408. A boundary between an active region and an element isolation region is formed in the first horizontal direction, respectively, and includes a pair of boundaries that are separated from each other in the second horizontal direction. The above described second side region 407 and the third side region 408 are formed above this pair of boundaries and above the element isolation region located outside the pair of boundaries, respectively.

Impurities are ion implanted into a p-type semiconductor substrate 101 by using the gate electrode 400 having the above described unique pattern as a mask. As a result, a plurality of ion implantation regions, which are self-aligned with the first slit 501, the second slit 502, and the third slit 503, are formed in portions of the p-type semiconductor device 101 located below the first slit 501, the second slit 502, and the third slit 503. Then, a thermal diffusion treatment is conducted for the impurities implanted into a plural number of the impurity implantation regions. Thus, an integrated impurity diffusion region comprised of a ninth lightly doped $N^-$ diffusion layer 109-9, a tenth lightly doped $N^-$ diffusion layer 109-10, and an eleventh lightly doped $N^-$ diffusion layer 109-11 is formed, which are self-aligned with the above described first slit 501, the second slit 502, and the third slit 503, respectively, and adjacently formed without any space. Here, an electric field reduction region is included in the integrated impurity diffusion region and formed below the second region of the gate electrode 400. Also, this electric field reduction region is self-aligned with and overlapped with the gate electrode 400.

Other configurations of the MOS transistor are the same with those of the MOS transistor in accordance with the above described first embodiment of the present invention.

Widths of the first slit 501, the second slit 502, and the third slit 503 can be set to the same with those of the first slit 107-1, the second slit 107-2, and the third slit 107-3 in accordance with the above described first embodiment of the present invention. Also, widths of the first side region 404, the first stripe shape portion 402 and the second stripe shape portion 403 can be set to the same with those of the first stripe shape portion 106-1, the second stripe shape portion 106-2, and the third stripe shape portion 106-3 in accordance with the above described first embodiment of the present invention. It is desirable to define a width of a stripe shape portion including widths of the slit of the gate electrode 400 and the first side region 404 in consideration of the following relations.

When widths of the first slit 501, the second slit 502, and the third slit 503 are increased, the electric field applied to the electric field reduction region based on the gate potential is decreased and the electric field reduction effect is reduced. In addition, when widths of the first slit 501, the second slit 502, and the third slit 503 are increased, the number of the stripe shape portions of the gate electrode 400 and the number of the slits 500, which are required to have a necessary channel width, are decreased, and impurities are easily implanted in a impurity ion implantation step using the gate electrode 400 as a mask. The maximum slit width is defined by the maximum width that is required to obtain the necessary minimum electric field applied to the above described electric field reduction region based on the gate potential and the necessary minimum electric field reduction effect.

When a slit width is decreased, the number of the stripe shape portions of the gate electrode and the number of slits are increased, which are required to have a necessary channel width. Also, when a slit width is decreased, impurities are prevented from being implanted in an impurity ion implantation step using the gate electrode 400 as a mask. As a result, the impurity concentration of a finished impurity diffusion layer is reduced. In addition, when a slit width is decreased, the electric field applied to the above described electric field reduction region based on the gate potential is increased, and the electric field reduction effect is increased. The minimum slit width is defined by the limit width for which patterning can be conducted.

When a width of the stripe portion of the gate electrode 400 is increased, the necessary minimum diffusion distance of impurities in the crosswise direction is increased. In addition, when a width of the stripe portion of the gate electrode 400 is increased, the number of the stripe shape portion and the number of slits are decreased, which are required to have a necessary channel width.

When a width of the stripe shape portion of the gate electrode 400 is decreased, the number of the stripe shape portion and the number of slits are increased, which are required to have a necessary channel width. In addition, when a width of the stripe shape portion of the gate electrode 400 is decreased, the necessary minimum diffusion distance of impurities in the crosswise direction is decreased.

Half of the width of the stripe shape portion of the gate electrode 400 corresponds to the necessary minimum diffusion distance of impurities in the crosswise direction. Therefore, it is desired for the stripe shape portions of the gate electrode 400 to have the same width with each other. When widths of the stripe shape portions of the gate electrode 400 are different from each other, the necessary minimum diffusion distance of impurities in the crosswise direction is half of the width of the widest stripe shape portion.

On the other hand, it is desirable for lengths L9 of the first slit 501, the second slit 502, and the third slit 503, respectively, to be defined by the necessary gate overlap amount. The maximum value of the width L10 of the first side region 404 with a stripe shape is defined by the above described relation with the necessary minimum diffusion distance of impurities in the horizontal direction. In other words, the width L10 of the first side region 404 with a stripe shape is twice or less of the distance L7 of thermal diffusion of impurities in the horizontal direction. The gate overlap amount Ld is the sum of the distance L7 of the thermal diffusion of impurities in the horizontal direction, the length L9 of each of the first slit 501, the second slit 502, and the third slit 503, and the width L10 of the first side region 404 with a stripe shape in consideration of the necessary hate overlap amount Ld. The width L10 of the first side region 404 with a stripe shape depends on the diffusion distance of impurities in the horizontal direction. Therefore, a finished gate overlap amount Ld can be regulated by regulating the length L9 of each of the first slit 501, the second slit 502, and the third slit 503.

For example, a 40V voltage resistance MOS transistor may need the gate overlap amount of 2 μm. According to the above described gate overlap structure, the gate overlap dimension Ld of 2.05 μm or more can be obtained by setting the length L9 of each of the first slit 501, the second slit 502, and the third slit 503 to 1.6 μm, setting the width L10 of the first side portion 404 with a stripe shape to 0.3 μm, and setting the distance L7 of the thermal diffusion in the horizontal direction to half or more of the width of the above described three stripe shape portions. Therefore, it is possible to obtain a large gate overlap amount that is required for a 40V voltage resistant MOS transistor.

The method for manufacturing the MOS transistor in accordance with the first alternative embodiment is almost the same with the method for manufacturing the MOS transistor in accordance with the above described first embodiment of the present invention. However, the pattern of the resist mask used for forming the gate electrode 400 by patterning is different between the first alternative embodiment and the first embodiment. In short, impurities are ion implanted into the p-type semiconductor substrate 101 by using the gate electrode 400 having a unique pattern as a mask in the first alternative embodiment. As a result, a plurality of impurity implantation regions, which are self-aligned with the first slit 501, the second slit 502, and the third slit 503, respectively, are formed in portions of the p-type semiconductor substrate 101 located below the first slit 501, the second slit 502, and the third slit 503. Then, a thermal diffusion step is conducted for impurities implanted into a plurality of impurity implantation regions, and thus the integrated impurity diffusion region comprised of the ninth lightly doped N⁻ diffusion layer 109-9, the tenth lightly doped N⁻ diffusion layer 109-10, and the eleventh lightly doped N⁻ diffusion layer 109-11 is formed, which are self-aligned with the first slit 501, the second slit 502, and the third slit 503 and adjacently formed without any space. Here, the electric field reduction region is included in the impurity diffusion region and formed below the second region of the gate electrode 400. Also, this electric field reduction region is self-aligned with and overlapped with the gate electrode 400.

The first alternative embodiment of the present invention has the same effects with the above described first embodiment of the present invention.

Second Alternative Embodiment

Figure 48:
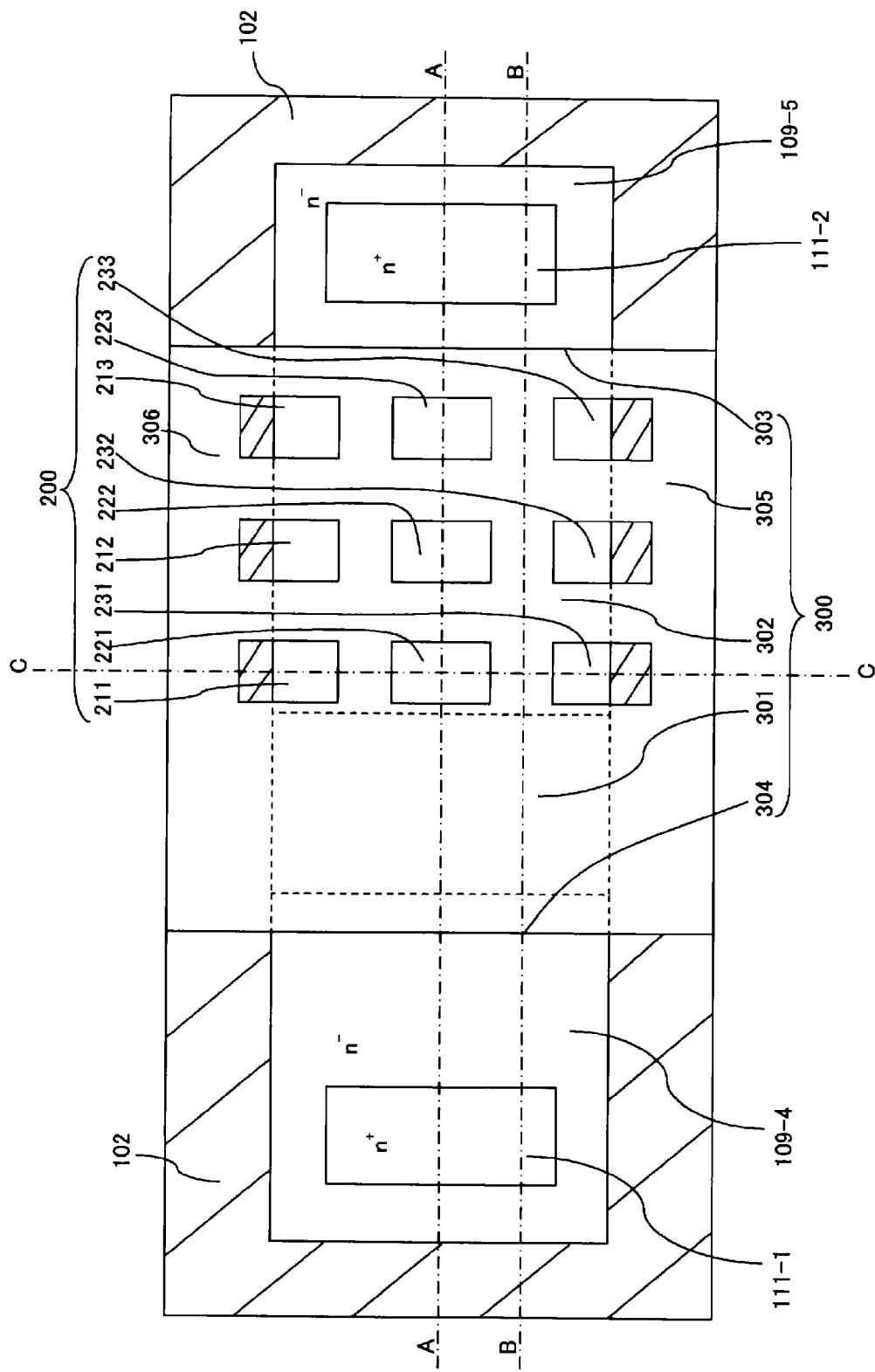
FIG. 48 is a partial plan view showing the structure of a high voltage resistant MOS transistor in accordance with a second alternative embodiment of the present invention.
Figure 49:
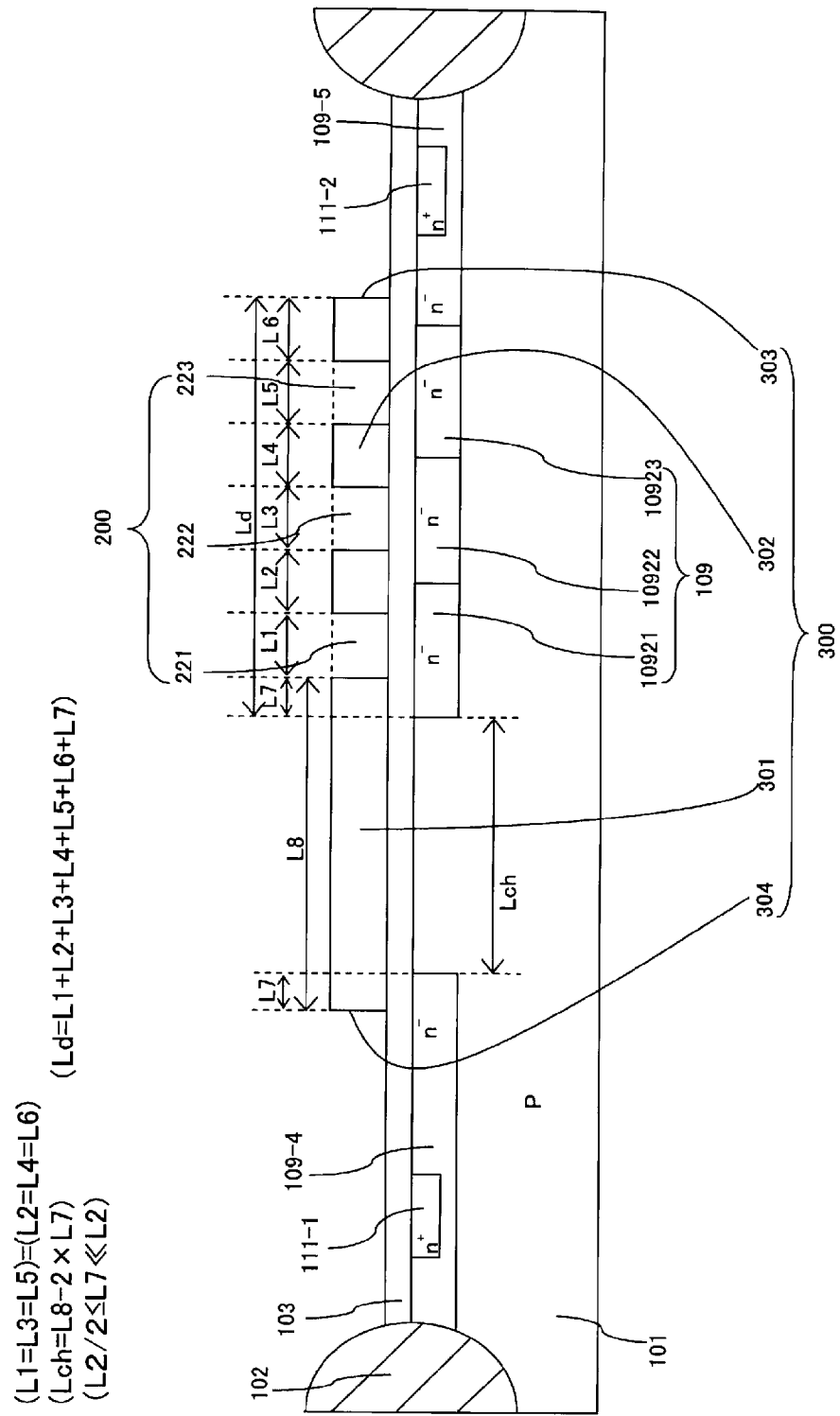
FIG. 49 is a partial vertical cross-section diagram in an A-A line of the structure of a high voltage resistant MOS transistor shown in FIG. 48 in accordance with the second alternative embodiment of the present invention.
Figure 50:
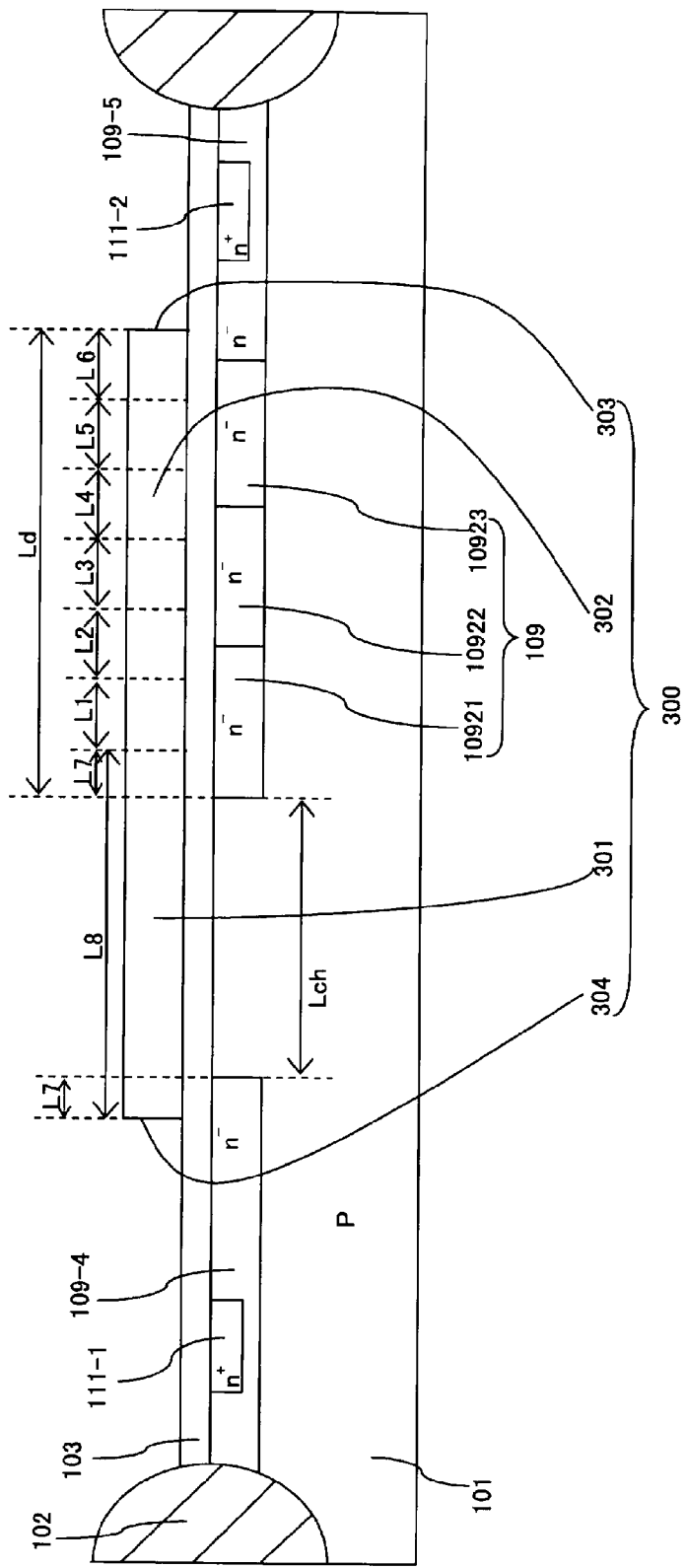
FIG. 50 is a partial vertical cross-section diagram in a B-B line of the structure of a high voltage resistant MOS transistor shown in FIG. 48 in accordance with the second alternative embodiment of the present invention.
Figure 51:
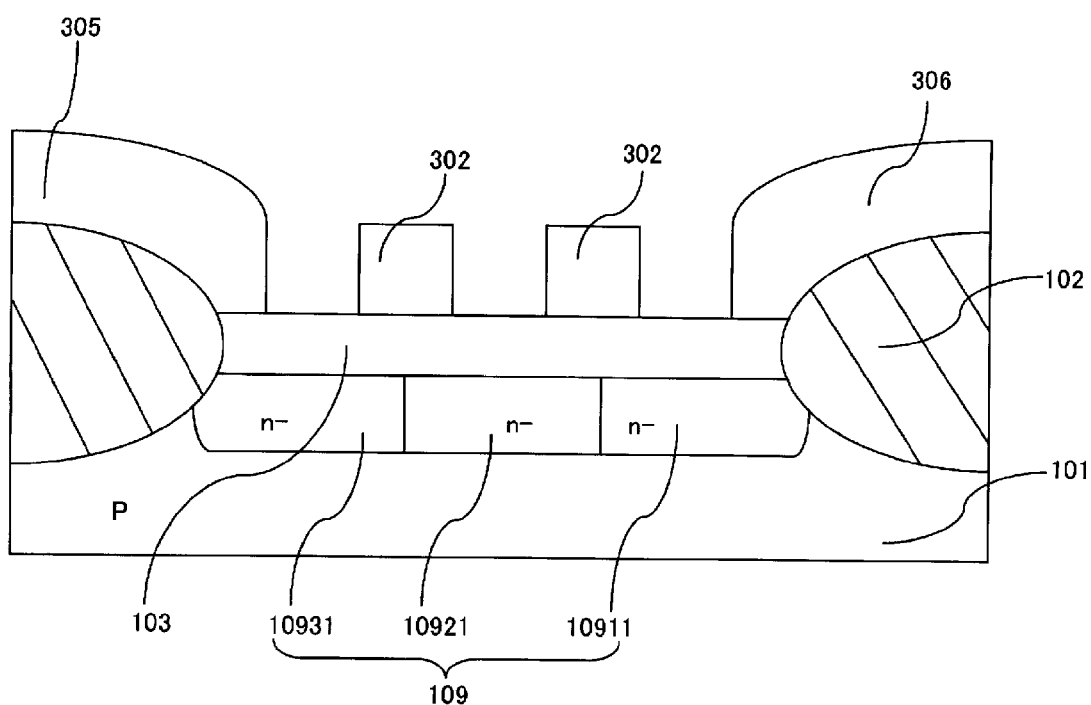
FIG. 51 is a partial vertical cross-section diagram in a C-C line of the structure of a high voltage resistant MOS transistor shown in FIG. 48 in accordance with the second alternative embodiment of the present invention.

FIG. 48 is a partial plan view of a high voltage resistant MOS transistor structure in accordance with the second alternative embodiment of the present invention. FIG. 49 is a partial vertical cross-section diagram of a high voltage resistant MOS transistor along an A-A line shown in FIG. 48 in accordance with the second alternative embodiment. FIG. 50 is a partial vertical cross-section diagram of a high voltage resistant MOS transistor along a B-B line shown in FIG. 48 in accordance with the second alternative embodiment. FIG. 51 is a partial vertical cross-section diagram of a high voltage resistant MOS transistor along a C-C line shown in FIG. 48 in accordance with the second alternative embodiment.

As shown in FIGS. 48, 49, 50, and 51, a gate electrode structure in a high voltage resistant MOS transistor structure in accordance with the second alternative embodiment is different from that in the above described first embodiment. Therefore, only differences between a high voltage resistant MOS transistor structure in accordance with the second alternative embodiment and that in accordance with the above described first embodiment are provided as follows.

The above described gate electrode 106 in accordance with the above described first embodiment includes the slit group 107, and this slit group 107 is comprised of the first slit 107-1, the second slit 107-2, and the third slit 107-3 which are longitudinally formed along the first horizontal direction.

On the other hand, a high voltage resistant MOS transistor in accordance with the second alternative embodiment has a gate electrode 300 comprised of a first region that is comprised of a sheet portion 301 formed above a channel region and a second region that is formed adjacent to this first region and formed above an electric field reduction region. Also, this second region includes a rectangular opening group 200. This rectangular opening group 200 is comprised of 3×3 two-dimensional matrix array of first to ninth rectangular openings 211, 221, 231, 212, 222, 232, 213, 223, and 233. In addition, the second region includes a reticular pattern portion 302 that separates the first to ninth rectangular openings 211, 221, 231, 212, 222, 232, 213, 223, and 233 from each other. An outer side sidewall of this reticular pattern portion 302 comprises a first edge 303 of the gate electrode 300. On the other hand, an outer side sidewall of the sheet portion 301 comprises a second edge 304 of the gate electrode 300. In addition, the gate electrode 300 includes a second side region 305 and a third side region 306.

Impurities are ion implanted into a p-type semiconductor substrate 101 by using the gate electrode 300 having the above described unique pattern as a mask. As a result, a plurality of ion implantation regions, which are self-aligned with the first to ninth rectangular openings 211, 221, 231, 212, 222, 232, 213, 223, and 233, respectively, are formed in portions of the p-type semiconductor device 101 located below the first to ninth openings 211, 221, 231, 212, 222, 232, 213, 223, and 233. Then, a thermal diffusion treatment is conducted for the impurities implanted into a plural number of the impurity implantation regions. Thus, an integrated impurity diffusion region comprised of a plurality of lightly doped N⁻ diffusion layers 10911, 10921, 10931, 10912, 10922, 10932, 10913, 10923, and 10933, which are self-aligned with the above described first to ninth rectangular openings 211, 221, 231, 212, 222, 232, 213, 223, and 233, respectively, and adjacently formed without any space. Here, an electric field reduction region is included in the integrated impurity diffusion region and formed below the second region of the gate electrode 300. Also, this electric field reduction region is self-aligned with and overlapped with the gate electrode 300. Only the lightly doped N$^-$ diffusion layers 10921, 10922, and 10923 are shown in FIGS. 49 and 50. On the other hand, only the N$^-$ diffusion layers 10911, 10921, and 10931 are shown in FIG. 51.

Other configurations of the MOS transistor are the same with those of the MOS transistor in accordance with the above described first embodiment of the present invention.

Dimensions of the first to ninth rectangular openings 211, 221, 231, 212, 222, 232, 213, 223, and 233 in the first horizontal direction can be set to the same with those of the first slit 107-1, the second slit 107-2, and the third slit 107-3 in accordance with the above described first embodiment of the present invention. Also, each of the widths of the reticular pattern portion 302 in the first and second horizontal directions can be set to the same with those of the first stripe shape portion 106-1, the second stripe shape portion 106-2, and the third stripe shape portion 106-3 in accordance with the above described first embodiment of the present invention. It is desirable to define the dimensions of the first to ninth rectangular openings 211, 221, 231, 212, 222, 232, 213, 223, and 233 in the first horizontal direction, and the widths of the reticular pattern portion 302 in the first and second horizontal directions in consideration of the following relations.

When the dimension of the rectangular opening group 200 in the first horizontal dimension is increased, the electric field applied to the electric field reduction region based on the gate potential is decreased and the electric field reduction effect is reduced. In addition, when the dimension of the rectangular opening group 200 in the first horizontal dimension is increased, the number of the rectangular openings comprising the rectangular opening group 200 of the gate electrode 300, which are arrayed in the first horizontal direction and required to have a necessary gate overlap amount Ld, are decreased, and impurities are easily implanted in a impurity ion implantation step using the gate electrode 300 as a mask. The maximum dimension of the rectangular opening group 200 in the first horizontal direction is defined by the maximum dimension that is required to obtain the necessary minimum electric field applied to the above described electric field reduction region based on the gate potential and the necessary minimum electric field reduction effect.

When a dimension of the rectangular opening group 200 in the first horizontal direction is decreased, the number of the rectangular opening group 200 of the gate electrode 300 are increased, which are arrayed in the first horizontal direction and required to have a necessary gate overlap amount Ld. Also, when dimension of the rectangular opening group 200 in the horizontal direction is decreased, impurities are prevented from being implanted in an impurity ion implantation step using the gate electrode 300 as a mask. As a result, the impurity concentration of a finished impurity diffusion layer is reduced. In addition, when a dimension of the rectangular opening group 200 in the first horizontal direction is decreased, the electric field applied to the above described electric field reduction region based on the gate potential is increased, and the electric field reduction effect is increased. The minimum dimension of the rectangular opening group 200 in the first horizontal direction is defined by the limit dimension for which patterning can be conducted.

When the dimension of the rectangular opening group 200 in the second horizontal direction is increased, the number of the rectangular openings comprising the rectangular opening group 200 of the gate electrode 300 is decreased, which are arrayed in the second horizontal direction and required to have the necessary channel width. Also, when the dimension of the rectangular opening group 200 in the second horizontal direction is increased, impurities are easily implanted in an impurity ion implantation step using the gate electrode 300 as a mask.

When a dimension of the rectangular opening group 200 in the second horizontal direction is decreased, the number of the rectangular openings comprising the rectangular opening group 200 is increased, which are arrayed in the second horizontal direction and required to have the necessary channel width. Also, when a dimension of the rectangular opening group 200 in the second horizontal direction is decreased, impurities are prevented from being implanted in an impurity ion implantation step using the gate electrode 300 as a mask. As a result, the impurity concentration of a finished impurity diffusion layer is decreased. Furthermore, when a dimension of the rectangular opening group 200 in the second horizontal direction is decreased, the electric field applied to the electric field reduction region based on the gate potential is increased, and the electric field reduction effect is increased. The minimum dimension of the rectangular opening group 200 in the second horizontal direction is defined by the limit dimension for which patterning can be conducted.

When the widths of the reticular pattern portion 302 in the first and the second horizontal directions are increased, the necessary minimum diffusion distance of impurities in the crosswise direction is increased. In addition, when the width of the reticular pattern portion 302 in the first horizontal direction in increased, the number of the rectangular openings comprising the rectangular opening group 200 of the gate electrode 300 is decreased, which are arrayed in the first horizontal direction and required to have the necessary gate overlap amount Ld. Also, when the width of the reticular pattern portion 302 in the second horizontal direction is increased, the number of the rectangular openings comprising the rectangular opening group 200 is decreased, which are arrayed in the second horizontal direction and required to have a necessary channel width.

When the widths of the reticular pattern portion 302 in the first and the second directions are decreased, the necessary minimum diffusion distance of impurities in the crosswise direction is decreased. In addition, when the width of the reticular pattern portion 302 in the first horizontal direction is decreased, the number of the rectangular openings comprising the rectangular opening group 200 is increased, which are arrayed in the first horizontal direction and required to have the necessary gate overlap amount Ld. When the width of the reticular pattern portion 302 in the second horizontal direction is decreased, the number of the rectangular openings comprising the rectangular opening group 200 of the gate electrode 300 in the second horizontal direction is increased, which are arrayed in the second horizontal direction and required to have a necessary channel width.

Half of the larger width of the widths of the reticular pattern portion 302 of the gate electrode 300 in the first and the second horizontal directions corresponds to the necessary minimum diffusion distance of impurities in the horizontal direction. Therefore, it is desired for the widths of the reticular pattern portion 302 of the gate electrode 300 in the first and the second directions to be the same. However, the width of the reticular pattern portion 302 of the gate electrode 300 in the diagonal direction is larger than the widths of this reticular pattern portion 302 of the gate electrode 300 in the first and the second directions. Because of this, "an island shape region", in which the above described integrated lightly doped diffusion region is not formed, exists in a portion of the reticular pattern portion 302 of the gate electrode 300 which is located below the portion among the four rectangular openings. In order to prevent this island shape region from being formed, it is required to set the diffusion distance of impurities in the horizontal direction to half or more of the width of the reticular pattern portion 302 of the gate electrode 300 in the diagonal direction.

For example, a 40 V voltage resistance MOS transistor may need the gate overlap amount of 2 μm. According to the gate overlap structure of the present invention, the gate overlap dimension Ld of 1.95 μm or more can be obtained by setting the dimensions of the first to ninth rectangular openings 211, 221, 231, 212, 222, 232, 213, 223, and 233 in the first horizontal direction to 0.3 μm, setting the widths of the reticular pattern portion 302 in the first and the second horizontal directions to 0.3 μm, and setting the distance L7 of the thermal diffusion in the horizontal direction to half or more of each of the widths of the above described reticular pattern portion 302 in the first and the second directions. Therefore, it is possible to obtain a large gate overlap amount that is required for a 40V voltage resistant MOS transistor. In the second alternative embodiment, the 3×3 two-dimensional matrix array of the rectangular opening group 200 is formed. However, it is possible to arbitrarily decide the number of the rectangular openings in the first horizontal direction according to the required gate overlap dimension Ld.

The method for manufacturing the MOS transistor in accordance with the second alternative embodiment is almost the same with the method for manufacturing the MOS transistor in accordance with the above described first embodiment of the present invention. However, the pattern of the resist mask used for forming the gate electrode 300 by patterning is different between the second alternative embodiment and the first embodiment. In short, impurities are ion implanted into the p-type semiconductor substrate 101 by using the gate electrode 300 having a unique pattern as a mask in the second alternative embodiment. As a result, a plurality of impurity implantation regions, which are self-aligned with the first to ninth rectangular openings 211, 221, 231, 212, 222, 232, 213, 223, and 233, respectively, are formed in portions of the p-type semiconductor substrate 101 located below the first to ninth rectangular openings 211, 221, 231, 212, 222, 232, 213, 223, and 233. Then, a thermal diffusion step is conducted for impurities implanted into a plurality of impurity implantation regions, and thus the integrated impurity diffusion region comprised of a plurality of impurity diffusion regions 10911, 10921, 10931, 10912, 10922, 10932, 10913, 10923, and 10933 is formed, which are self-aligned with the above described first to ninth rectangular openings 211, 221, 231, 212, 222, 232, 213, 223, and 233 and adjacently formed without any space. Here, the electric field reduction region is included in the impurity diffusion region and formed below the second region of the gate electrode 300. Also, this electric field reduction region is self-aligned with and overlapped with the gate electrode 300.

The second alternative embodiment of the present invention has the same effects with the above described first embodiment of the present invention.

Third Alternative Embodiment

Figure 52:
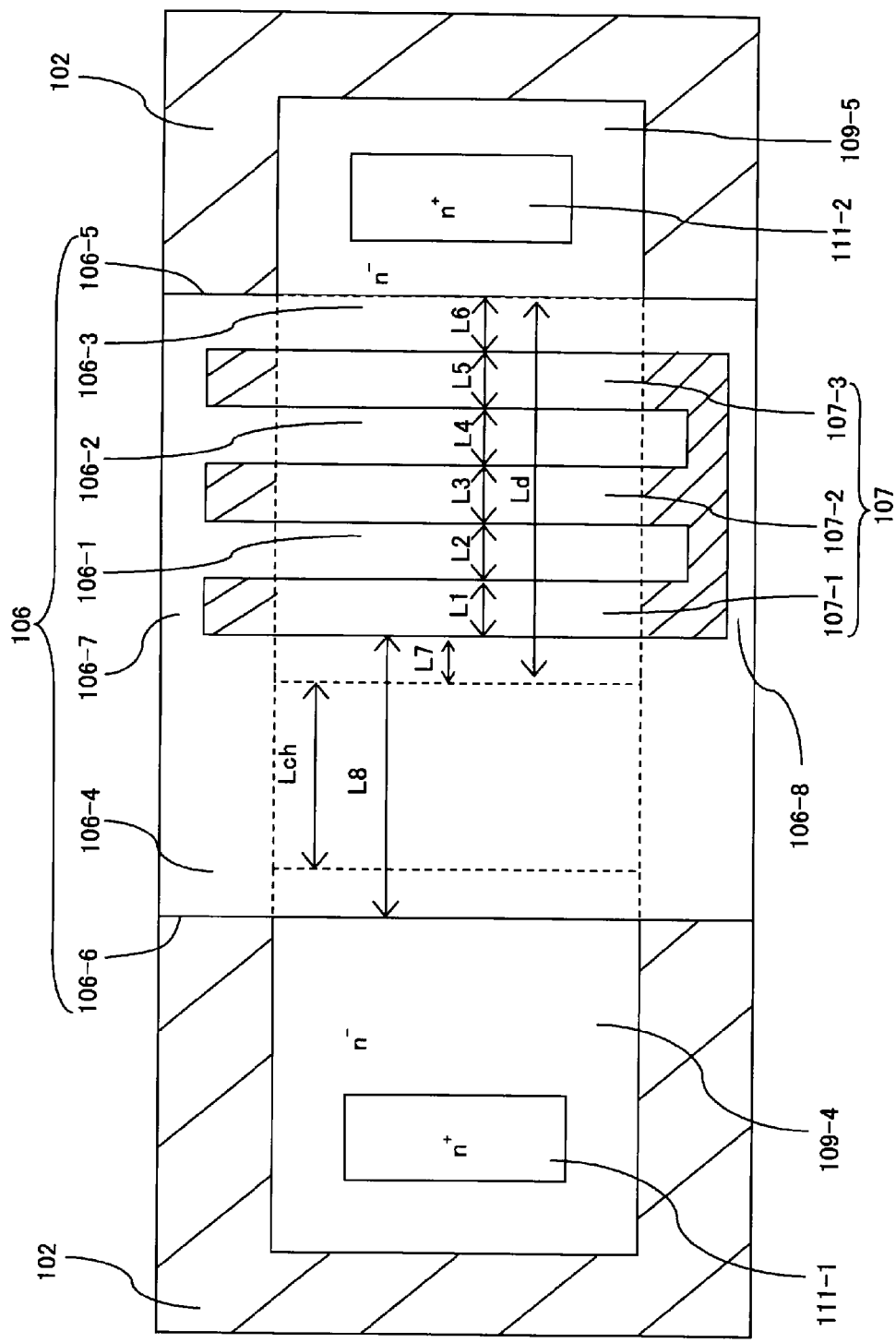
FIG. 52 is a partial plan view showing the structure of a high voltage resistant MOS transistor in accordance with a third alternative embodiment of the present invention.
Figure 53:
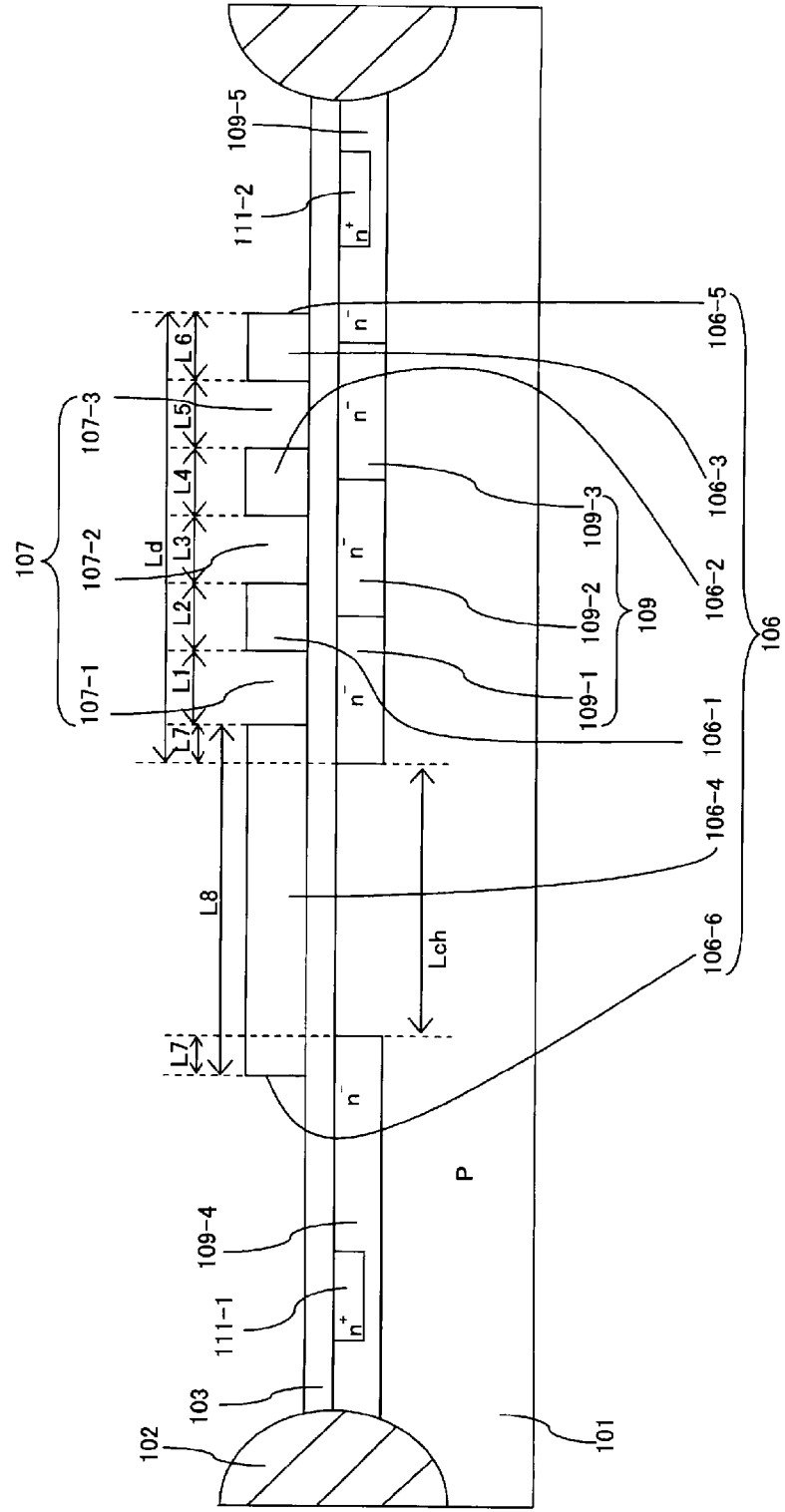
FIG. 53 is a partial vertical cross-section diagram showing the structure of a high voltage resistant MOS transistor in accordance with the third alternative embodiment of the present invention.

The gate electrode has a plurality of openings that are separated from each other in the above described first to third embodiments and the above described first and second alternative embodiments. However, it is possible to form the gate electrode to have a single integrated opening by connecting a plurality of openings. FIG. 52 is a partial plan view showing a high voltage resistant MOS transistor structure in accordance with the third alternative embodiment of the present invention. FIG. 53 is a partial vertical diagram showing a high voltage resistant MOS transistor structure in accordance with the third alternative embodiment of the present invention. The high voltage resistant MOS transistor structure in accordance with the third alternative embodiment is different from that in accordance with the above described first embodiment in that slits of the gate electrode are different from each other. As shown in FIG. 53, a gate electrode 106 includes a first slit 107-1, the second slit 107-2, and the third slit 107-3. These slits 107-1, 107-2, and 107-3 are connected with each other in a second side portion and comprises a single integrated opening. When a design is changed like this, the structure of a portion of a gate electrode 106 formed above an active region of a p-type semiconductor substrate 101 is the same with the structure of the portion of the gate electrode 106 formed above the active region of the p-type semiconductor substrate 101 in accordance with the above described first embodiment.

In addition, in the third alternative embodiment, a plurality of lightly doped $N^-$ implantation regions are formed in a plurality of particular regions separated from each other in the p-type semiconductor substrate 101 by conducting ion implantation using the gate electrode 106 as a mask. These lightly doped $N^-$ implantation regions are the same with first to third lightly doped $N^-$ implantation regions 108-1, 108-2, and 108-3, which are formed by the ion implantation using the gate electrode 106 as a mask, in accordance with the above described first embodiment. Therefore, according to the third alternative embodiment of the present invention, a resist pattern used for a mask in a patterning step to form the gate electrode 106 is different from the resist pattern in accordance with the above described first embodiment. Except for the patterning to form the gate electrode 106, the method for manufacturing the high voltage atmosphere in accordance with the third alternative embodiment of the present invention is the same with that in accordance with the above described first embodiment.

Therefore, the high voltage resistant MOS transistor in accordance with the third embodiment of the present invention has the same effects with that in accordance with the above described first embodiment.

Fourth Alternative Embodiment

Figure 54:
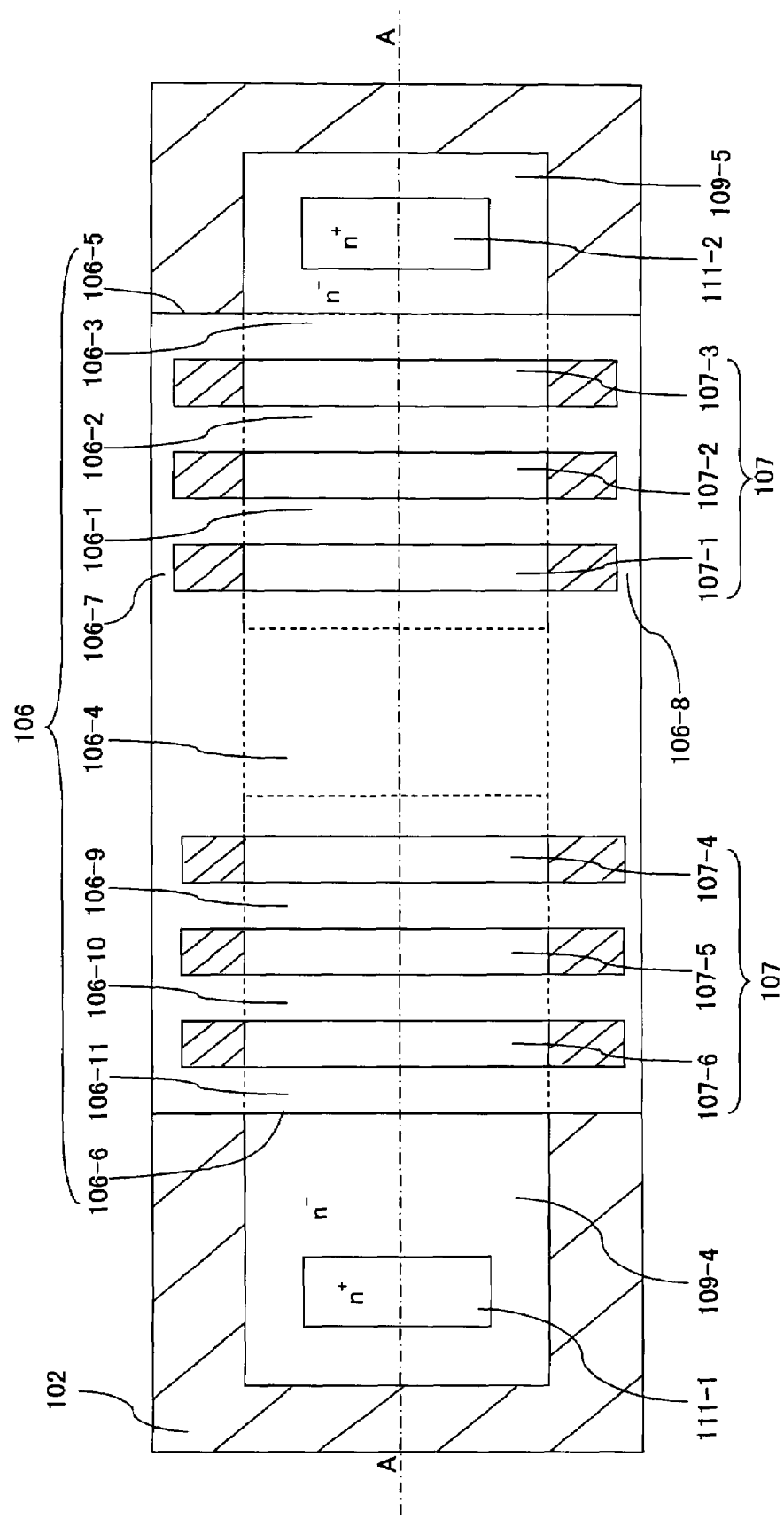
FIG. 54 is a partial plan view showing the structure of a high voltage resistant MOS transistor in accordance with a fourth alternative embodiment of the present invention.
Figure 55:
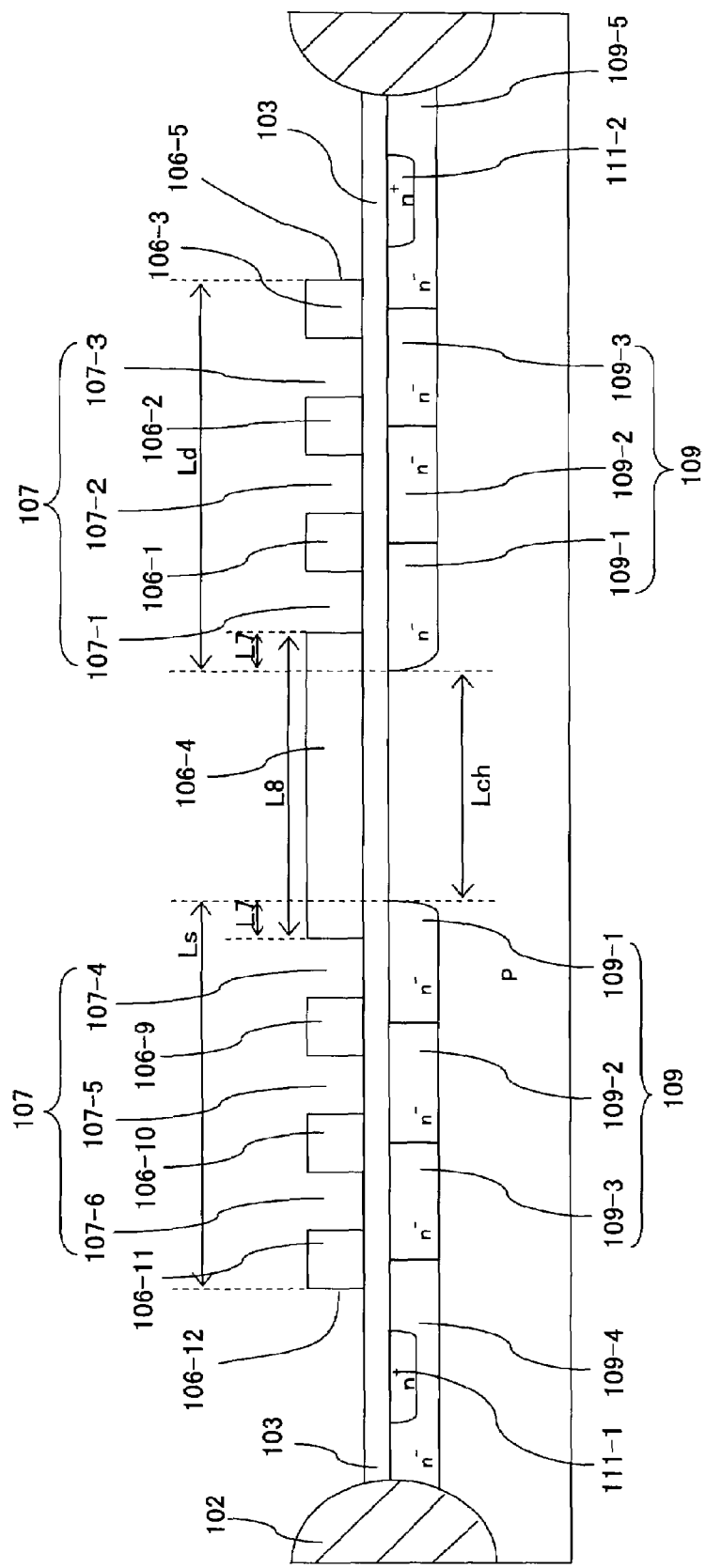
FIG. 55 is a partial vertical cross-section diagram in an A-A line of the structure of a high voltage resistant MOS transistor shown in FIG. 54 in accordance with the fourth alternative embodiment of the present invention.

The gate overlap structure is formed only on the drain side in the above described first to third embodiments and the above described first and second alternative embodiments. However, the above described gate overlap structure may be formed on the source side. Also, the above described gate overlap structure may be formed both on the source side and the drain side. The MOS transistor in which the gate overlap structures in accordance with the above described first embodiment are formed both on the source side and the drain side is hereinafter explained. FIG. 54 is a partial plan view showing a high voltage resistant MOS transistor structure in accordance with the fourth alternative embodiment of the present invention. FIG. 55 is a partial vertical cross-section diagram of a high voltage resistant MOS transistor structure along an A-A line shown in FIG. 54 in accordance with the fourth alternative embodiment of the present invention.

As shown in FIGS. 54 and 55, the high voltage resistant MOS transistor structure in accordance with the fourth alternative embodiment is different from that in accordance with the above described first embodiment. Therefore, only differences between the high voltage resistant MOS transistor in accordance with the fourth alternative embodiment and that in accordance with the first embodiment are hereinafter explained.

The gate electrode 106 in accordance with the above described first embodiment includes the slit group 107. This slit group 107 is comprised of the first slit 107-1, the second slit 107-2, and the third slit 107-3 that are longitudinally formed along the first horizontal direction.

A gate electrode 106 in accordance with the fourth alternative embodiment has a symmetrical structure in the first horizontal direction. Therefore, the gate electrode 106 is comprised of a first region that is comprised of a sheet portion 106-4 formed above a channel region, a second region that is formed adjacent to the first region and formed on the drain side, and a third region that is formed adjacent to the first region and formed on the source side. The second region formed on the drain side includes one-dimensional array of a first slit 107-1, a second slit 107-2, and a third slit 107-3, which are longitudinally formed in the second horizontal direction. Also, the second region formed on the drain side includes a first stripe shape portion 106-1, a second stripe shape portion 106-2, and a third stripe shape portion 106-3, which separate the first slit 107-1, the second slit 107-2, and the third slit 107-3 from each other. On the other hand, the third region formed on the source side includes one-dimensional array of a fourth slit 107-4, a fifth slit 107-5, and a sixth slit 107-6, which are longitudinally formed in the second horizontal direction. Also, the third region formed on the source side includes a fourth stripe shape portion 106-9, a fifth stripe shape portion 106-10, and a sixth stripe shape portion 106-11, which separate the fourth slit 107-4, the fifth slit 107-5, and the sixth slit 107-6 from each other.

Then, impurities are ion implanted into a p-type semiconductor substrate 101 by using the gate electrode 106 having this unique pattern as a mask. Thus, a plurality of ion implantation regions, which are self-aligned with a plurality of the slits comprising the slit group 107, respectively, are formed in portions of the p-type semiconductor substrate 101 located below a plurality of the slits of the slit group 107. Then, a thermal diffusion treatment of impurities implanted into a plurality of the impurity implantation regions is conducted. Thus, an integrated impurity diffusion region comprised of a plurality of impurity diffusion regions 109 is formed, which are self-aligned with the first to sixth slits 107-1, 107-2, 107-3, 107-4, 107-5, and 107-6, respectively, and adjacently formed without any space. Here, the drain side electric field reduction region is included in the drain side integrated impurity diffusion region and formed below the second region of the gate electrode 106. Also, this drain side electric field reduction region is self-aligned with and overlapped with the gate electrode 106. In addition, the source side electric field reduction region is included in the source side integrated impurity diffusion region and formed below the third region of the gate electrode 106. Also, this source side electric field reduction region is self-aligned with and overlapped with the gate electrode 106.

In the MOS transistor in accordance with the fourth alternative embodiment, the drain side gate overlap dimension Ld and the source side gate overlap dimension Ls may be set to different from each other. Also, in the MOS transistor in accordance with the fourth alternative embodiment, the drain side gate overlap dimension Ld and the source side gate overlap dimension LS may be set to the same. When the drain side gate overlap dimension Ld is the same with the source side gate overlap dimension Ls in the MOS transistor in accordance with the third alternative embodiment, a gate over lap structure is symmetrically formed in the first horizontal direction.

Each of the MOS transistors in accordance with the above described second and third embodiments and the above described first and second alternative embodiments may be formed to have a source side gate overlap structure in addition to the drain side gate overlap structure. When a drain side gate overlap dimension and a source gate overlap dimension are set to the same, a MOS transistor can be designed to have a gate overlap structure symmetrical in the first horizontal direction.

The MOS transistor, which has gate overlap structures both on the drain side and the source sides, has substantially the same effects as the above described MOS transistor that has a gate overlap structure only on the drain side.

Also, n-type MOSFETs are described in the above first to third embodiments. However, it is possible to apply the present invention to p-type MOSFETs by using different ion species. In addition, the above described gate electrode is comprised of a polysilicon layer including impurities. However, the gate electrode is not limited to this type of the gate electrode. The upper region of the gate electrode may be comprised of a silicide layer or a salicide (self-aligned silicide) layer in order to further reduce resistance of the gate electrode. The above described thickness and the impurity concentration of each layer are illustrative only, and it should be understood that designs of them can be changed.

This application claims priority to Japanese Patent Application No. 2005-091235. The entire disclosure of Japanese Patent Application No. 2005-091235 is hereby incorporated herein by reference.

The terms of degree, such as "approximately" and "substantially," used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor structure comprising:
  (1) a semiconductor substrate having a channel region, and a first integrated impurity diffusion region including a first electric field reduction region that is formed adjacent to said channel region, said semiconductor substrate including a plurality of further impurity diffusion regions that are separated from each other;
  (2) a first insulating film formed on said semiconductor substrate;
  (3) a first electrode structure having:
    (i) a first region formed above said channel region; and
    (ii) a second region that is formed adjacent to said first region and above said first electric field reduction region to be self-aligned with said first electric field reduction region, said second region comprising:
- (a) one or more openings formed above said plurality of further impurity diffusion regions and comprised of a one-dimensional array of a plurality of slits that are separated from each other and longitudinally formed in a first direction parallel to the plane of said semiconductor substrate, said one-dimensional array being comprised of a one-line array formed along a second direction that is parallel to said plane of said semiconductor substrate and different from said first direction; and
- (b) a first opening surrounding portion that surrounds said one or more openings, and which comprises a plurality of stripe shape portions longitudinally formed in said first direction and a discrete portion separated from said first region and said one or more stripe shape portions, and formed in a more distant position from said first region in comparison to the place in which said one or more stripe shape portions are formed, at least one of said plurality of stripe shape portions being electrically connected to said first region;

(4) a second insulating film formed on said first electrode structure and said first insulating film; and (5) a first wiring layer that is formed on said second insulating film and above said discrete portion.

2. A semiconductor structure comprising:

(1) a semiconductor substrate having a channel region and a first integrated impurity diffusion region including a first electric field reduction region that is formed adjacent to said channel region and comprises a plurality of further impurity diffusion regions that are separated from each other;

(2) a first insulating film formed on said semiconductor substrate; and (3) a first electrode structure having:
- (i) a first region formed above said channel region; and
- (ii) a second region that is formed adjacent to said first region and above said first electric field reduction region to be self-aligned with said first electric field reduction region, said second region including:
- (A) one or more openings that are formed above said plurality of further impurity diffusion regions and which comprise:
  - (a) an integrated opening that is comprised of a plurality of first opening regions formed above said plurality of further impurity diffusion regions, said plurality of first opening regions comprised of a plurality of slits which are longitudinally formed in a first direction parallel to the plane of said semiconductor substrate, and which comprise a one-line array formed along a second direction that is parallel to said plane of said semiconductor substrate and different from said first direction; and
  - (b) a second opening region that connects said plurality of first opening regions as well as said plurality of slits; and
- (B) a first opening surrounding portion that surrounds said one or more openings and which comprises a plurality of stripe shape portions longitudinally formed in said first direction.

* * * * *